(12) United States Patent
Socha

(10) Patent No.: US 8,224,061 B2
(45) Date of Patent: Jul. 17, 2012

(54) METHOD, PROGRAM PRODUCT, AND APPARATUS FOR PERFORMING A MODEL BASED COLORING PROCESS FOR PATTERN DECOMPOSITION FOR USE IN A MULTIPLE EXPOSURE PROCESS

(75) Inventor: Robert John Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 374 days.

(21) Appl. No.: 12/614,208

(22) Filed: Nov. 6, 2009

(65) Prior Publication Data

US 2010/0086203 A1 Apr. 8, 2010

Related U.S. Application Data

(63) Continuation-in-part of application No. 12/509,389, filed on Jul. 24, 2009.

(60) Provisional application No. 61/113,319, filed on Nov. 11, 2008, provisional application No. 61/129,890, filed on Jul. 28, 2008.

(51) Int. Cl.
*G06K 9/00* (2006.01)

(52) U.S. Cl. .................................................... 382/145
(58) Field of Classification Search .................. 382/145
See application file for complete search history.

(56) References Cited

U.S. PATENT DOCUMENTS

| 5,969,441 A | 10/1999 | Loopstra et al. |
| 6,046,792 A | 4/2000 | Van Der Werf et al. |
| 7,493,589 B2 * | 2/2009 | Socha ............................ 716/50 |

* cited by examiner

*Primary Examiner* — Roy M Punnoose
(74) *Attorney, Agent, or Firm* — Pillsbury Winthrop Shaw Pittman LLP

(57) ABSTRACT

A method of decomposing a target pattern containing features to be imaged onto a substrate into a plurality of exposure patterns for use in a multi-exposure process. The method includes dividing the target pattern into fragments; associating the fragments with an exposure pattern; associating the fragments with image log slope (ILS) evaluation points; and maximizing ILS values. Maximizing the ILS values further includes calculating ILS values at the ILS evaluation points; determining a minimum ILS value; calculating changes in the ILS values as a result of associating fragments with a different exposure pattern; determining a maximum change of the ILS values; and associating fragments associated with the maximum change with a different exposure pattern.

16 Claims, 61 Drawing Sheets

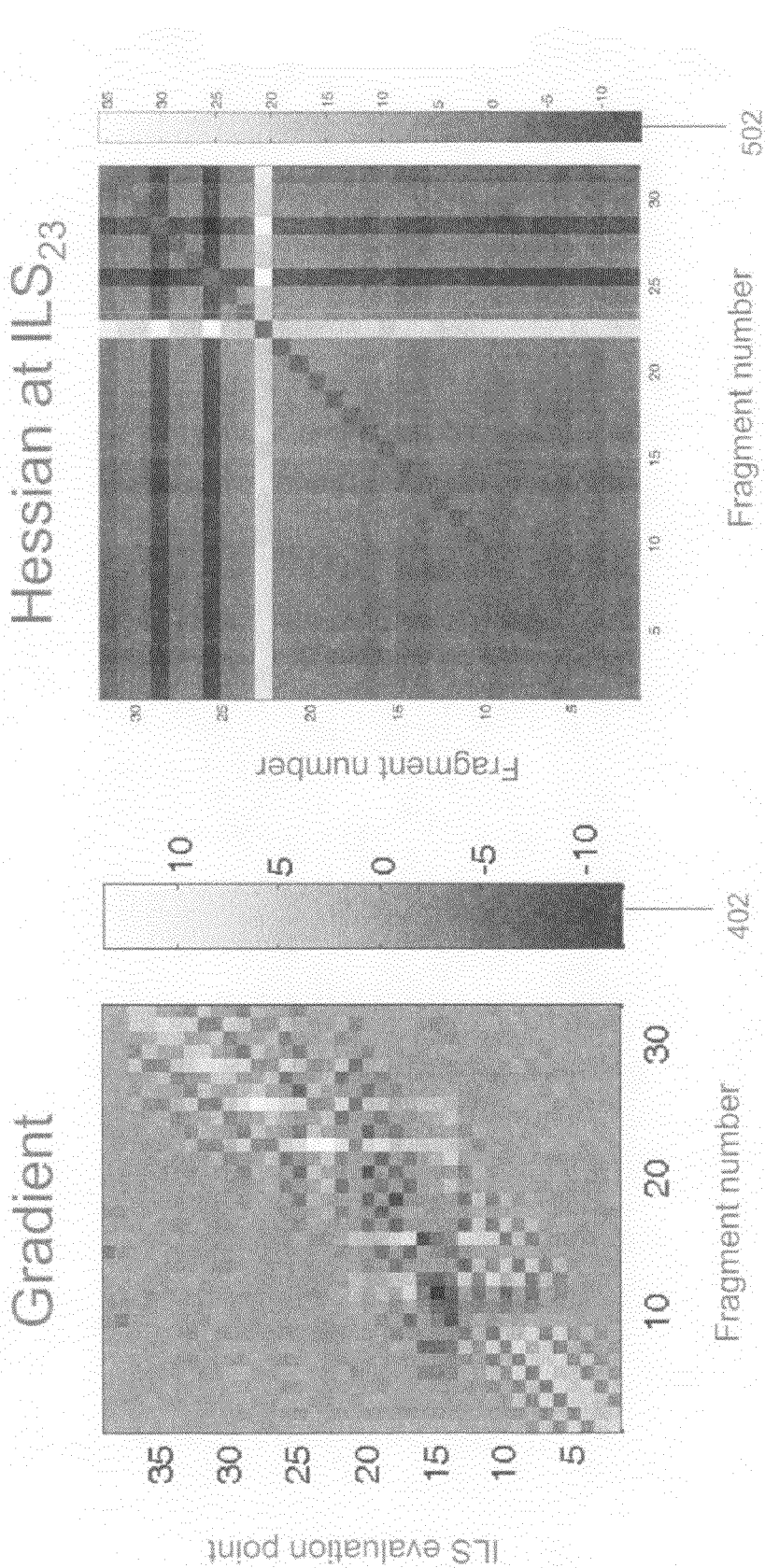

METHOD, PROGRAM PRODUCT, AND APPARATUS FOR PERFORMING A MODEL BASED COLORING PROCESS FOR PATTERN DECOMPOSITION FOR USE IN A MULTIPLE EXPOSURE PROCESS

CROSS-REFERENCE TO RELATED APPLICATIONS

The present application claims priority to U.S. Appln. No. 61/113,319 filed Nov. 11, 2008, the contents of which are incorporated herein by reference in their entirety. This application is also a continuation-in-part of, and claims priority to U.S. patent application Ser. No. 12/509,389, filed Jul. 24, 2009 and U.S. Appln. No. 61/129,890 filed Jul. 28, 2008.

FIELD OF THE INVENTION

The technical field of this disclosure relates generally to a method, program product, and apparatus for performing a model based coloring process for decomposition of a target pattern so as to allow the target pattern to be imaged using, for example, multiple masks in a multiple illumination process.

BACKGROUND OF THE INVENTION

A lithographic projection apparatus can be used, for example, in the manufacture of integrated circuits (ICs). The lithographic projection apparatus can include a mask having a circuit pattern corresponding to an individual layer of the IC. This pattern can be imaged onto a target portion (e.g., comprising one or more dies) on a substrate (e.g., a silicon wafer) which has been coated with a layer of radiation sensitive material (e.g., resist). The radiation sensitive material can be developed, and the substrate further processed, in order to form the circuit pattern on the substrate. In general, a single wafer will contain a plurality of target portions that are successively irradiated via a projection system of the lithographic projection apparatus. For example, in a wafer-stepper lithographic projection apparatus, the entire mask pattern is imaged onto the target portion at the same time. In contrast, in a step-and-scan lithographic projection apparatus, the mask pattern is imaged onto the target portion by scanning the mask pattern in a given direction (i.e., the scanning direction) while, e.g., synchronously scanning the substrate anti-parallel to the scanning direction. Since, in general, the projection system will have a magnification factor M (generally <1), the speed V at which the substrate is scanned will be a factor M times the speed that the mask is scanned.

In a manufacturing process using a lithographic projection apparatus, the substrate may undergo various processes in order to form a single layer of the IC, such as priming, resist coating, and soft baking. Furthermore, after imaging the mask pattern onto the layer of radiation sensitive material on the substrate, the substrate may be subjected to additional processes, e.g., post-exposure bake (PEB), development, hard bake, and measurement/inspection of the imaged pattern. The resulting patterned layer may then undergo various processes such as etching, ion-implantation (doping), metallization, oxidation, chemo-mechanical polishing, etc., in order to complete the layer. If multiple layers are required, this process, or a variant thereof, can be repeated for each additional layer. Accordingly, an array of devices can be formed on the substrate. These devices can then be separated from one another by dicing or sawing, and packaged individually.

The lithographic projection apparatus includes a projection system, which hereinafter may be referred to as the "lens." However, this term should be broadly interpreted as encompassing various types of projection systems including, e.g., refractive optics, reflective optics, and catadioptric systems. The lithographic projection apparatus further includes a radiation system configured to direct, shape, or control a beam of radiation. The beam of radiation can be patterned with, e.g., a mask or reticle, and projected onto the substrate. The lithographic apparatus can have two or more substrate tables (and/or two or more mask tables). In such "multiple stage" lithographic apparatus, the additional substrate tables can be used in parallel, or preparatory steps can performed while one or more other substrate tables are being used for exposures. For example, U.S. Pat. No. 5,969,441, herein incorporated by reference, describes a twin stage lithographic apparatus.

The masks or reticles comprise geometric patterns which correspond to the circuit components formed on the substrate. Mask and reticle patterns are generated using CAD (computer-aided design) programs, this process often being referred to as EDA (electronic design automation). Most CAD programs implement design rules determined by processing and design limitations in order to create functional masks and reticles. For example, design rules may define the space tolerance between circuit devices (such as gates, capacitors, etc.) or interconnect lines, so as to ensure that the circuit devices or lines do not conflict. The design rule limitations are typically referred to as "critical dimensions" (CD). A critical dimension of a circuit can be defined as the smallest width of a line or hole, or the smallest space between two lines or two holes. Thus, the CD determines the overall size and density of the circuit.

One objective of IC fabrication is to accurately reproduce the circuit design on the substrate using the mask. However, as the critical dimensions of the target patterns decreases, it is more difficult to reproduce the target pattern on the substrate. Double exposure is a multiple exposure technique which allows the minimum CD capable of being reproduced on the substrate to be reduced. For example, using dipole illumination, the vertical edges (i.e., features) of the target pattern are illuminated in a first exposure, and the horizontal edges of the target pattern are illuminated in a second exposure.

Another double exposure technique separates the features of the target pattern into two or more different masks, and each mask is imaged separately to form the desired pattern. This technique may be used when the features of the target pattern are spaced too closely for the features to be imaged. Accordingly, the target pattern may be separated onto two or more masks such that the features on a given mask are spaced sufficiently far apart that each feature can be imaged. As a result, it is possible to image target patterns having features spaced too close together to be imaged using a single mask by ensuring that the pitch between the features on a given mask is greater than the resolution limits of the projection system. Indeed, this double exposure techniques allows for $k_1<0.25$. Nevertheless, limitations exist with conventional double exposure techniques. For example, conventional methods for decomposing target patterns operate on each feature of the target pattern as a unit, rather than on smaller portions of the features. As a result, it is not possible to obtain a $k_1<0.25$ for certain target patterns, despite the use of double exposure. Additionally, conventional decomposition methods are often rule based algorithms which require too many rules to implement complex designs. Moreover, rule based algorithms may fail when situations or conflicts arise for which no rule has been defined. Accordingly, it is desired to overcome the deficiencies of conventional multiple exposure techniques and methods for decomposition of a target pattern onto multiple masks.

SUMMARY OF THE INVENTION

According to various embodiments and aspects of this disclosure, a model based coloring process is provided which allows a target pattern to be distributed across a plurality of different masks. The model based coloring process can decompose features of the target pattern into multiple fragments, which can be imaged on separate masks using multiple exposures, e.g. double or triple exposures. The resulting image is the combination of each of the exposures (i.e., the target pattern is created by superposition of the images created by each of the multiple exposures).

According to an aspect of the invention, there is provided a method of decomposing a target pattern containing features to be imaged onto a substrate into a plurality of exposure patterns, the method comprising dividing the target pattern into fragments; assigning the fragments to an exposure pattern; assigning evaluation points to the fragments; and maximizing values of the evaluation points, the maximizing including: calculating values at the evaluation points; determining a minimum value of the evaluation points; calculating changes in the values as a result of assigning a fragment to a different exposure pattern; determining a maximum change of the values; and assigning the fragment associated with the maximum change to a different exposure pattern.

According to a further aspect of the invention, there is provided a computer readable storage medium storing computer executable instructions configured to decompose a target pattern containing features to be imaged onto a substrate into a plurality of patterns, which when executed by a computer, perform the operations comprising dividing the target pattern into fragments; assigning the fragments to an exposure pattern; assigning evaluation points to the fragments; and maximizing values of the evaluation points, the maximizing including: calculating values at the evaluation points; determining a minimum value of the evaluation points; calculating changes in the values as a result of assigning a fragment to a different exposure pattern; determining a maximum change of the values; and assigning the fragment associated with the maximum change to a different exposure pattern.

According to a further aspect of the invention, there is provided a device manufacturing method comprising providing a substrate, wherein the substrate is at least partially covered by a layer of radiation sensitive material; patterning a beam of radiation; and projecting the patterned beam of radiation onto the layer of radiation sensitive material; wherein patterning a beam of radiation is performed using a plurality of exposure patterns, the exposure patterns formed by: dividing a target pattern into fragments; assigning the fragments to an exposure pattern; assigning evaluation points to the fragments; and maximizing values of the evaluation points, the maximizing including: calculating values at the evaluation points; determining a minimum value of the evaluation points; calculating changes in the values as a result of assigning a fragment to a different exposure pattern; determining a maximum change of the values; and assigning the fragment associated with the maximum change to a different exposure pattern.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 4 shows an exemplary diagram of gradients associated with the various fragments and ILS evaluation points of the target pattern of FIG. 2;

FIG. 5 shows an exemplary diagram of the Hessian associated with the various fragments of the target pattern of FIG. 2;

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
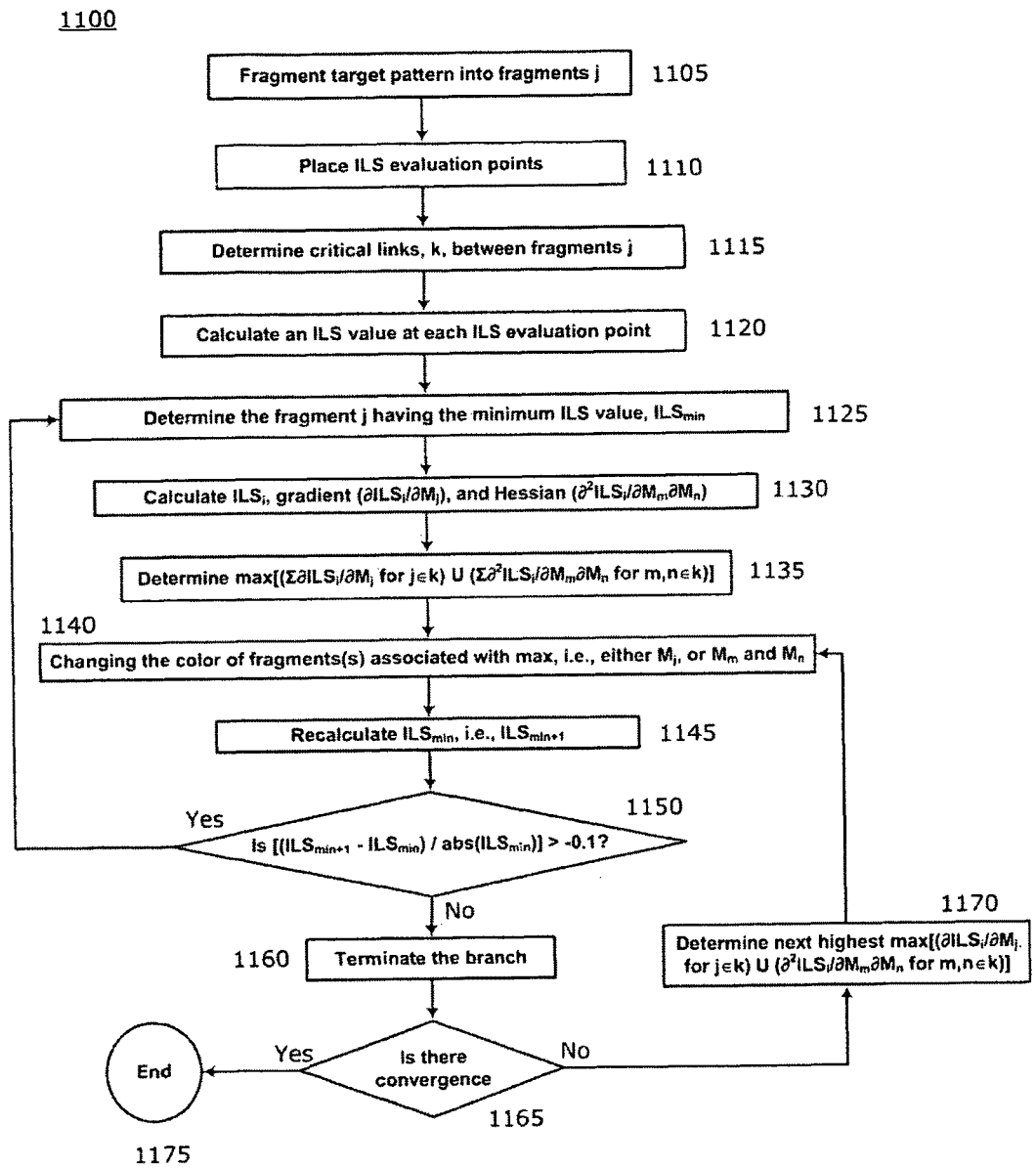
FIG. 1 shows an exemplary flowchart of a model based coloring process.

FIG. 1 shows flowchart 1100 of an exemplary model based coloring process. The model based coloring process divides a target pattern into multiple fragments, j, which are distributed between multiple masks (where j is the number assigned to identify the fragment). The masks are separately imaged in a multiple exposure process, and the target pattern is reproduced on the substrate by the superposition of the images. For example, in a double exposure process, each fragment resides on either a first or a second mask. Similarly, in a triple exposure process, each fragment resides on one of a first, a second, or a third mask. The assignment of the fragments to the different masks can be based on a quality metric of the resulting image pattern. The process of determining which fragments to assign to each mask is a form of integer programming known as coloring.

The target pattern can be described in a proprietary or standard data format, such as GDS, GDSII, or OASIS. The target pattern can be fragmented (1105) into features, portions of features, or pixels, for example. Various techniques can be used to fragment the target pattern. For example, U.S. patent application Ser. No. 12/509,389 describes projecting a ray having a length which is associated with a minimum resolvable distance from the vertexes of each pattern feature, and fragmenting the adjacent pattern features in places where the adjacent pattern features are intersected by the ray. The length of the ray used can be determined based on the illumination settings of the lithographic apparatus, e.g. on the type of illumination (annular, quadrature, off-axis, etc.), wavelength of illumination source λ, numerical aperture of projection lens (NA), etc. As a result, an optimized fragmentation of the target pattern can be provided, e.g. a fragmentation having a minimal number of fragments.

However, an optimized fragmentation of the target pattern may not be known which does not suffer from coloring conflicts. Therefore, according to an embodiment, fragmentation of the target pattern is performed by pixelizing the target pattern. In other words, the target pattern can be divided into a simple and/or regular array of fragments. Pixelizing the target pattern results in the most general fragmentation. Therefore, conflicts between the fragmentation and the coloring of the target pattern can be reduced or eliminated. Further, varying degrees of accuracy can be provided by adjusting the pixel resolution.

Figure 2:
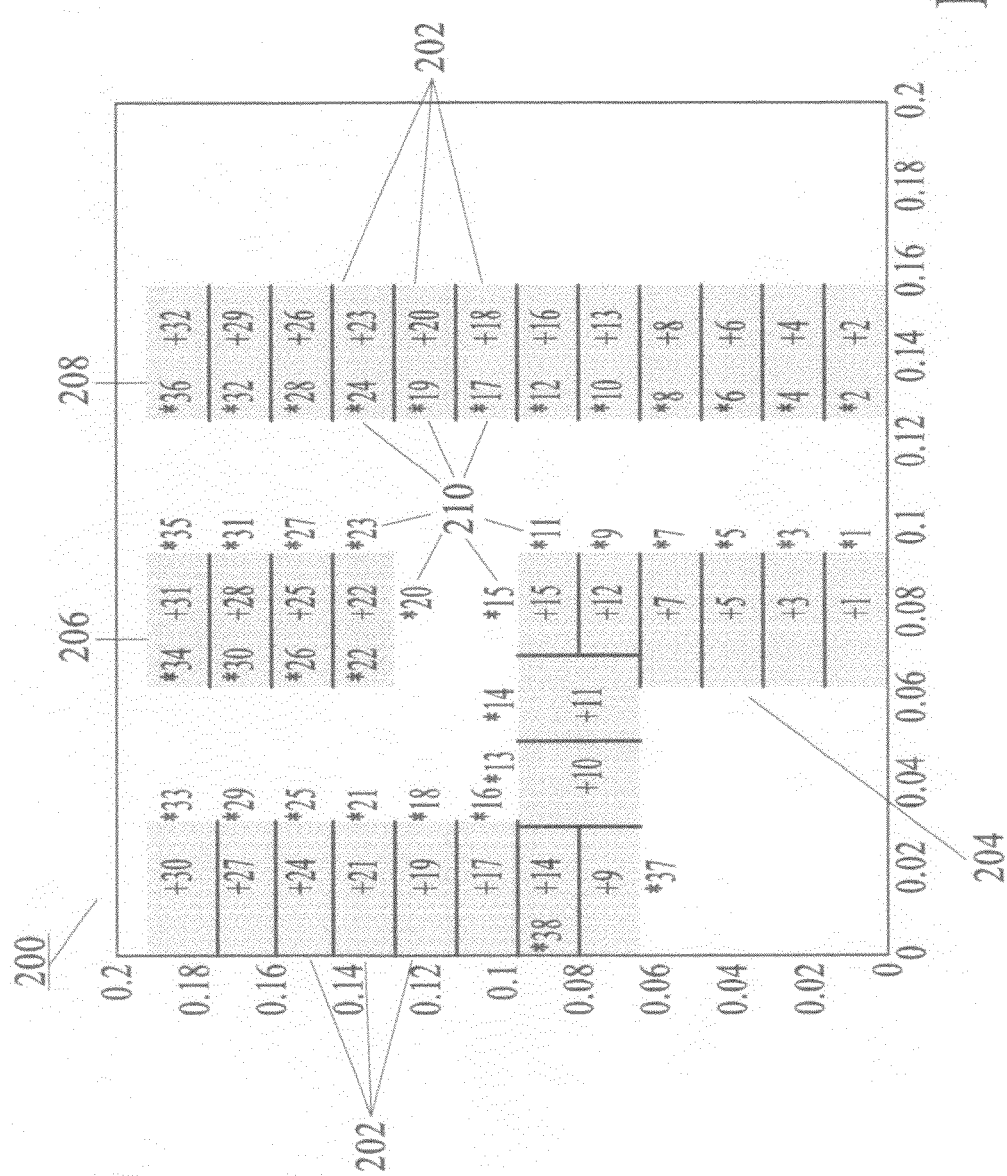
FIG. 2 shows an exemplary target pattern and fragmentation of the target pattern.

FIG. 2 shows an exemplary target pattern 200 which has been fragmented into pixels. A "+" precedes the number j of each fragment 202-j and marks each fragment's center. In the target pattern 200, three different pattern features 204, 206 and 208 have been divided into fragments 202-j of substantially the same size and which are numbered from j=1 to 32. Each fragment 202-j is initially assigned to a mask M, where M is an integer. In a double exposure, for example, each fragment 202-j can be placed either on a first mask (i.e., M=0) or on a second mask (i.e., M=1). For instance, $M_j=0_{16}$ indicates that fragment 16 is located on the first mask. In an embodiment, each mask is associated with a particular color such that the color of each fragment identifies the mask on which it is located. Further, in an embodiment, each mask is associated with a particular illumination phase, e.g. either 0° or 180°. Additional techniques for designating the mask assignment for a particular fragment can also be used.

Referring to FIG. 1, evaluation points are assigned (1110) to locations on the target pattern for calculating a quality metric of the resulting image pattern. In an embodiment, the quality metric can be, e.g., the image log slope (ILS) or normalized image log slope (NILS). The image log slope represents the steepness of the transition from a bright area to a dark area in the resulting image pattern. In particular, pattern features imaged on the substrate have improved edge definition when the transition is abrupt. ILS is the value of the slope of the intensity at the point of transition normalized for the illumination intensity, i.e.

$$ILS = \frac{1}{I}\frac{dI}{dx} = \frac{d\ln(I)}{dx}.$$

Further, ILS is often expressed as a percentage of feature width (e.g., line width). Accordingly, NILS expresses the ILS normalized for line width, i.e.

$$NILS = w\frac{d\ln(I)}{dx}.$$

Although this disclosure describes evaluating ILS values, it is understood that ILS, NILS, or other quality metrics of the resulting image pattern can be used, e.g., exposure latitude (EL), depth of focus (DOF), critical dimension uniformity (CDU), mask error enhancement factor (MEEF), process window (PW), and/or edge placement error (EPE).

FIG. 2 further shows an exemplary placement of ILS evaluation points 210-p assigned to the fragments 202-j of the given target pattern 200. A "*" precedes the number of each ILS evaluation point 210-p, which are numbered from p=1 to 36. It is necessary to assign at least one ILS evaluation point 210 to each fragment 202 so that the ILS can be evaluated for each fragment. In an embodiment, ILS evaluation points may be placed on the outside edges (i.e., on the perimeter) of each feature 204, 206, 208 in the target pattern 200. It is not necessary, however, to place ILS evaluation points 210 on the edges of fragments 202 which are in common (i.e. shared) between two or more fragments. Additionally, it may not be necessary to place ILS evaluation points 210 on the edges of fragments 202 which are not adjacent or nearby other target pattern features.

For example, in an embodiment, ILS evaluation points 210 are placed on the edges of fragments 202 which are within a predetermined distance of adjacent pattern features. In particular, evaluation points 210 can be placed on edges of adjacent pattern features which are separated by a distance, e.g., of less than 0.3 λ/NA. Further, in an embodiment, ILS evaluation points 210 can be provided at locations known for being difficult to image (e.g., at corners of pattern features). Additional techniques for placing ILS evaluation points 210 are possible, for example, as disclosed in U.S. patent application Ser. No. 12/509,389.

Figure 3:
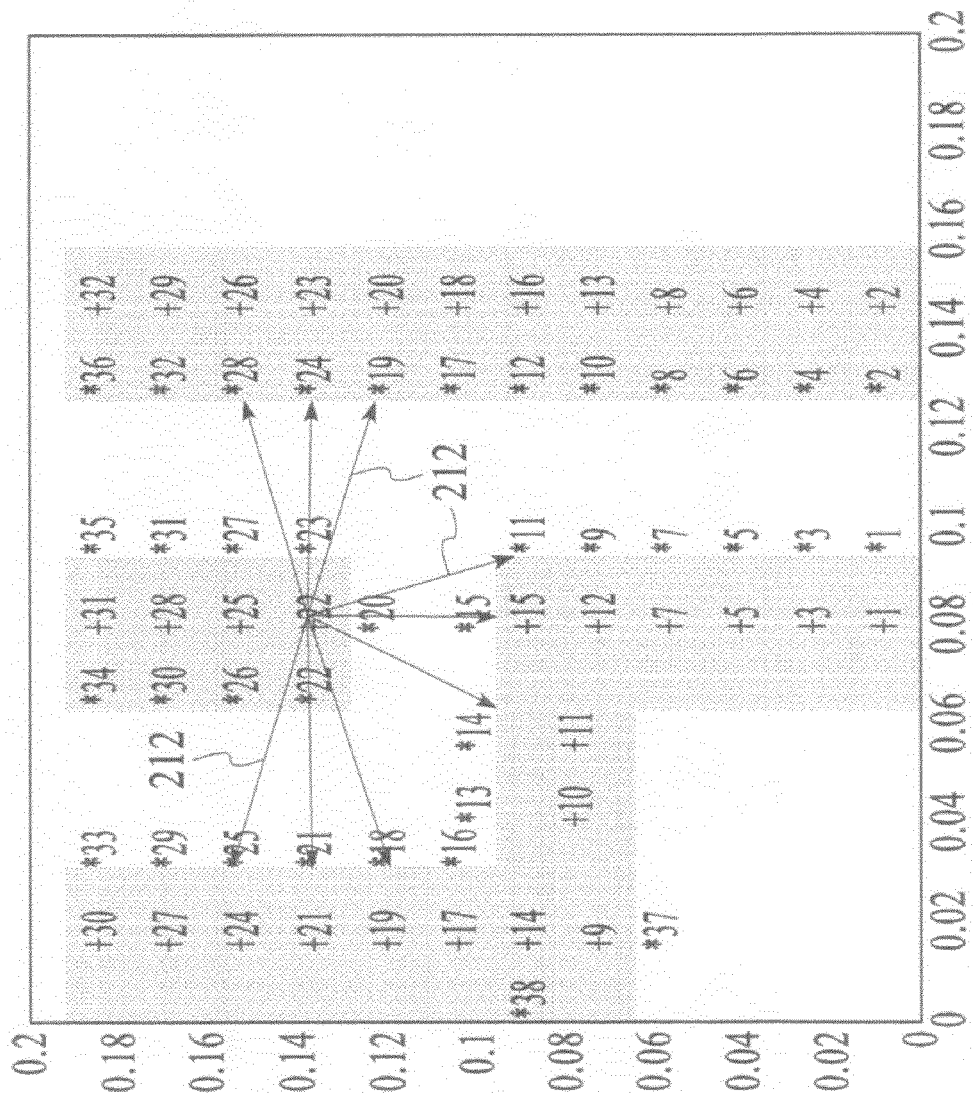
FIG. 3 shows exemplary critical links.

Referring to FIG. 1, critical links, k, are determined between the fragments (1115). The critical links indicate that a group of ILS evaluation points 210 have been assigned to the same fragment 202, and/or that the fragments are in close proximity such that their respective ILS values are interdependent (i.e., that the fragments influence one another). Critical links are found where ILS evaluation points are separated by a distance less than a predetermined value. For example, in an embodiment, the distance is less than 0.3 λ/NA. By determining the critical links between the fragments, it is possible to assess how the optimization of a given fragment will affect the remaining fragments. In an embodiment, the burden of evaluating the effect of optimizing a particular fragment is reduced since only fragments sharing a critical link with the particular fragment are considered. FIG. 3 shows exemplary critical links 212 which exist between fragment 202-22 and fragments 202-11, -15, -19, -20, -21, -23, -24, and -26.

Referring to FIG. 1, ILS values are calculated at each ILS evaluation point (1120). ILS values can be calculated using various methods, such as, but not limited to, the method disclosed in U.S. Pat. No. 7,493,589, herein incorporated by reference. In an embodiment, the ILS values are determined with respect to an illumination setting having, for example, quasar illumination, $\sigma_{in}=0.69$ and $\sigma_{out}=0.89$, NA=1.35, and $k_1=0.224$.

The evaluation points can be sorted, and the evaluation point having the minimum ILS value, $ILS_{min}$, is identified (1125) for optimization. The optimal color assignment for the fragment with $ILS_{min}$ is determined based on the $ILS_i$, gradient, and Hessian (1130). In particular, $ILS_i$ is defined as all of the ILS values of a given fragment since a fragment may have more than one ILS evaluation point. The extent to which the ILS values of a given fragment j can be improved by assigning the fragment to a different mask M can be determined by calculating the gradient, i.e.

$$\frac{\partial ILS_i}{\partial M_j}.$$

In particular, the gradient indicates how each $ILS_i$ value changes when the fragment is assigned to a different mask M. The gradient can be calculated, e.g., by subtracting the fragment's initial ILS value from the fragment's final ILS value. For instance, when fragment j is assigned to the second mask from the first mask, the gradient is equal to the change in the ILS value of the fragment, i.e., $\Delta ILS = ILS_{M=1} - ILS_{M=0}$. FIG. 4 shows an exemplary graph illustrating the gradient values per the scale 402 associated with the various fragments 202 (x-axis) and ILS evaluation points 210 (y-axis) for the target pattern 200 of FIG. 2.

Further, the Hessian, $$\frac{\partial^2 ILS_i}{\partial M_m \partial M_n},$$

is calculated with respect to changing the color assignment of two fragments, $M_m$, and $M_n$, in order to prevent race conditions. For example, it is desirable to change the color assignment of a fragment if all $ILS_i$ values increase. However, if a fragment has multiple ILS values, changing the fragment's color assignment may increase some $ILS_i$ values and decrease other $ILS_i$ values. In other words, if a fragment has negative gradients, changing the color assignment of the fragment will cause the $ILS_i$ values to decrease for the ILS evaluation points having the negative gradients. By calculating the Hessian, it is possible to determine whether it is desirable to change the color assignment of a fragment despite the fact that the ILS values may decrease for some of the fragment's ILS evaluation points. FIG. 5 shows an exemplary graph illustrating the Hessian values per the scale 502 associated with the various fragments 202 (x-axis) against other fragments 202 (y-axis) for the target pattern 200 of FIG. 2.

The gradients and Hessians for each $ILS_i$ are summed and the maximum of the gradient sum and the Hessian sum is determined (1135), i.e.

$$\max\left[\left(\sum \frac{\partial ILS_i}{\partial M_j}, \text{ for } j \in k\right) \cup \left(\sum \frac{\partial^2 ILS_i}{\partial M_m \partial M_n}, \text{ for } m, n \in k\right)\right].$$

In particular, $$\sum \frac{\partial ILS_i}{\partial M_j}$$

is the sum of the changes in the ILS values of fragment j. Further, "j∈k" indicates that the sum includes the fragments, and their associated ILS values, which are also affected by the color change as a result of their physical proximity. Similarly, $$\sum \frac{\partial^2 ILS_i}{\partial M_m M_n}$$

is the sum of the second derivative of the ILS values of fragments m and n. In addition, "m,n∈k" indicates that the sum includes the fragments, and their associated ILS values, which are also affected by the color change as a result of their physical proximity. It is noted m and n represent the fragments used to calculate the Hessian in the same way that j represent a fragment for calculating the gradient. However, the color assignments of both fragments m and n must be changed in order to calculate the Hessian since the Hessian is a second derivative. By determining the maximum of the gradient sum and the Hessian sum, it is determined whether the color assignment of either fragment j, or of fragments m and n should be changed (1140).

After changing the color assignment, $ILS_{min}$ is recalculated, i.e. $ILS_{min+1}$ (1145). It is determined whether the change in $ILS_{min}$ exceeds a threshold (1150), i.e. whether $$\frac{ILS_{min+1} - ILS_{min}}{|ILS_{min}|} > -0.1.$$

In particular, the change in i.e. $ILS_{min}$, i.e. $\Delta ILS_{min} = ILS_{min+1} - ILS_{min}$, is divided by $ILS_{min}$ in order to scale the result. The scaled change in is then compared to a threshold, e.g. −0.1. If the scaled change in $ILS_{min}$ exceeds the threshold, the optimization process continues by returning to (1125) in order to determine the next fragment to optimize, i.e. the fragment j with $ILS_{min+1}$ (1125). The threshold value of −0.1 indicates that optimization of the branch will continue if $ILS_{min}$ value was improved by the optimization, or at least did not significantly decrease. Optimization continues until $ILS_{min}$ reaches a global maximum. Alternatively, if the scaled change in $ILS_{min}$ does not exceed the threshold, optimization of the branch is terminated (1160).

In the event that the branch is terminated (1160), a check for convergence is performed (1165). Convergence is detected if there are no further optimization branches remaining, thus indicating that $ILS_{min}$ has reached a global maximum. If convergence is detected, optimization ends (1175). Alternatively, if convergence is not detected, optimization continues by determining the next highest $$\max\left[\left(\sum \frac{\partial ILS_i}{\partial M_j}, \text{ for } j \in k\right) \cup \left(\sum \frac{\partial^2 ILS_i}{\partial M_m M_n}, \text{ for } m, n \in k\right)\right]$$

(1170) and changing the associated color assignments of the fragments, i.e. j, or m and n.

Figure 6:
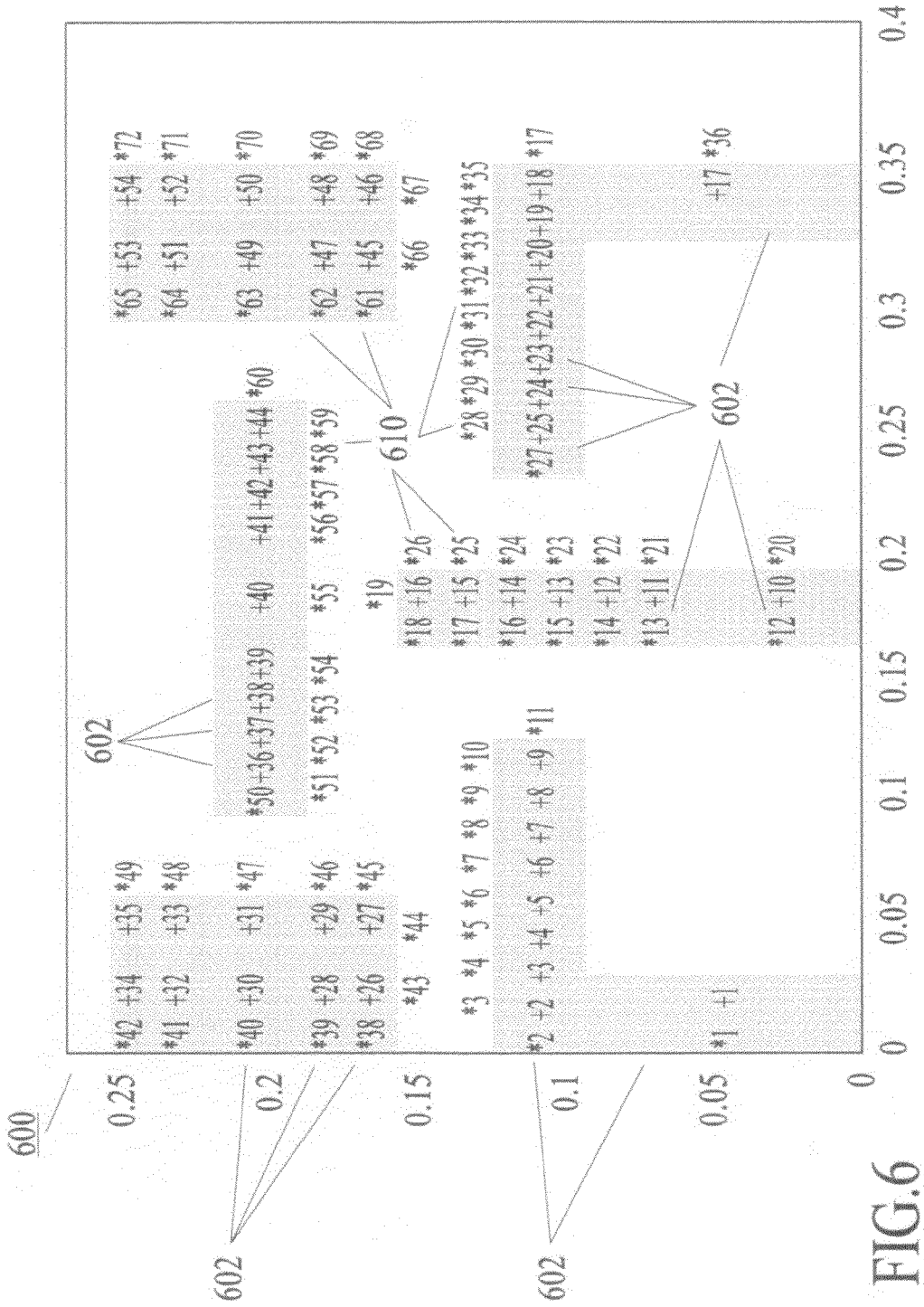
FIG. 6 shows an exemplary target pattern and associated fragments and ILS evaluation points.
Figure 8:
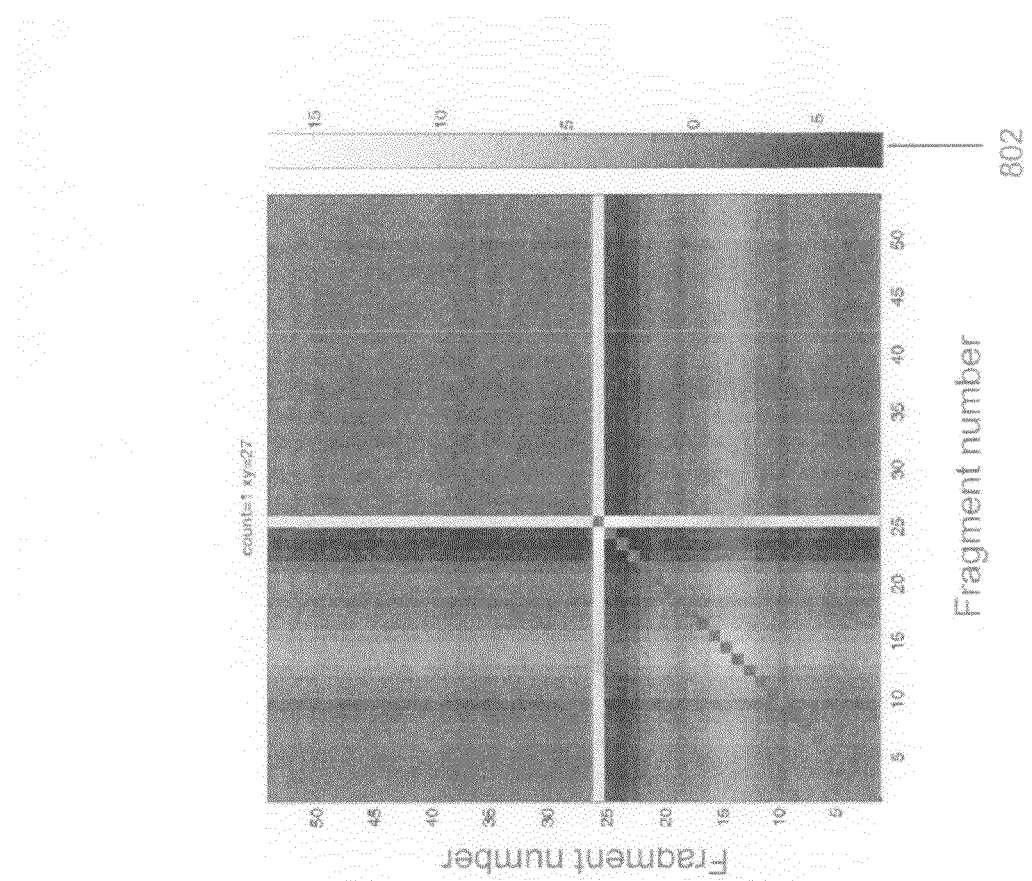
FIG. 8 shows an exemplary diagram of the Hessian associated with the various fragments of the target pattern of FIG. 6.
Figure 7:
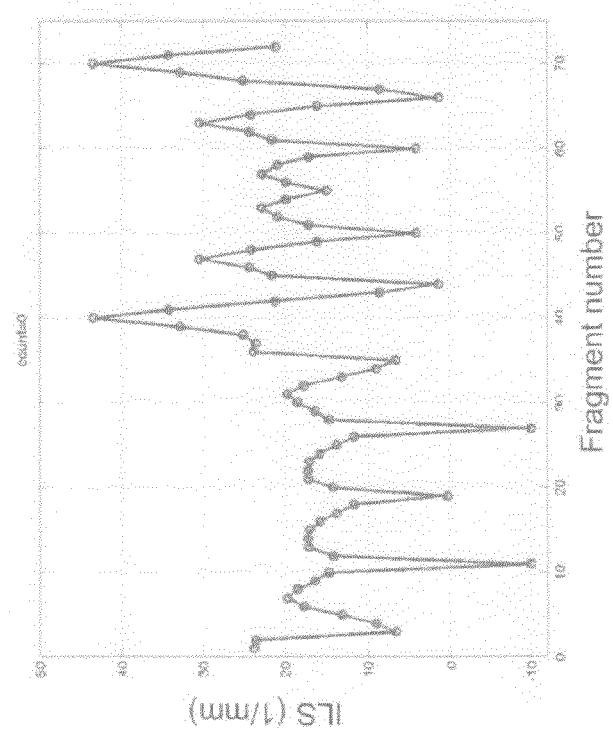
FIG. 7 shows the initial $ILS_i$ values of the target pattern of FIG. 6.
Figure 9:
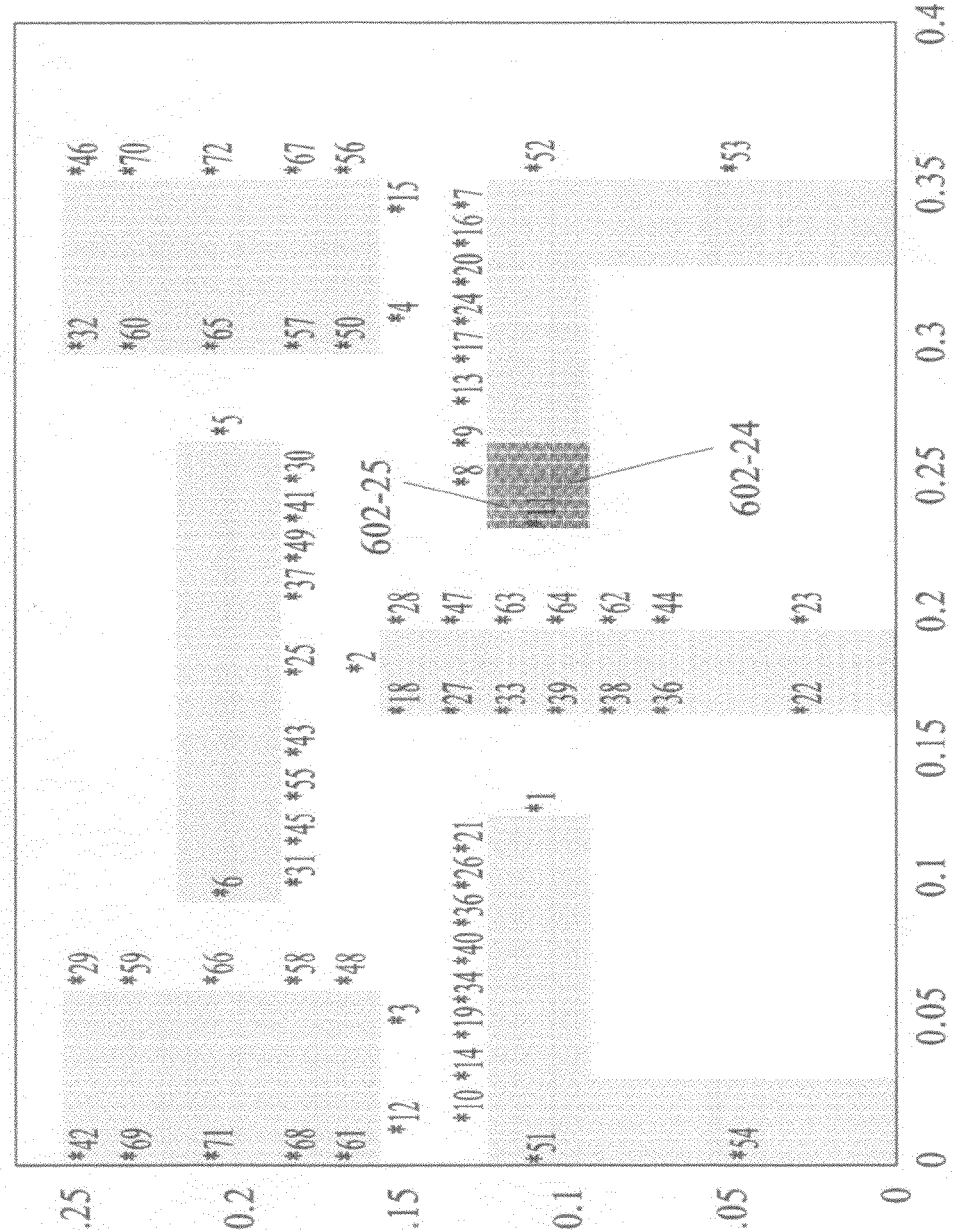
FIGS. 9-25, 27, and 29-34 show coloring assignments of the fragments after respective iterations of the coloring process.
Figure 61:
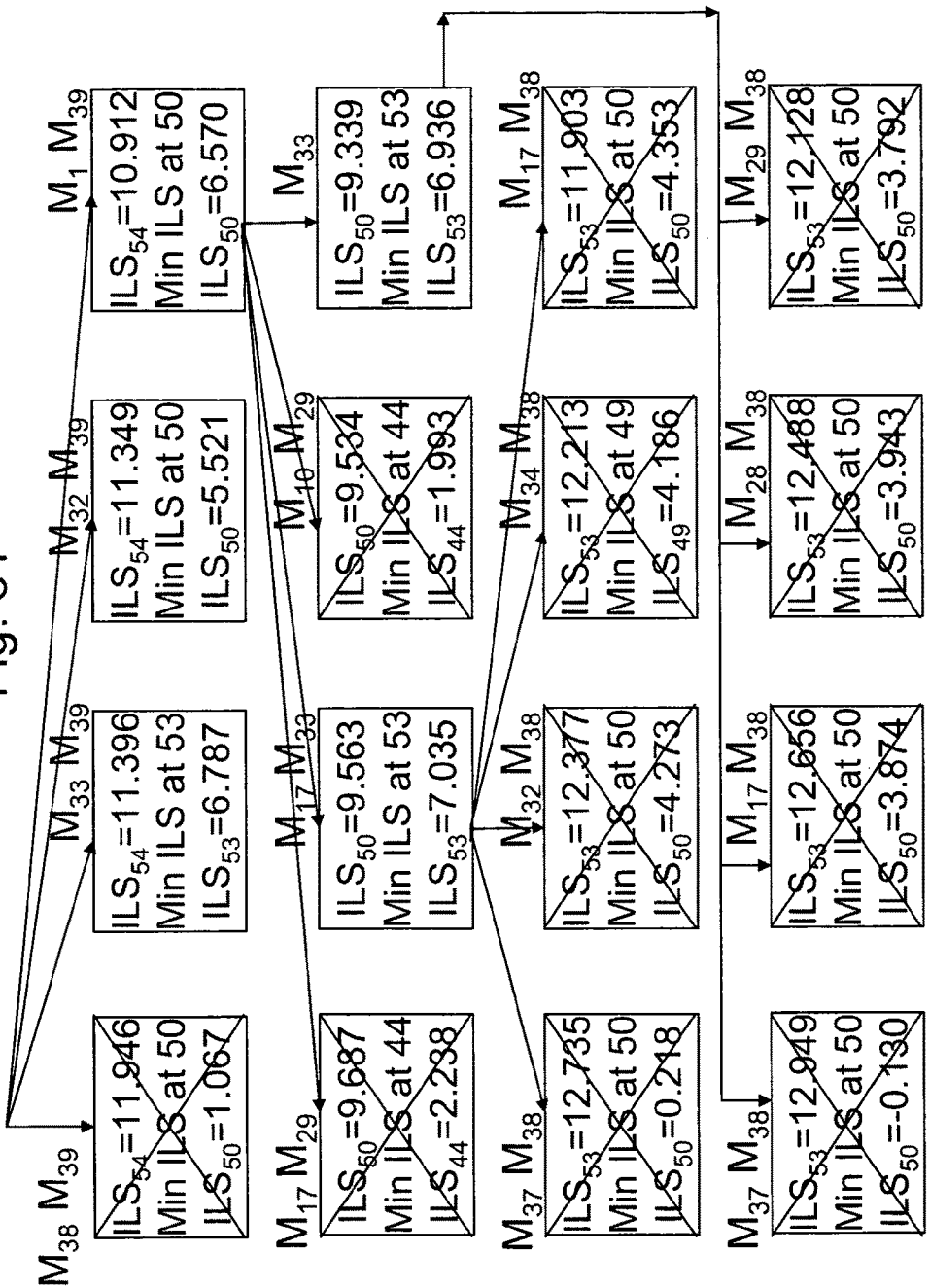

FIGS. 9-61 illustrate the coloring process described in connection with FIG. 1 and above applied to an exemplary target pattern 600 of FIG. 6. In particular, FIG. 6 shows the target pattern 600 divided into 54 fragments 602, where the number of each fragment is preceded with "+" (1105 in FIG. 1). Further, at least one ILS evaluation point 610 is assigned to each fragment, although more ILS evaluation points may be provided in areas which are recognized for being difficult to image (e.g. corners), as explained above. In FIG. 6, 72 ILS evaluation points 610 have been assigned to the 54 fragments 602, where each evaluation point is preceded with "*" (1110 in FIG. 1). Critical links 612 are identified between fragments 602 that are in such close physical proximity to one another that changing the color assignment of a fragment 602 in the group influences the ILS values of other fragments 602 in the group (1115 in FIG. 1) (not shown). An ILS value is calculated at each ILS evaluation point 610 (1120 in FIG. 1). The initial ILS values are graphically shown in FIG. 7. In this example, it can be seen that the ILS evaluation points 610 having the four lowest values are $ILS_{27}$, $ILS_{11}$, $ILS_{19}$, and $ILS_{66}$, (i.e. calculated ILS at points 610-27, 610-11, 610-19 and 610-66) respectively. FIG. 8 shows an exemplary diagram of the Hessian values associated with the various fragments 602 of the target pattern of FIG. 6.

Figure 35:
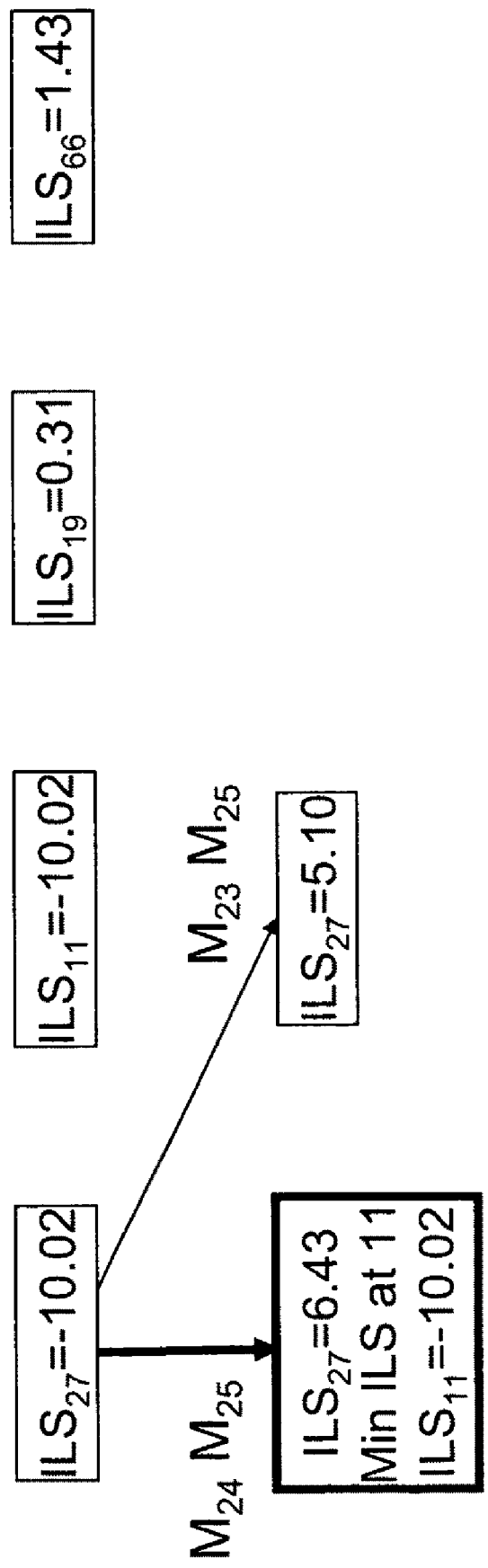
FIGS. 35-61 show an example execution of the coloring process.

FIG. 35 shows the values of the four lowest ILS evaluation points 610. In particular, $ILS_{11}$ and $ILS_{27}$ both have the lowest ILS value of −10.02. FIG. 35 further shows $ILS_{27}$ selected for optimization (1125 in FIG. 1). The $ILS_i$, gradient and Hessian are calculated (1130 in FIG. 1). The maximum of the gradient sum and the Hessian sum is determined (1135 in FIG. 1). In this case, the Hessian sum of $M_{24}M_{25}$ is determined to be the highest sum, while the Hessian sum of $M_{23}M_{25}$ is determined to be the second highest sum. FIG. 9 shows the target pattern 600 after the color assignments of fragments 602-24 and 602-25 have been changed. $ILS_{min}$ is recalculated (1145 in FIG. 1). FIG. 35 shows that $ILS_{27}$ has improved from −10.02 to 6.43, and that the recalculated $ILS_{min}$ is $ILS_{11}$ and has a value of −10.02. The scaled change in $ILS_{min}$ exceeds the threshold value of −0.1 (1150 in FIG. 1), i.e.

$$\frac{-10.02 - (-10.02)}{|-10.02|} = 0.0.$$

In other words, the optimization improved $ILS_{27}$ and also did not reduce $ILS_{min}$. FIG. 35 also shows the improvement in the ILS value which would result from following the alternative branch, i.e. $M_{23}M_{25}$, which has the next highest sum. Although the branch $M_{23}M_{25}$ only improves $ILS_{77}$ from −10.02 to 5.10, the optimization process may return to this branch. For example, branch $M_{23}M_{25}$ can be followed if $M_{23}M_{25}$ is terminated (1160 in FIG. 1).

Figure 10:
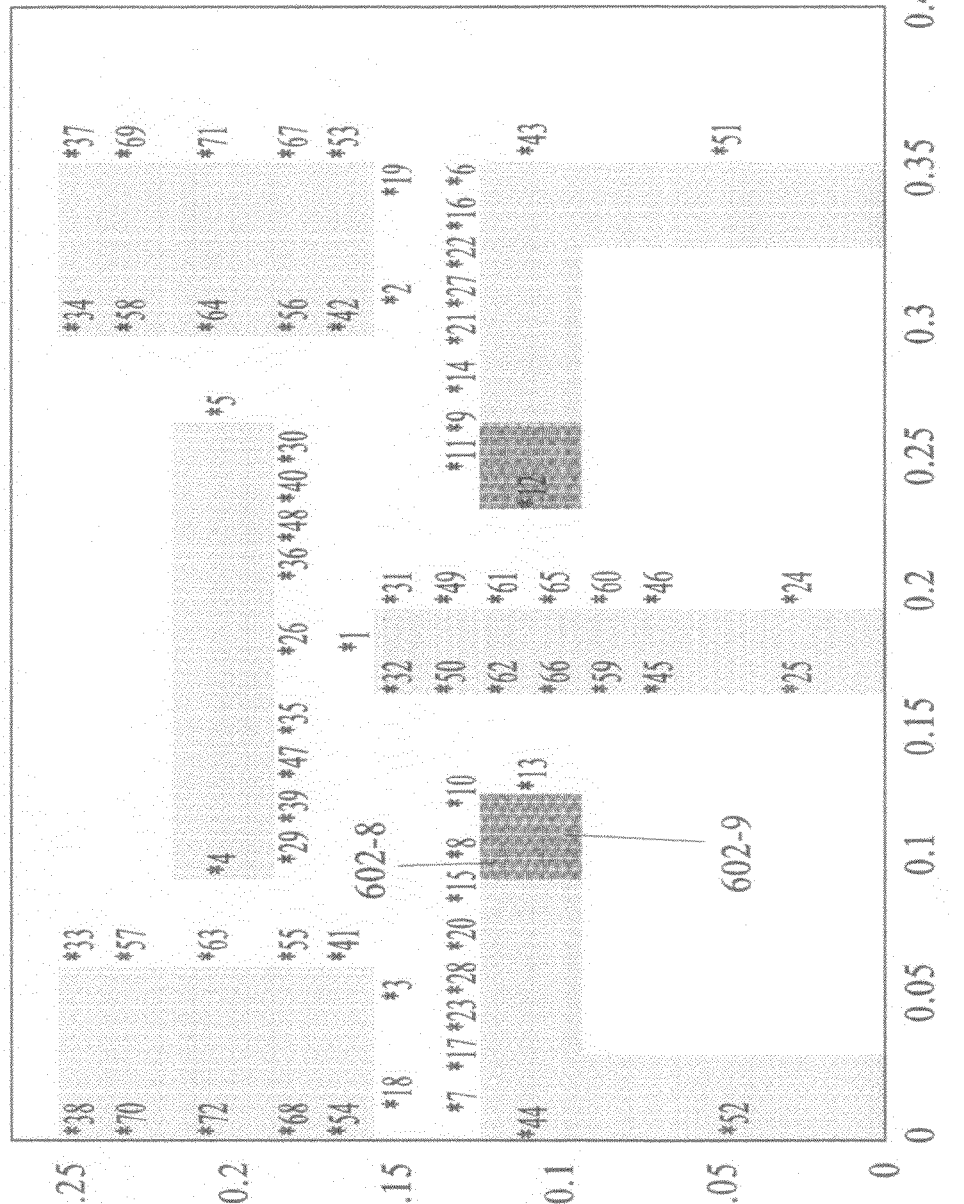
Figure 36:
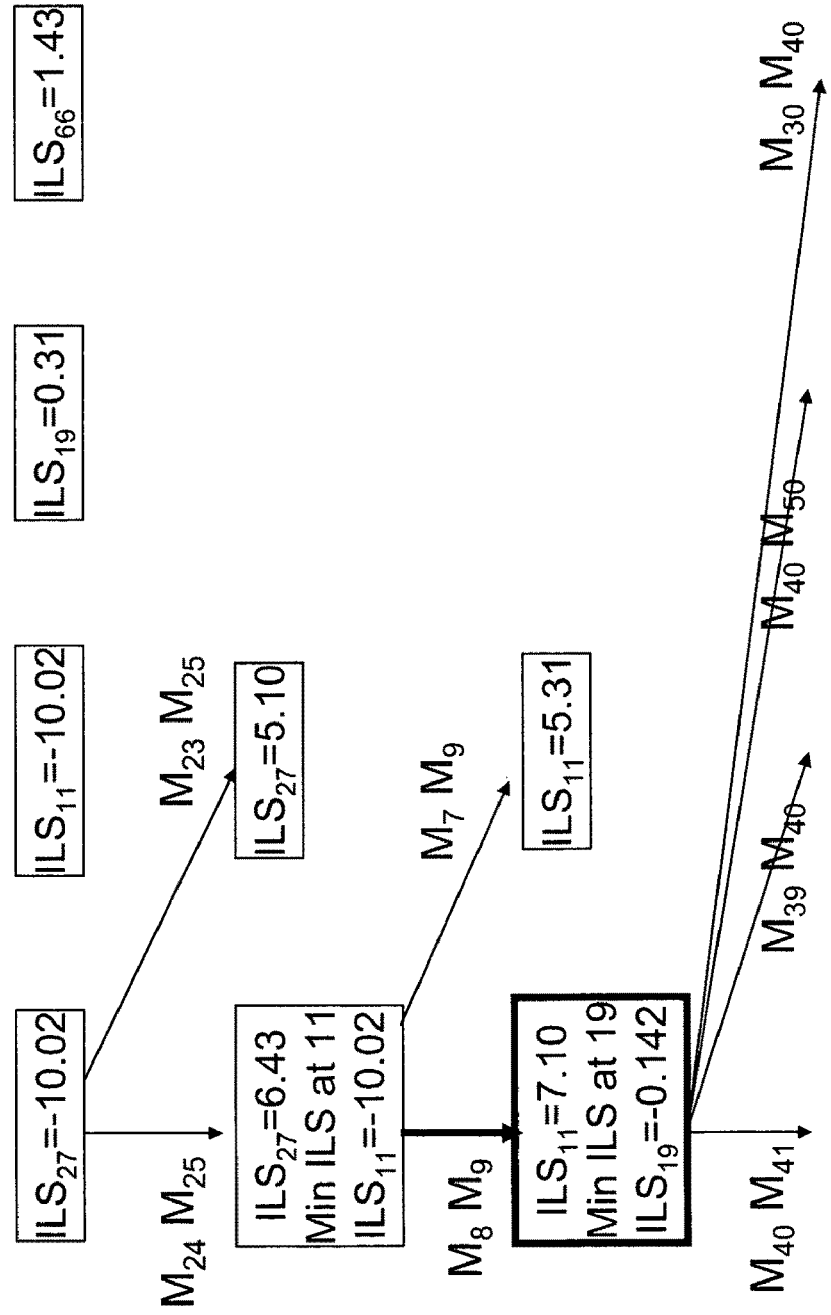

FIG. 36 shows $ILS_{11}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_8M_9$ is determined to be the highest sum, while the Hessian sum of $M_7M_9$ is determined to be the second highest sum. FIG. 10 shows the target pattern after the color assignments of fragments 602-8 and 602-9 have been changed. $ILS_{min}$ is recalculated (1145 in FIG. 1). FIG. 36 shows that $ILS_{11}$ has improved from −10.02 to 7.10, and that the recalculated $ILS_{min}$ is $ILS_{19}$ and has a value of −0.142. The scaled change in $ILS_{min}$ exceeds the threshold value of −0.1 (1150 in FIG. 1), i.e.

$$\frac{7.40 - (-10.02)}{|-10.02|} = 1.739.$$

In other words, the optimization improved $ILS_{11}$ and $ILS_{min}$.

Figure 37:
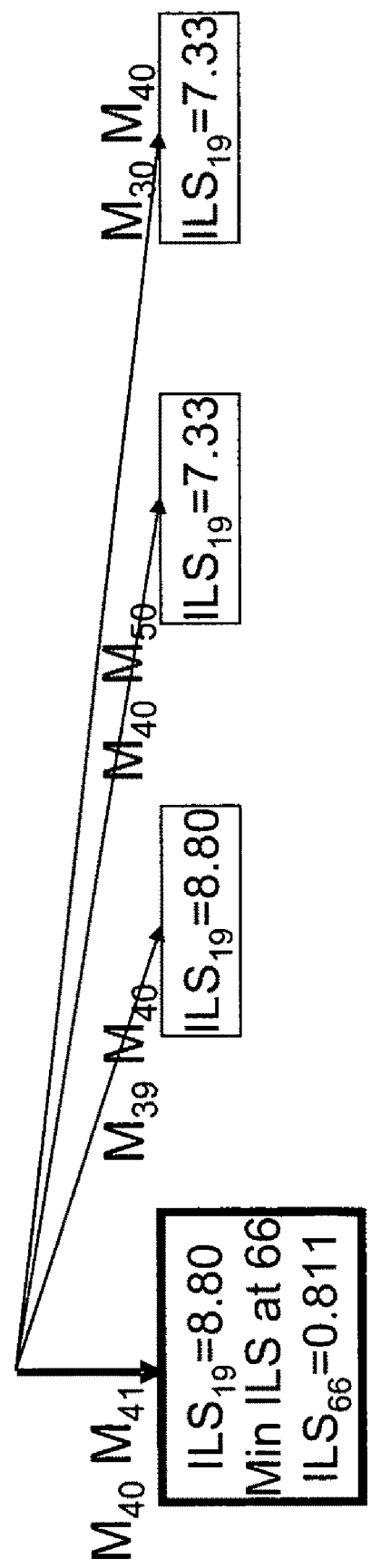

FIG. 37 shows $ILS_{19}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_{40}M_{41}$ is determined to be the highest sum, while the Hessian sums of $M_{39}M_{40}$, $M_{40}M_{50}$, $M_{30}M_{40}$ are determined to be the second, third, and fourth highest sums, respectively.

Figure 11:
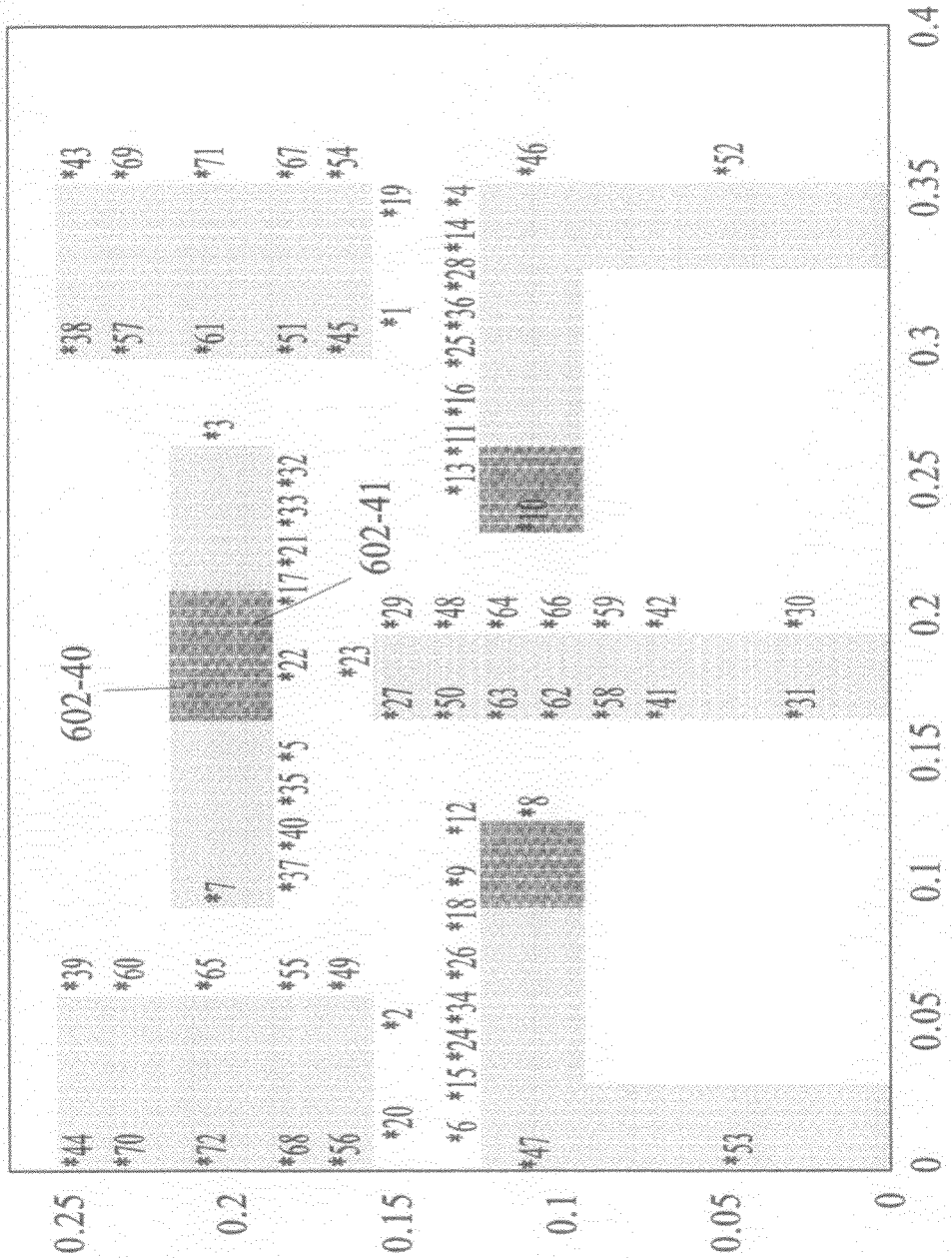

FIG. 11 shows the target pattern after the color assignments of fragments 602-40 and 602-41 have been changed. $ILS_{min}$ is recalculated (1145 in FIG. 1). FIG. 37 shows that $ILS_{19}$ has improved from −0.142 to 8.80, and that the recalculated $ILS_{min}$ is $ILS_{66}$ and has a value of 0.811. The scaled change in the $ILS_{min}$ value exceeds the threshold (1150 in FIG. 1), i.e.

$$\frac{0.811 - (0.142)}{|-0.142|} = 6.711.$$

In other words, the optimization improved $ILS_{19}$ and also improved $ILS_{min}$.

FIG. 37 also shows the improvement in the ILS value which would result from following the alternative branches $M_{39}M_{40}$, $M_{40}M_{50}$, and $M_{30}M_{40}$.

Figure 12:
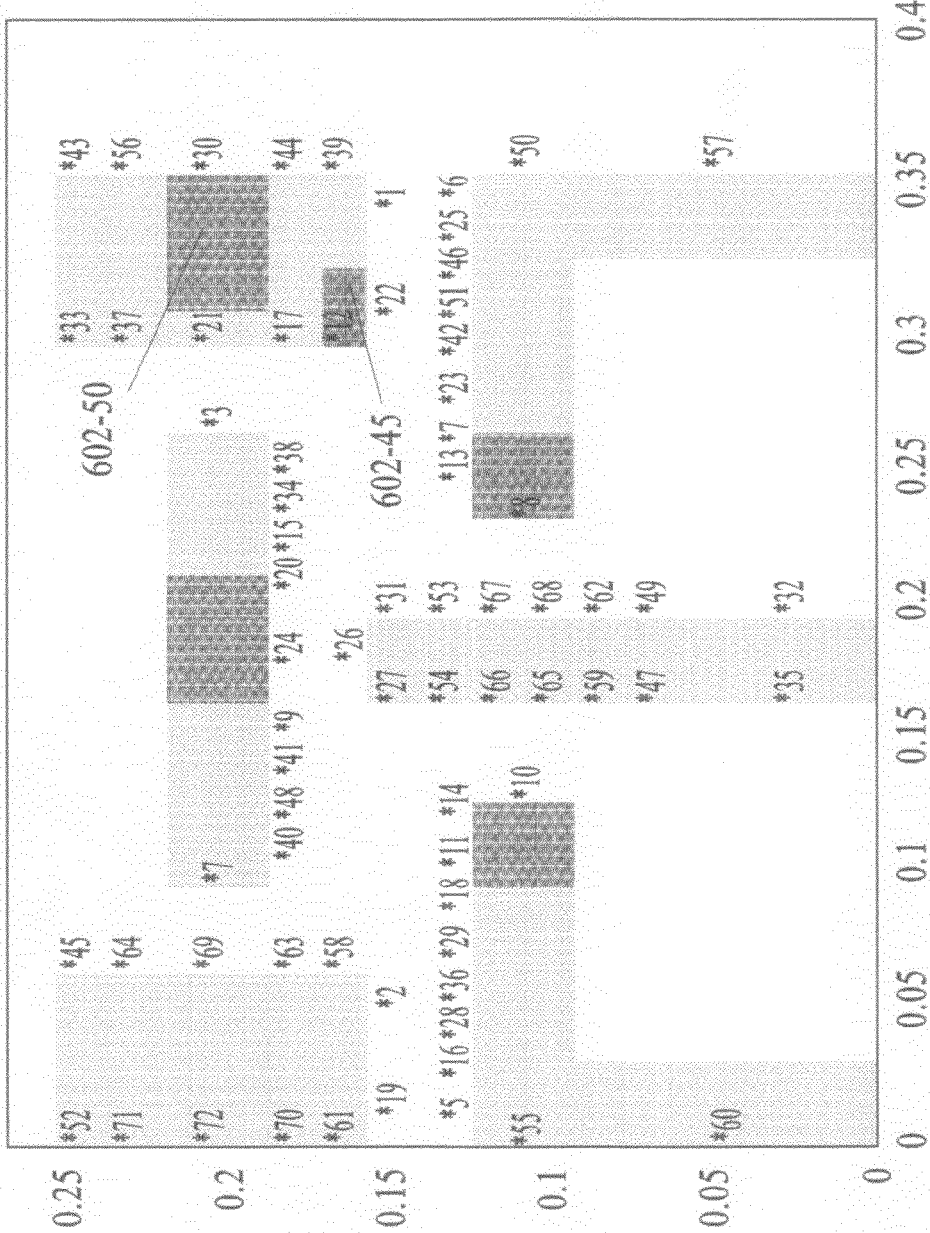
Figure 38:
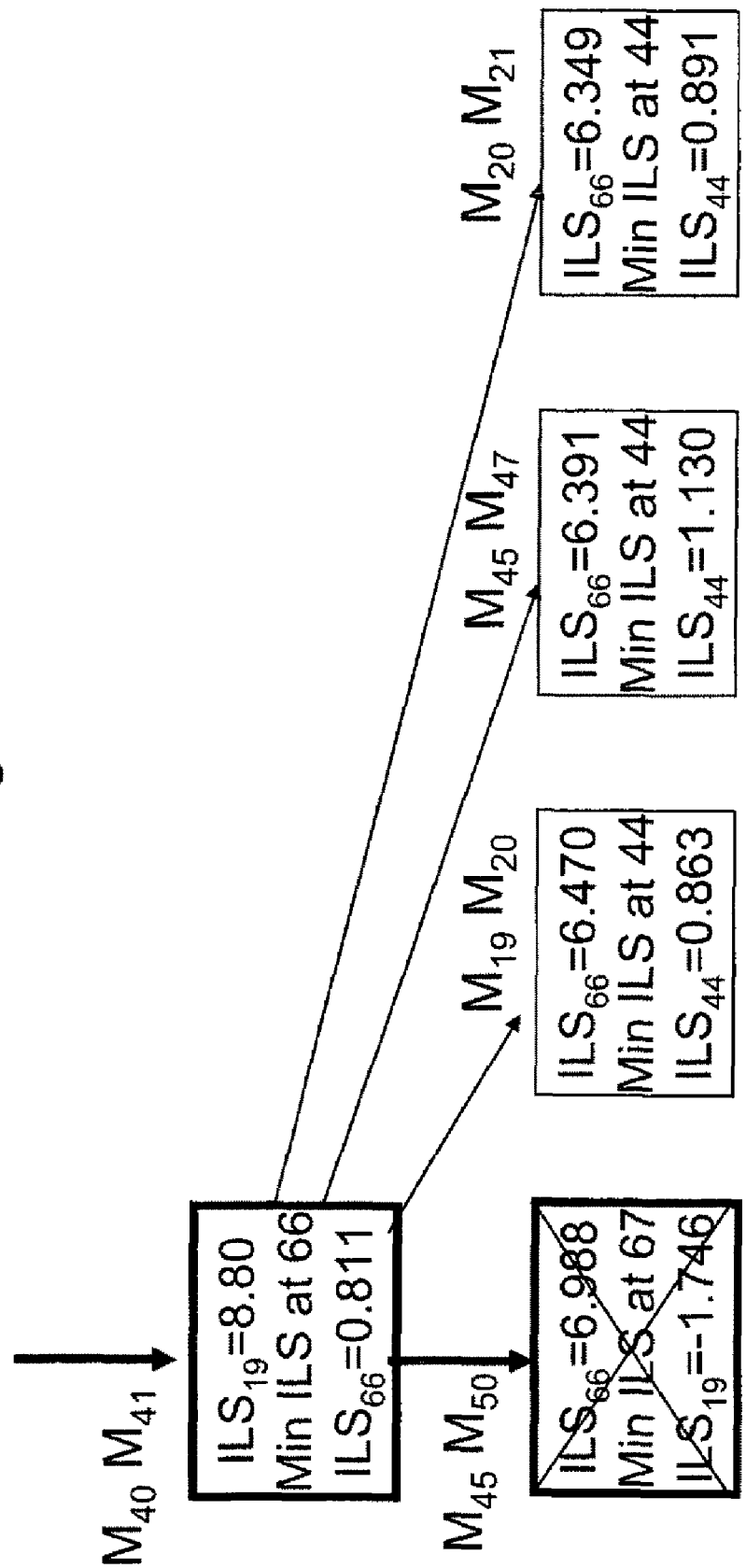

FIG. 38 shows $ILS_{66}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_{45}M_{50}$ is determined to be the highest sum, while the Hessian sums of $M_{19}M_{20}$, $M_{45}M_{47}$, and $M_{20}M_{21}$ are determined to be the second, third, and fourth highest sums, respectively. FIG. 12 shows the target pattern after the color assignments of fragments 602-45 and 602-50 have been changed. $ILS_{min}$ is recalculated (1145 in FIG. 1). FIG. 38 shows that $ILS_{66}$ has improved from 0.811 to 6.988, and that the recalculated $ILS_{min}$ is $ILS_{19}$ and has a value of −1.746. It is determined, however, that the scaled change in the $ILS_{min}$ value does not exceed the threshold value (1150 in FIG. 1), i.e.

$$\frac{-1.746 - (0.811)}{|0.811|} = -3.153.$$

In other words, the optimization improved $ILS_{66}$ but significantly reduced $ILS_{min}$. Therefore, the $M_{45}M_{50}$ branch is terminated (1160 in FIG. 1). Since further optimization branches exist, e.g. $M_{19}M_{20}$, $M_{45}M_{47}$, and $M_{20}M_{21}$, it is determined that convergence has not occurred (1165 in FIG. 1). Accordingly, the next highest sum, i.e. $M_{19}M_{20}$, is selected.

Figure 13:
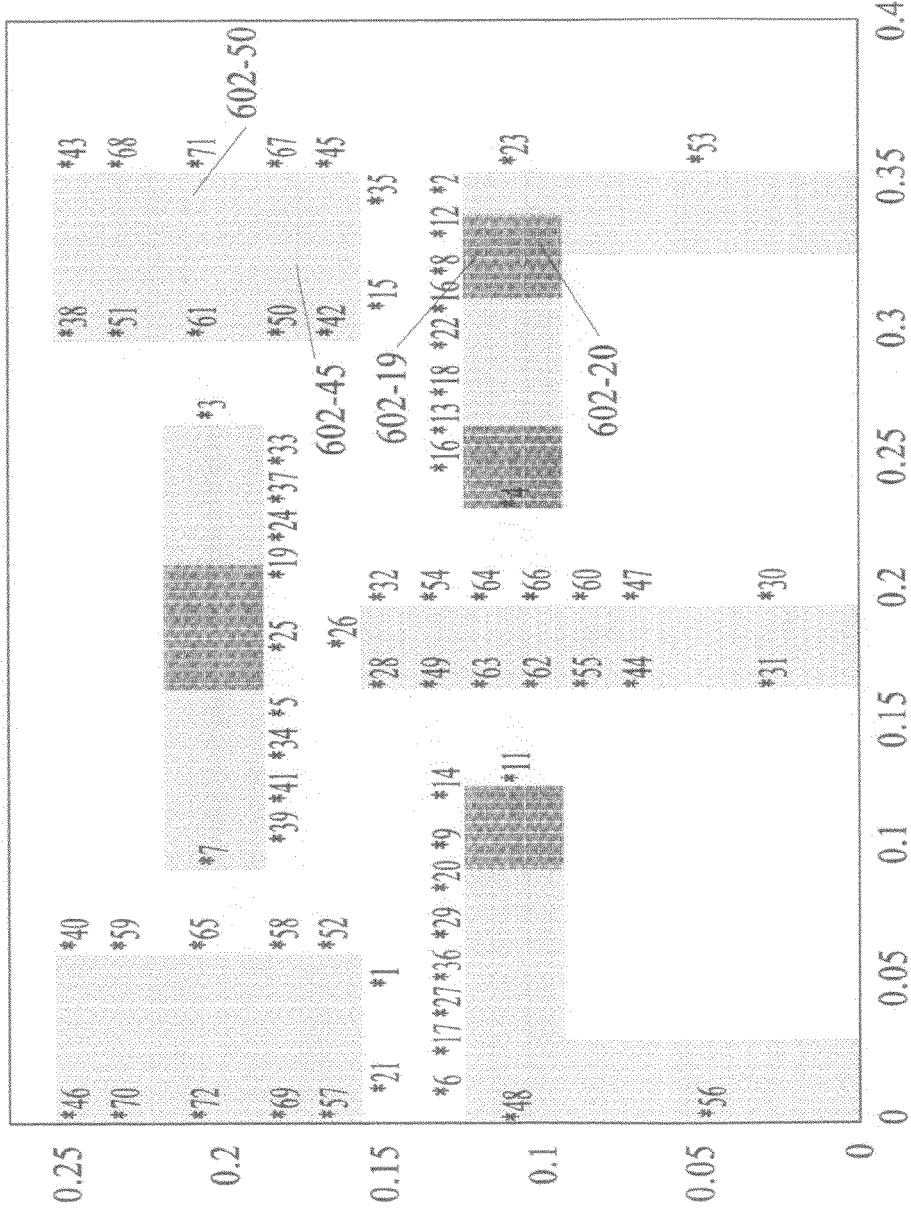
Figure 39:
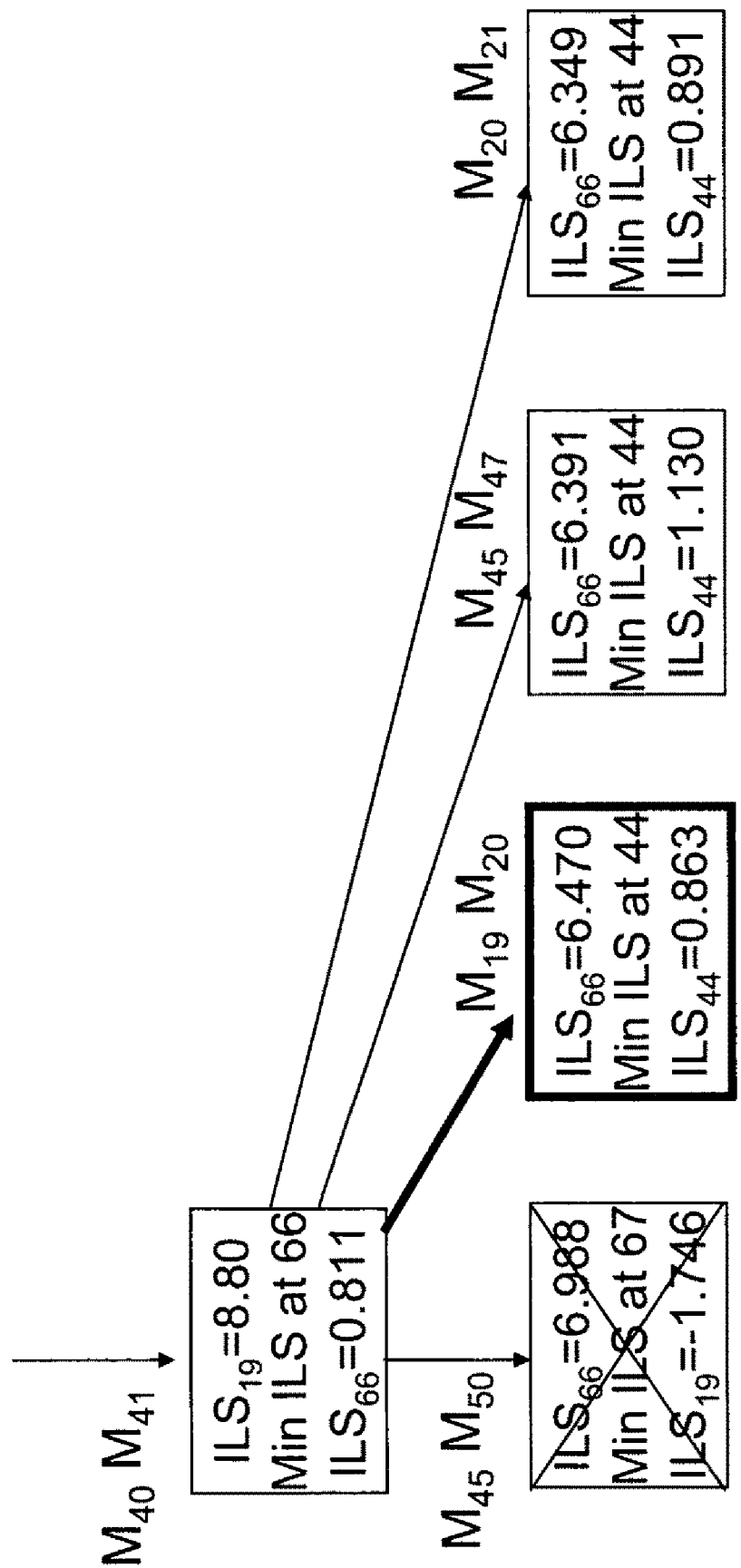

FIG. 13 shows the target pattern after the color assignments of fragments 602-19 and 602-20 have been changed (and the color assignments of fragments 602-45 and 602-50 undone). $ILS_{min}$ is recalculated (1145 in FIG. 1). FIG. 39 shows that $ILS_{66}$ has improved from 0.811 to 6.470, and that the recalculated $ILS_{min}$ is $ILS_{44}$ and has a value of 0.863. The scaled change in the $ILS_{min}$ exceeds the threshold (1150 in FIG. 1), i.e.

$$\frac{0.863 - (0.811)}{|0.811|} = 0.064.$$

In other words, the optimization improved $ILS_{66}$ and also improved $ILS_{min}$.

Figure 40:
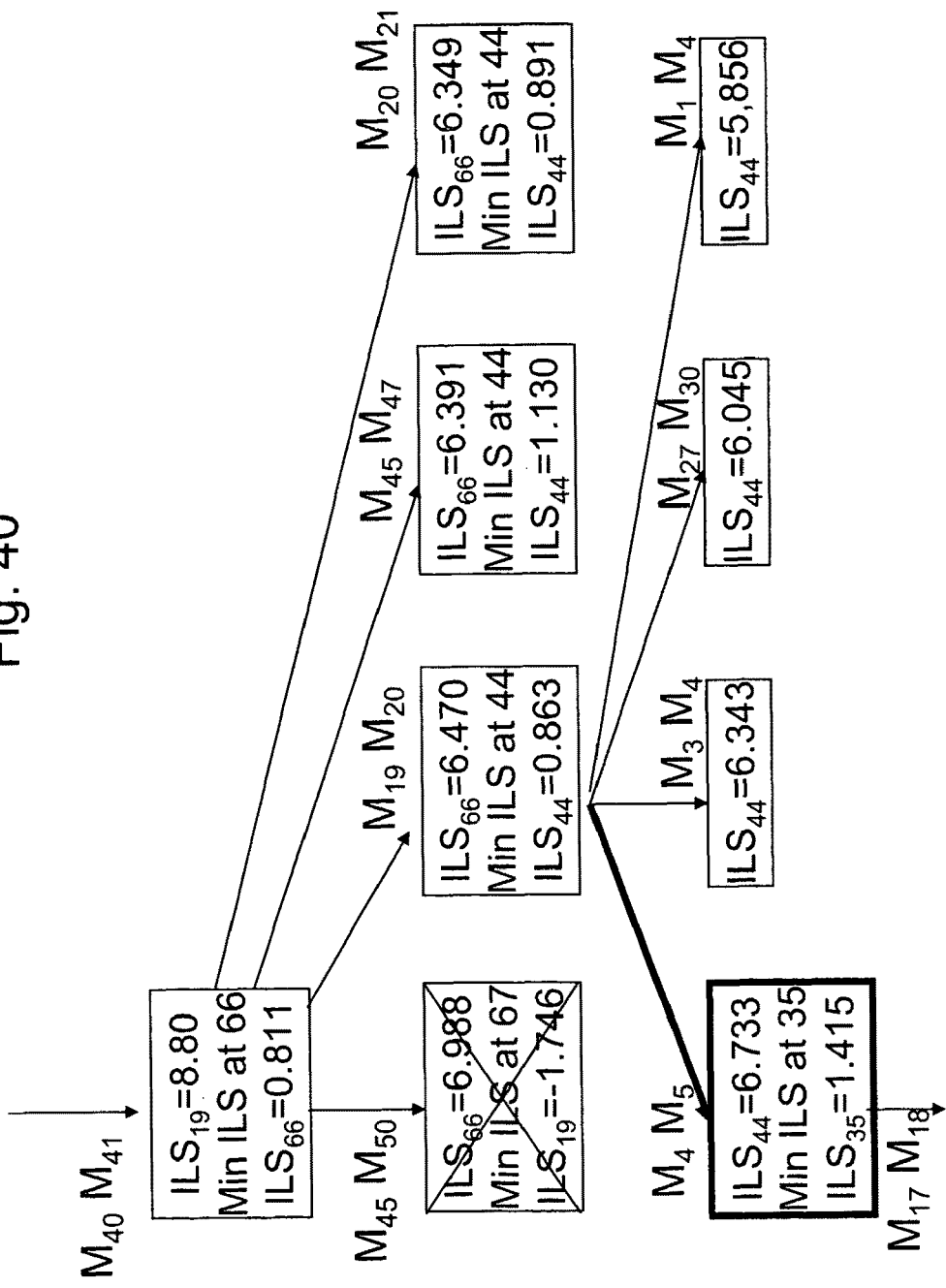

FIG. 40 shows $ILS_{44}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_4M_5$ is determined to be the highest sum, while the Hessian sum of $M_3M_4$, $M_{27}M_{30}$, and $M_1M_4$ are determined to be the second, third, and fourth highest sum, respectively.

Figure 14:
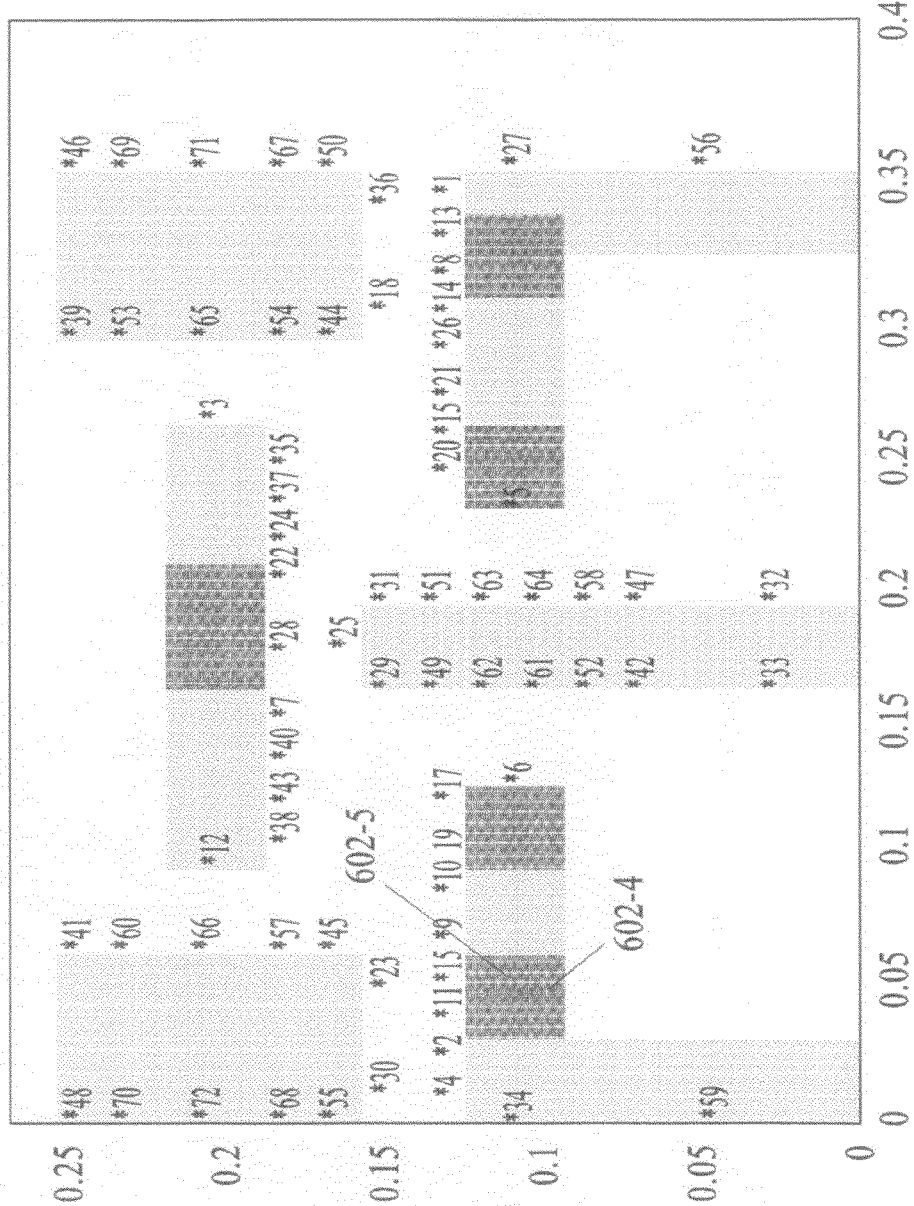

FIG. 14 shows the target pattern after the color assignments of fragments 602-4 and 602-5 have been changed. $ILS_{min}$ is recalculated (1145 in FIG. 1). FIG. 40 shows that $ILS_{44}$ has improved from 0.863 to 6.733, and that the recalculated $ILS_{min}$ is $ILS_{35}$ and has a value of 1.415. The scaled change in the $ILS_{min}$ value exceeds the threshold (1150 in FIG. 1), i.e.

$$\frac{1.415 - (0.863)}{|0.863|} = 0.640.$$

In other words, the optimization improved $ILS_{44}$ and also improved $ILS_{min}$.

Figure 15:
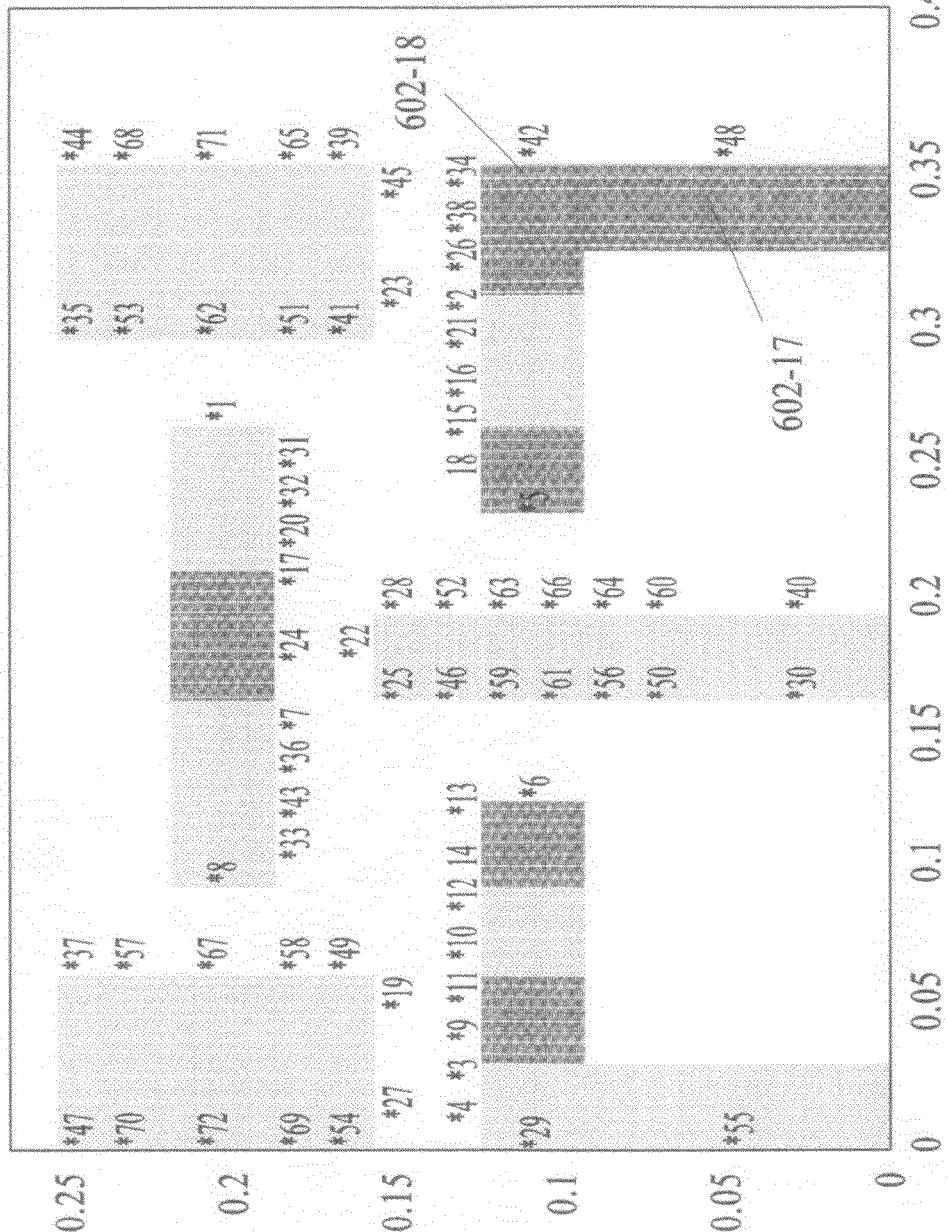
Figure 41:
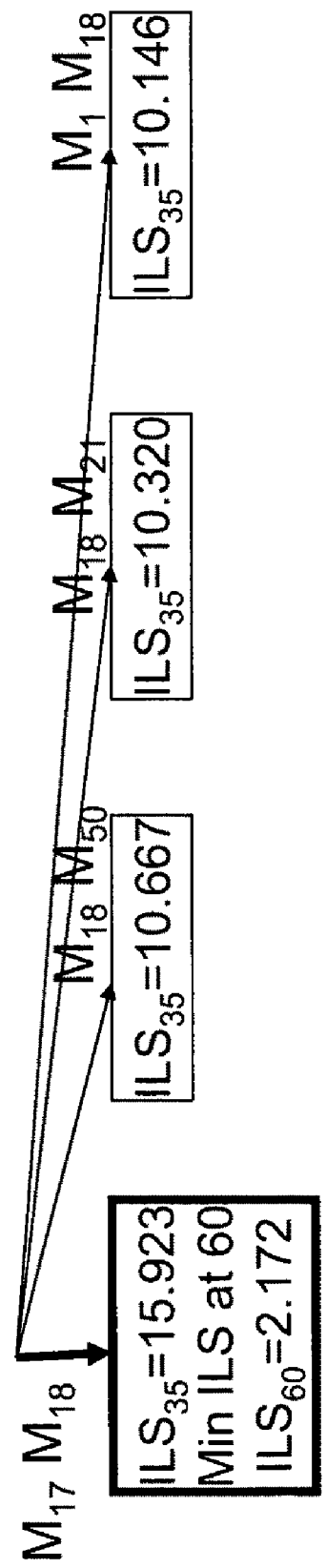

FIG. 41 shows $ILS_{35}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_{17}M_{18}$ is determined to be the highest sum, while the Hessian sums of $M_{18}M_{50}$, $M_{18}M_{21}$, $M_1M_{18}$ are determined to be the second, third, and fourth highest sum, respectively. FIG. 15 shows the target pattern after the color assignments of fragments 602-17 and 602-18 have been changed. $ILS_{min}$ is recalculated (1145 in FIG. 1). FIG. 41 shows that $ILS_{35}$ has improved from 1.415 to 15.923, and that the recalculated $ILS_{min}$ is $ILS_{60}$ and has a value of 2.172. The scaled change in the $ILS_{min}$ value exceeds the threshold (1150 in FIG. 1), i.e.

$$\frac{15.923 - (1.415)}{|1.145|} = 12.671.$$

Figure 42:
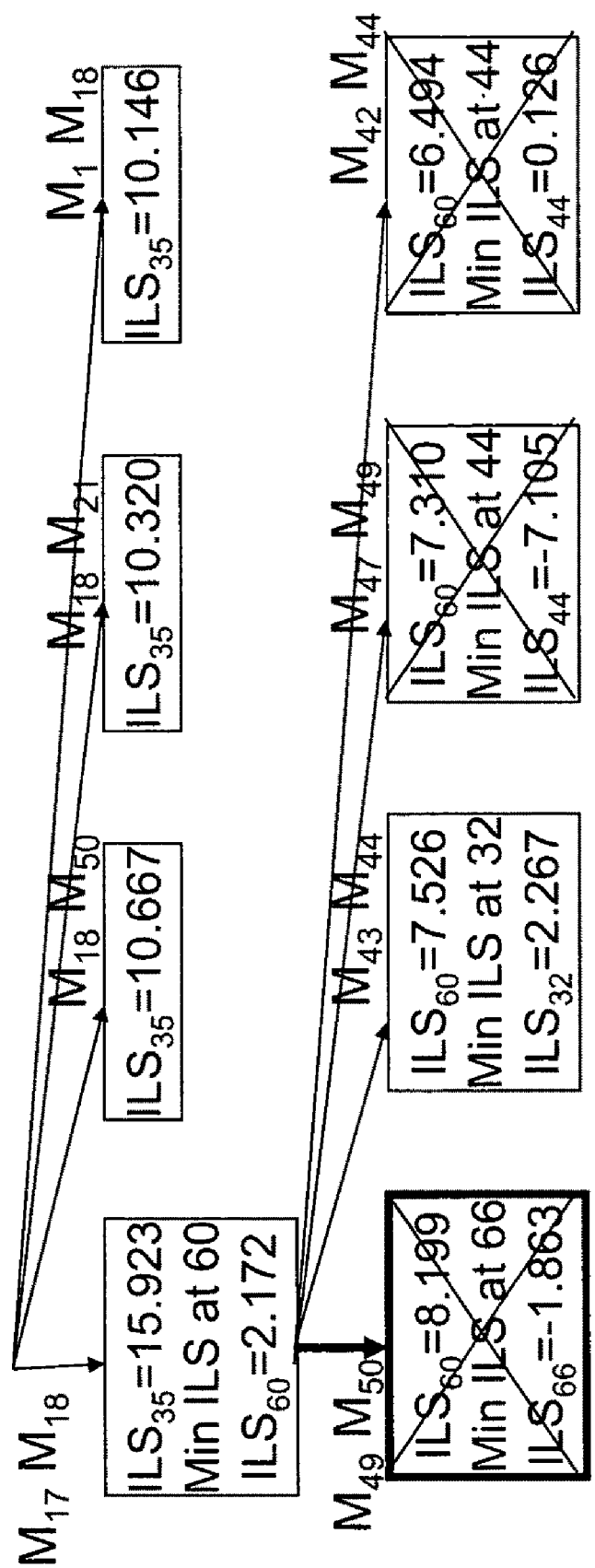

In other words, the optimization improved $ILS_{35}$ and also improved $ILS_{min}$. FIG. 42 shows $ILS_{60}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_{49}M_{50}$ is determined to be the highest sum, while the Hessian sums of $M_{43}M_{44}$, $M_{47}M_{49}$, and $M_{42}M_{44}$ are determined to be the second, third, and fourth highest sums, respectively.

Figure 16:
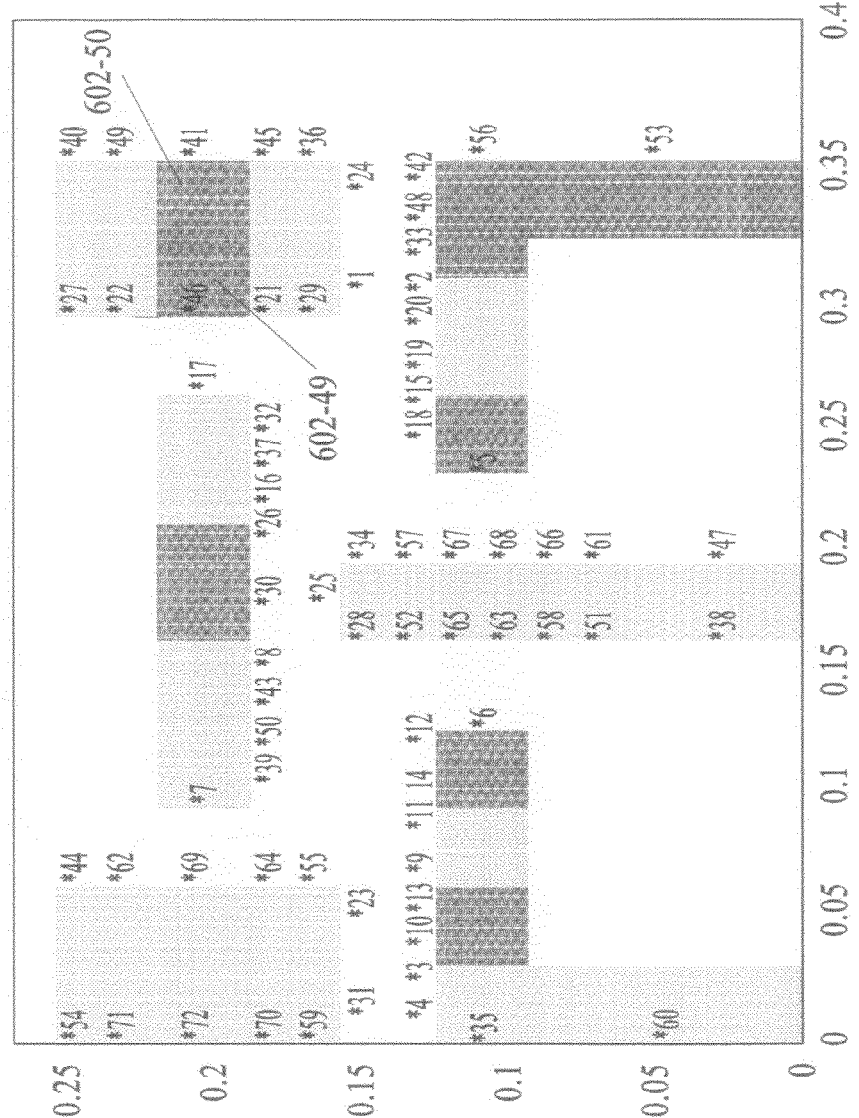

FIG. 16 shows the target pattern after the color assignments of fragments 602-49 and 602-50 have been changed. $ILS_{min}$ is recalculated (1145 in FIG. 1). FIG. 42 shows that $ILS_{60}$ has been improved from 2.172 to 8.199, and that the recalculated $ILS_{min}$ $ILS_{66}$ and has a value of −1.863. However, it is determined that the scaled change in the $ILS_{min}$ value does not exceed the threshold (1150 in FIG. 1), i.e.

$$\frac{-1.863 - (2.172)}{|2.172|} = -1.858.$$

Figure 43:
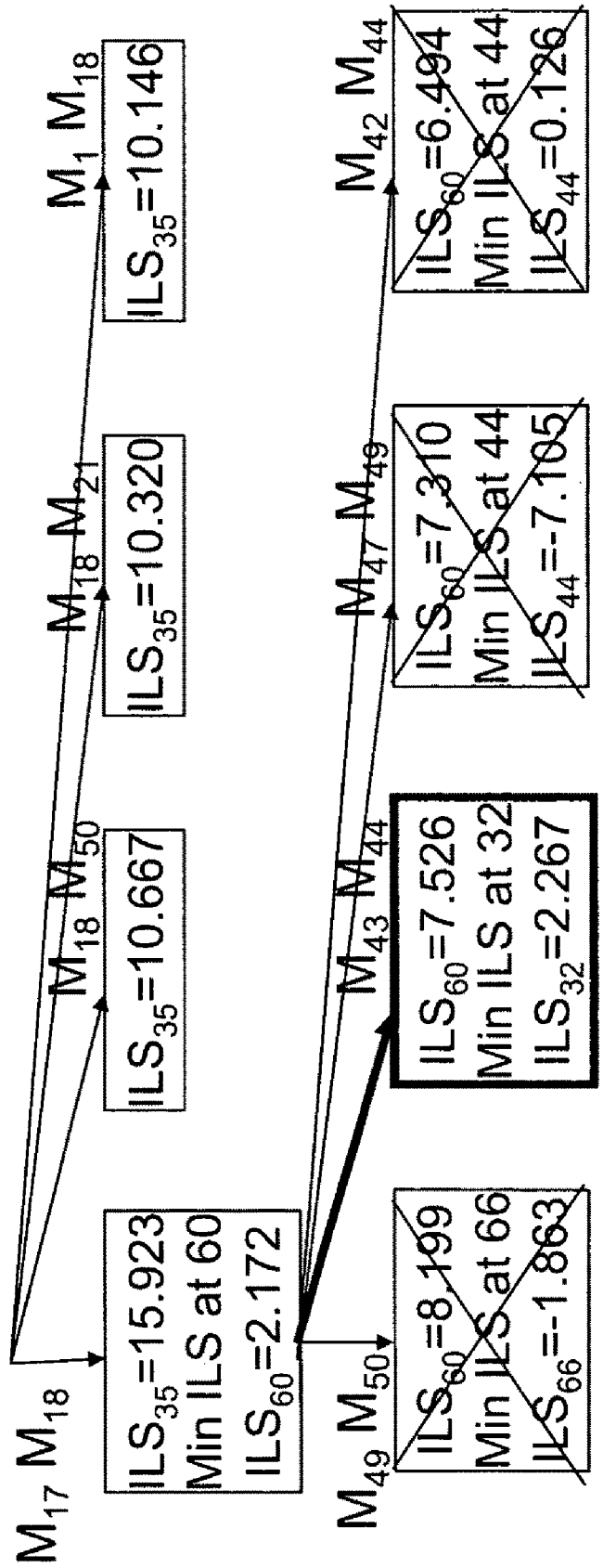

In other words, the optimization improved $ILS_{60}$ but significantly reduced $ILS_{min}$. Therefore, the $M_{49}M_{50}$ branch is terminated (1160 in FIG. 1). Additionally, it is also noted that alternative branches $M_{47}M_{49}$ and $M_{42}M_{44}$ would also be terminated for failing to exceed the threshold. However, a further optimization branch exist, i.e. $M_{43}M_{44}$, and it is determined that convergence has not occurred (1165 in FIG. 1). Accordingly, the next highest sum, i.e. $M_{43}M_{44}$, is selected, as shown in FIG. 43.

Figure 17:
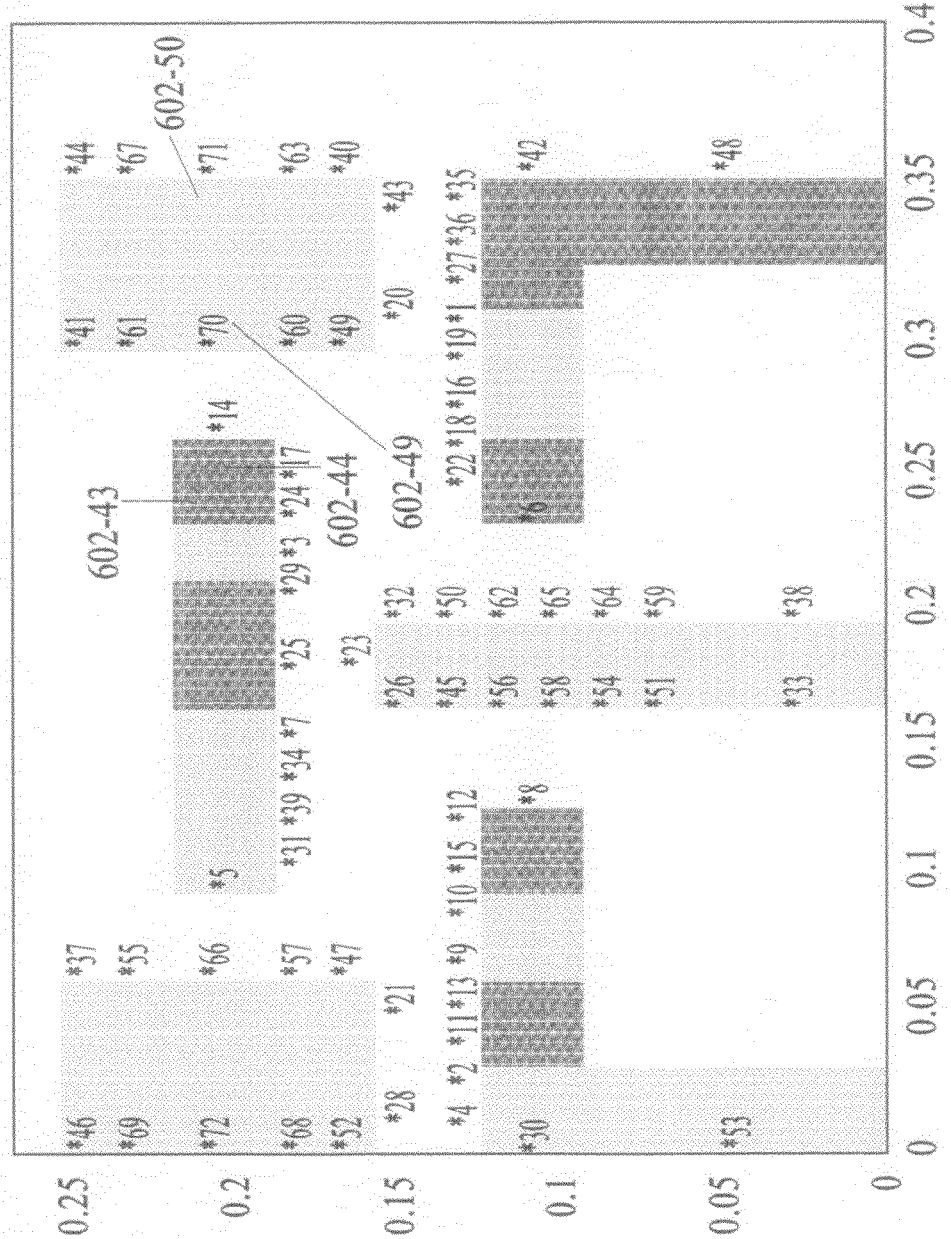

FIG. 17 shows the target pattern after the color assignments of fragments 602-43 and 602-44 have been changed (and the color assignments of fragments 602-49 and 602-50 have been undone). $ILS_{min}$ is recalculated (1145 in FIG. 1). FIG. 43 shows that $ILS_{60}$ has improved from 2.172 to 7.526, and that the recalculated $ILS_{min}$ is $ILS_{32}$ and has a value of 2.267. The scaled change in the $ILS_{min}$ value exceeds the threshold (1150 in FIG. 1), i.e.

$$\frac{2.267 - (2.172)}{|2.172|} = 0.044.$$

In other words, the optimization improved $ILS_{60}$ and also improved $ILS_{min}$.

Figure 18:
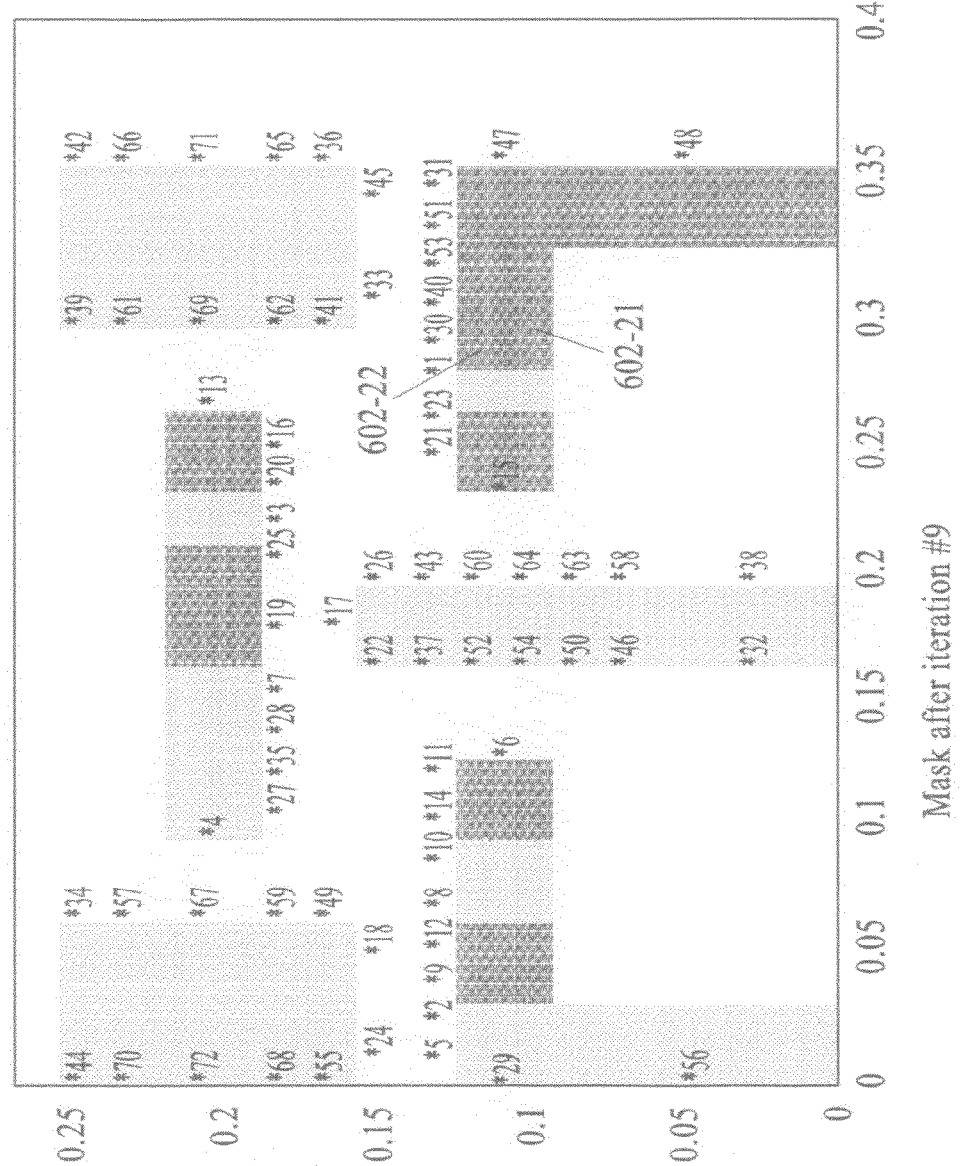
Figure 44:
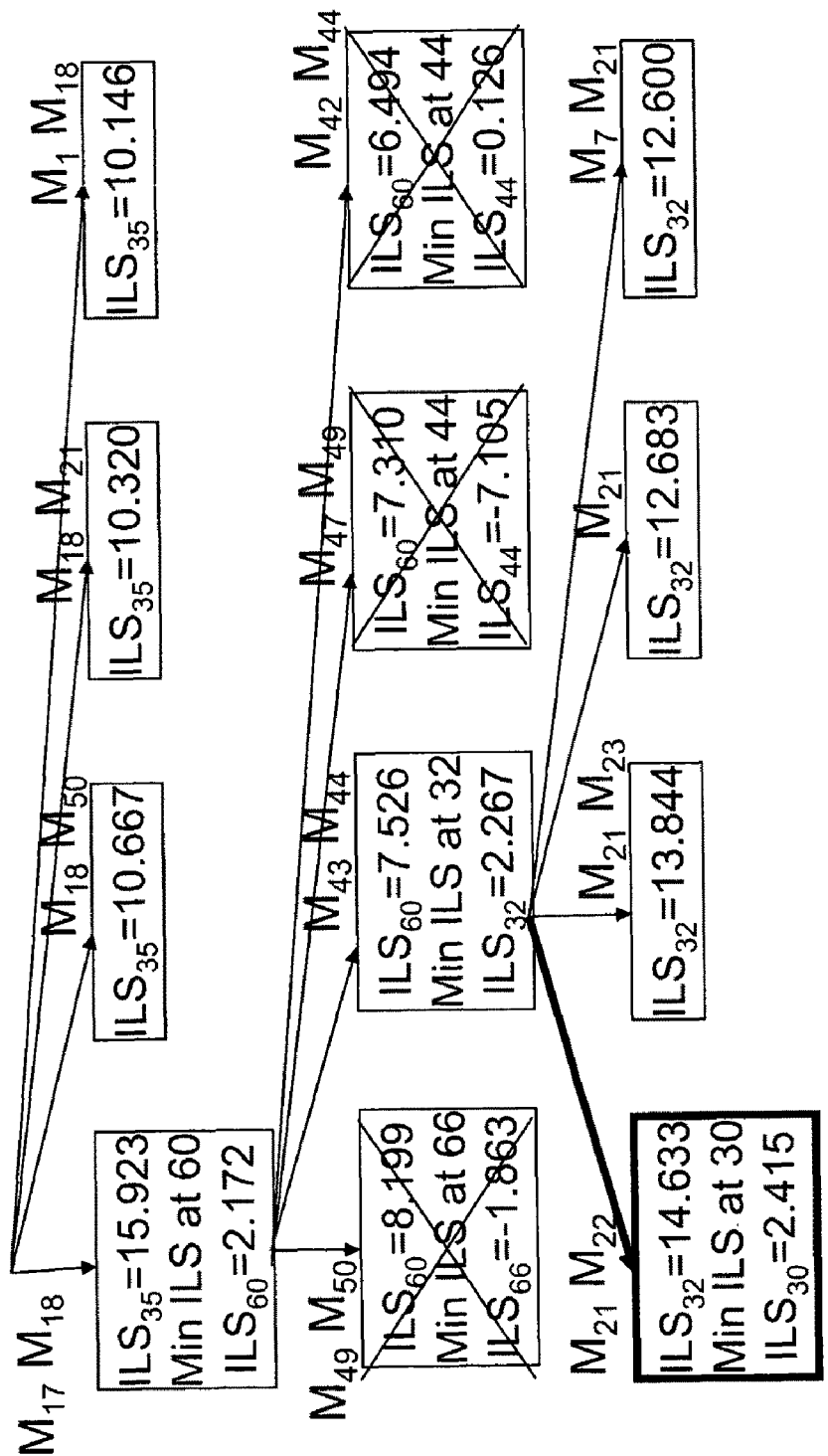

FIG. 44 shows $ILS_{32}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_{21}M_{22}$ is determined to be the highest sum, while the Hessian sum of $M_{21}M_{23}$, the gradient sum of $M_{21}$, and the Hessian sum of $M_7M_{21}$ are determined to be the second, third, and fourth highest sums, respectively. FIG. 18 shows the target pattern after the color assignments of fragments 602-21 and 602-22 have been changed. $ILS_{min}$ is recalculated (1145 in FIG. 1). FIG. 44 shows that $ILS_{32}$ has been improved from 2.267 to 14.633, and that the recalculated $ILS_{min}$ is $ILS_{30}$ and has a value of 2.415. It is determined that the scaled change in the $ILS_{min}$ exceeds the threshold. In other words, the optimization improved $ILS_{32}$ and $ILS_{min}$.

Figure 19:
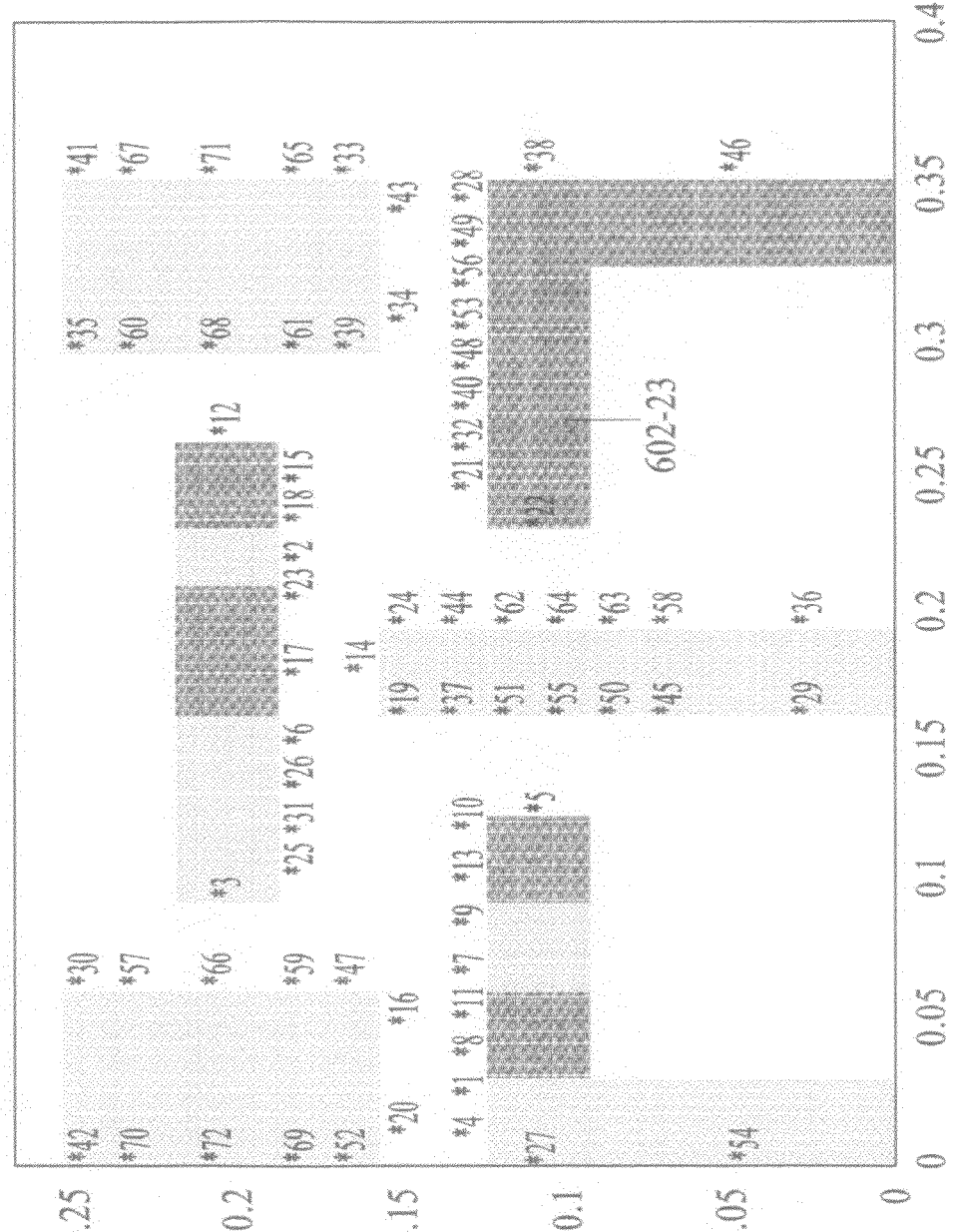
Figure 45:
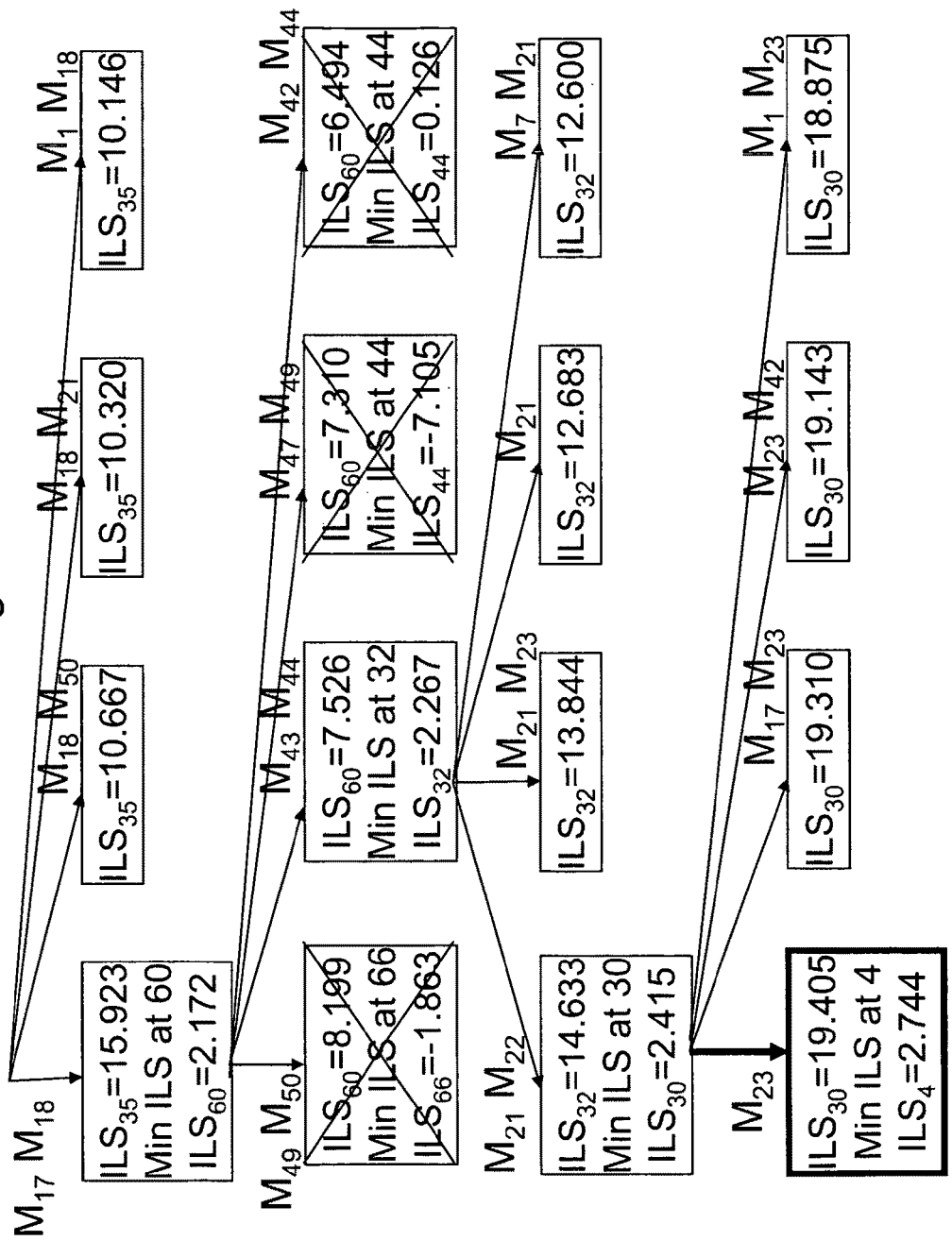

FIG. 45 shows $ILS_{30}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the gradient sum of $M_{23}$ is determined to be the highest sum, while the Hessian sums of $M_{17}M_{23}$, $M_{23}M_{42}$, and $M_1M_{23}$ are determined to be the second, third, and fourth highest sums, respectively. FIG. 19 shows the target pattern after the color assignment of fragment 602-23 has been changed. $ILS_{min}$ is recalculated (1145 in FIG. 1). FIG. 45 shows that $ILS_{30}$ has been improved from 2.415 to 19.405, and that the recalculated $ILS_{min}$ is $ILS_4$ and has a value of 2.744. It is determined that the scaled change in the $ILS_{min}$ exceeds the threshold. In other words, the optimization improved $ILS_{30}$ and $ILS_{min}$.

Figure 20:
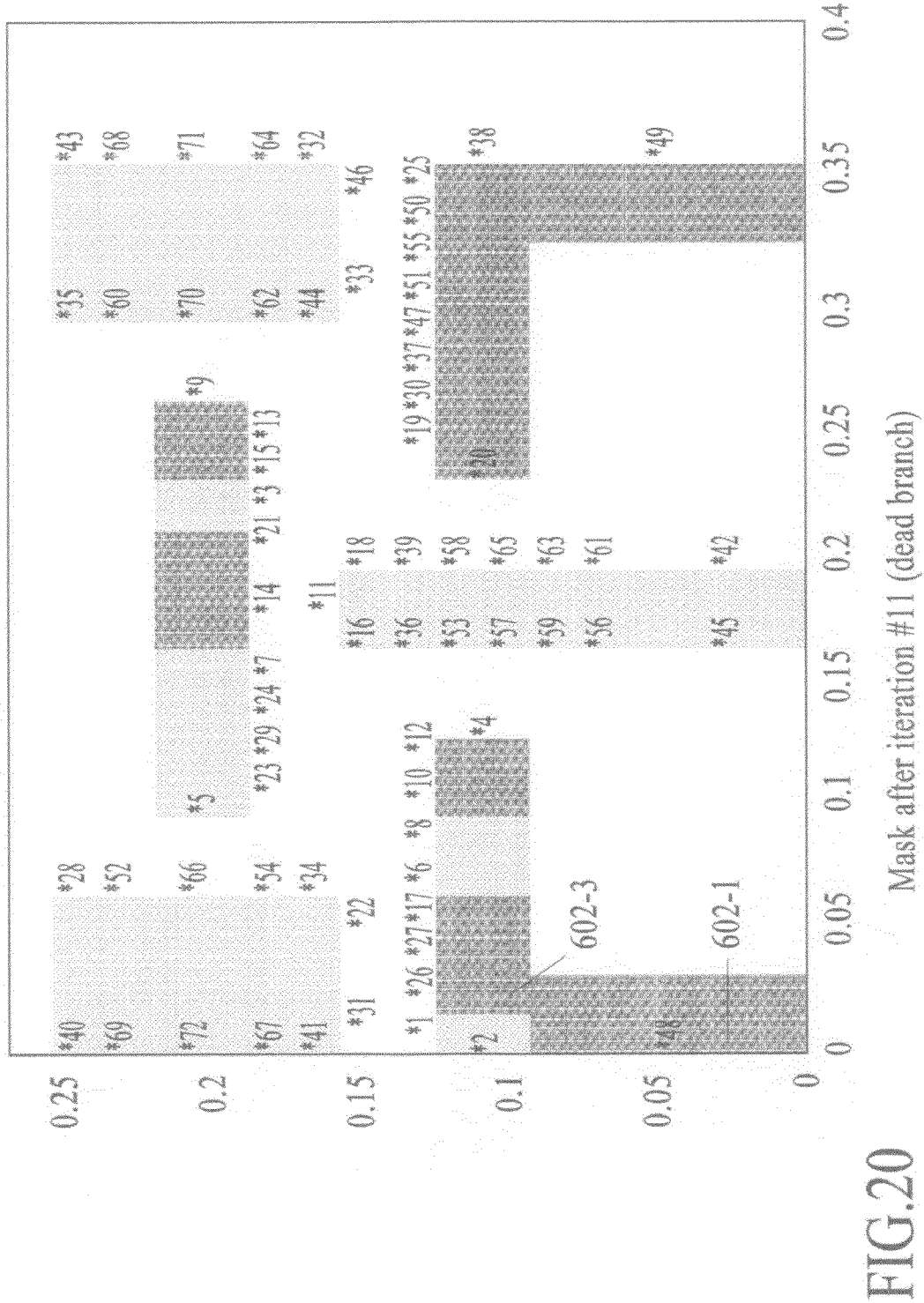
Figure 46:
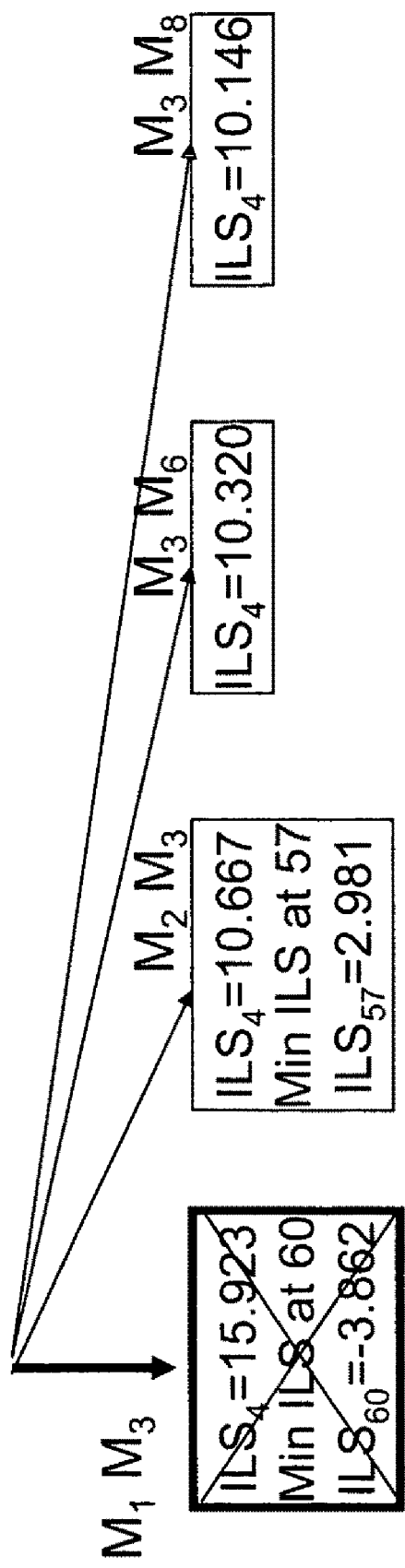

FIG. 46 shows $ILS_4$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_1M_3$ is determined to be the highest sum, while the Hessian sums of $M_2M_3$, $M_3M_6$, and $M_3M_8$ are determined to be the second, third, and fourth highest sums, respectively. FIG. 20 shows the target pattern after the color assignments of fragments 602-1 and 602-3 have been changed. $ILS_{min}$ is recalculated (1145 in FIG. 1). FIG. 46 shows that $ILS_4$ has improved from 2.744 to 15.923, and that the recalculated $ILS_{min}$ is $ILS_{60}$ and has a value of −3.8616. It is determined that the scaled change in the $ILS_{min}$ value does not exceed the threshold. In other words, the optimization has improved $ILS_4$, but $ILS_{60}$ decreases to −3.8616. Therefore, branch $M_1M_3$ branch is terminated (1160 in FIG. 1) since $$\frac{-3.862 - (2.744)}{|2.744|} = -2.407 < -0.1.$$

Figure 21:
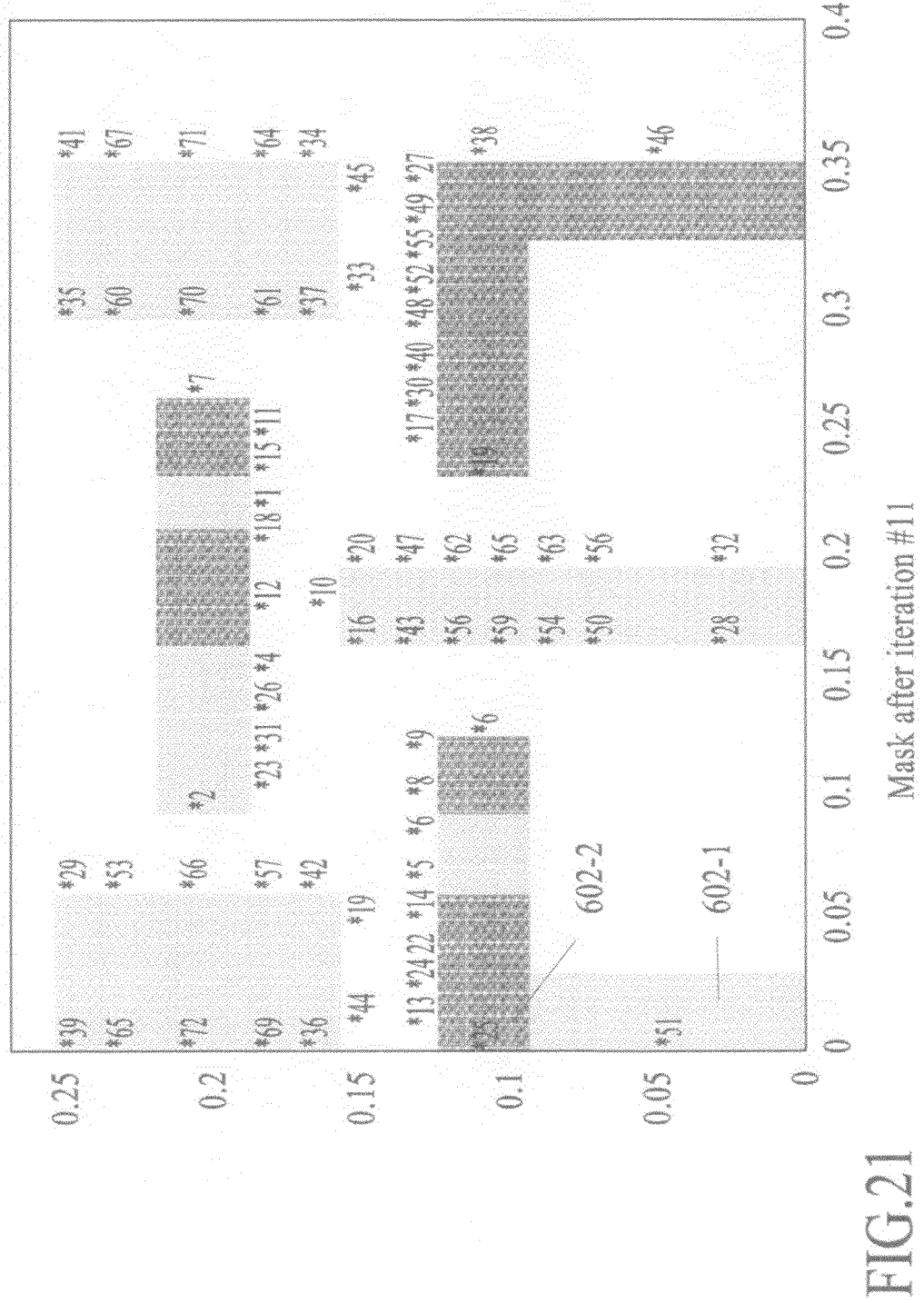
Figure 47:
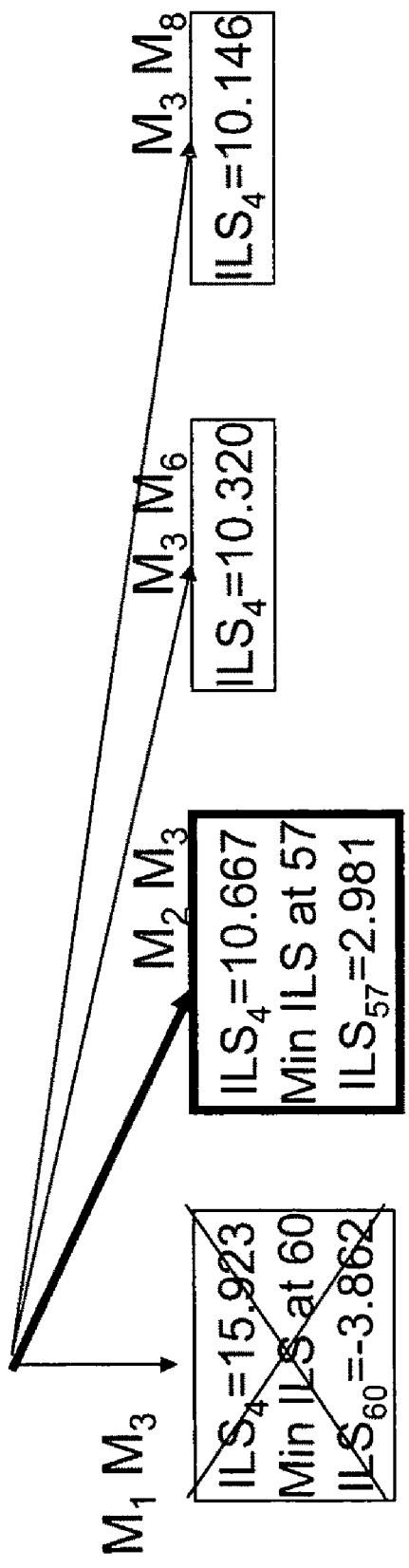

However, further optimization branches exist, e.g. $M_2M_3$, $M_3M_6$, and $M_3M_8$, and so it is determined that convergence has not occurred (1165 in FIG. 1). Accordingly, the next highest sum, i.e. $M_2M_3$, is selected, as shown in FIG. 47. FIG. 21 shows the target pattern after the color assignment of fragment 602-2 has been changed (and the color assignment of fragment 602-1 has been undone). $ILS_{min}$ is recalculated (1145 in FIG. 1). FIG. 47 shows that $ILS_4$ has improved from 2.744 to 10.667, and that the recalculated $ILS_{min}$ is $ILS_{57}$ and has a value of 2.981. The scaled change in the $ILS_{min}$ value exceeds the threshold (1150 in FIG. 1). In other words, the optimization improved $ILS_4$ and $ILS_{min}$.

Figure 22:
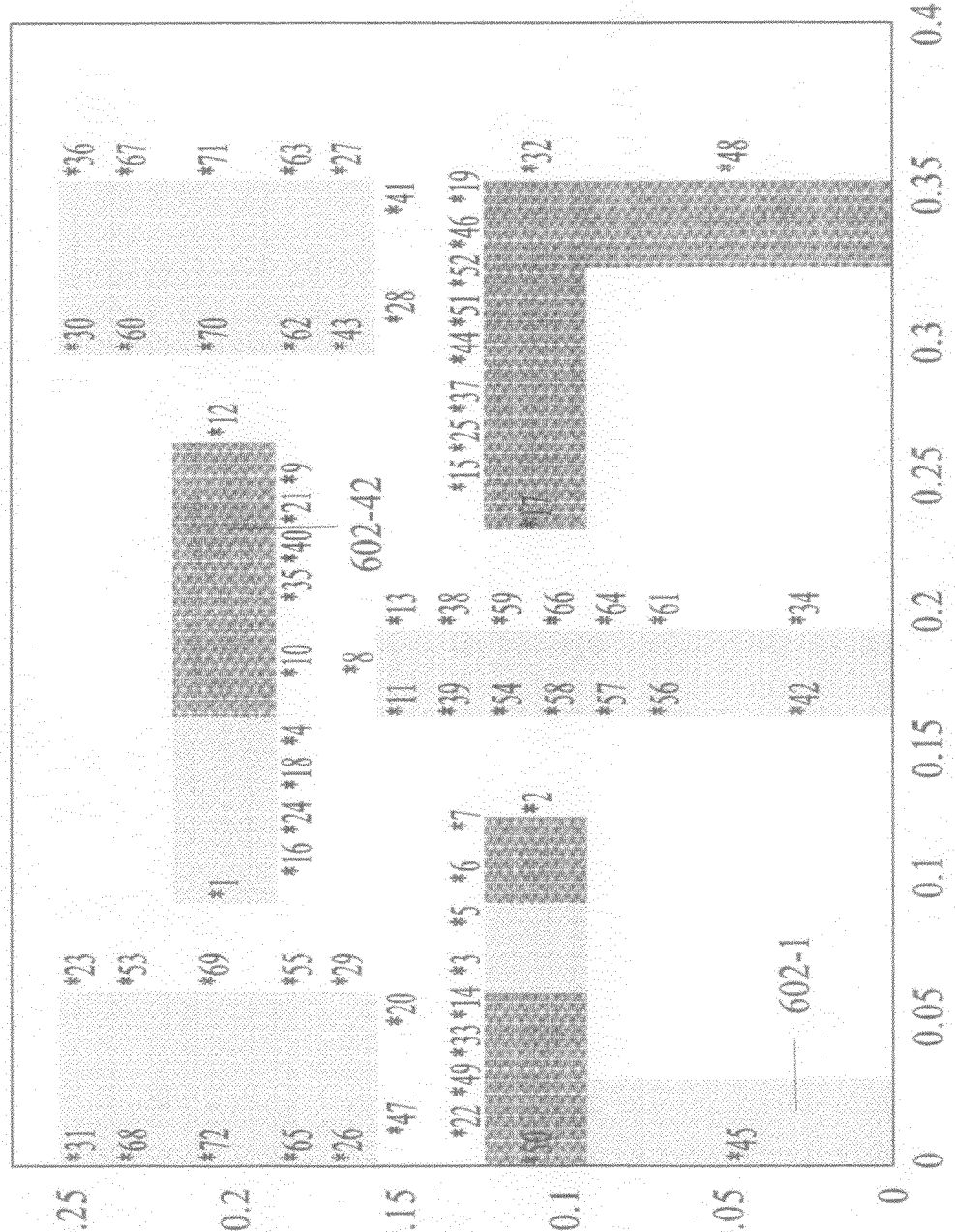
Figure 48:
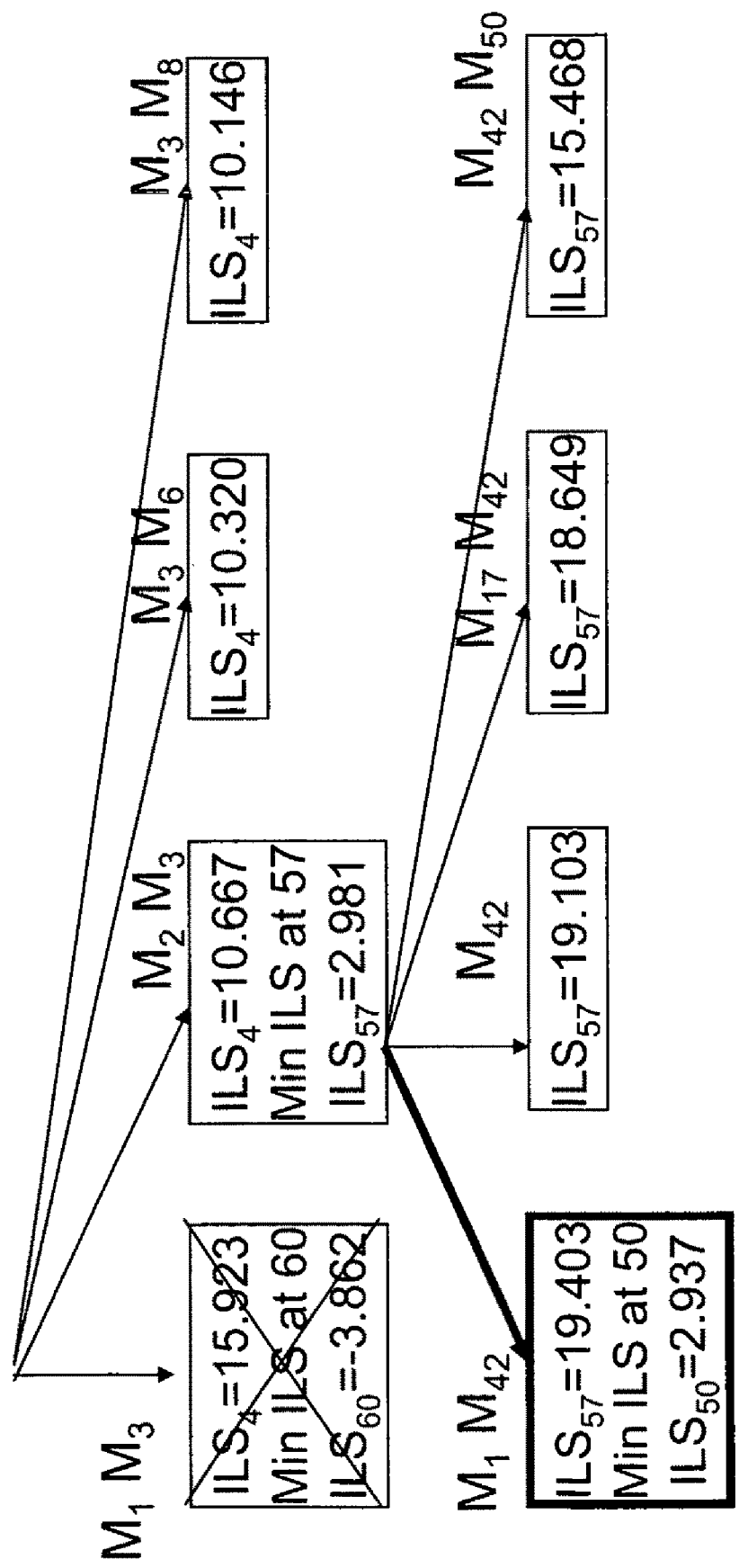

FIG. 48 shows $ILS_{57}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_1M_{42}$ is determined to be the highest sum, while gradient sum of $M_{42}$, and the Hessian sums of $M_{17}M_{42}$ and $M_{42}M_{50}$ are determined to be the second, third, and fourth highest sums, respectively. FIG. 22 shows the target pattern after the color assignments of fragments 602-1 and 602-42 have been changed. $ILS_{min}$ is recalculated (1145 in FIG. 1). FIG. 48 shows that $ILS_{57}$ has been improved from 2.981 to 19.403, and that the recalculated $ILS_{min}$ is $ILS_{50}$ and has a value of 2.937. It is determined that the scaled change in the $ILS_{min}$ exceeds the threshold. In other words, the optimization improved $ILS_{57}$ and $ILS_{min}$.

Figure 49:
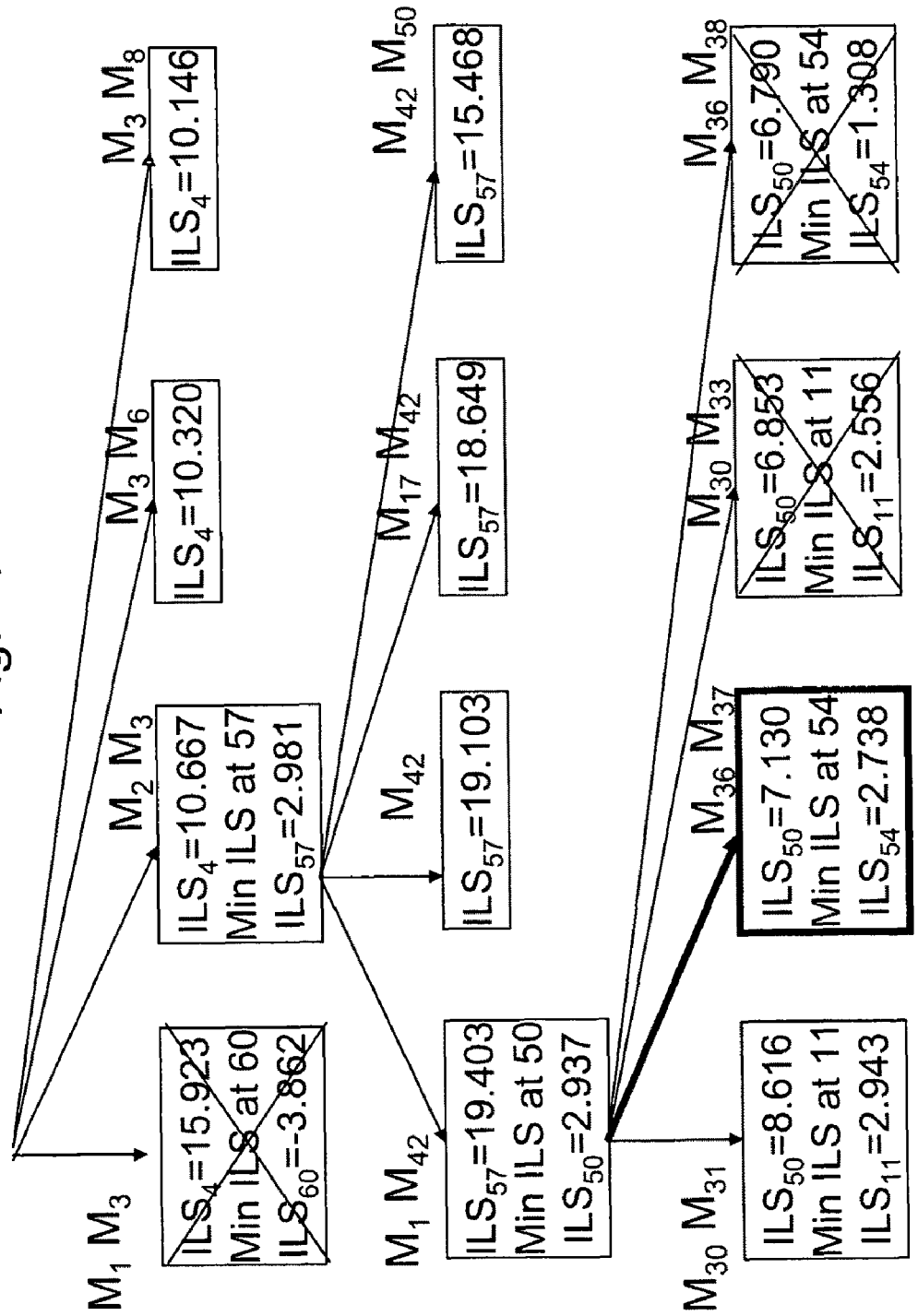

FIG. 49 shows $ILS_{50}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, Hessian sum of $M_{30}M_{31}$ is determined to be the highest sum, while the Hessian sums of $M_{36}M_{37}$, $M_{30}M_{33}$, $M_{36}M_{38}$ are determined to be the second, third, and fourth highest sum, respectively. For the purposes of illustration, it can be seen that branches $M_{30}M_{33}$ and $M_{36}M_{38}$ will not exceed the threshold as required in (1150 in FIG. 1). Consequently, branches $M_{30}M_{33}$ and $M_{36}M_{38}$ would be terminated in the event that they were followed. Additionally, as will be seen shortly, branch $M_{36}M_{37}$ yields a solution quickly, whereas branch $M_{30}M_{31}$ has several alternative branches which must be evaluated. Therefore, for purposes of illustration, branch $M_{36}M_{37}$ will be described before branch $M_{30}M_{31}$.

Figure 23:
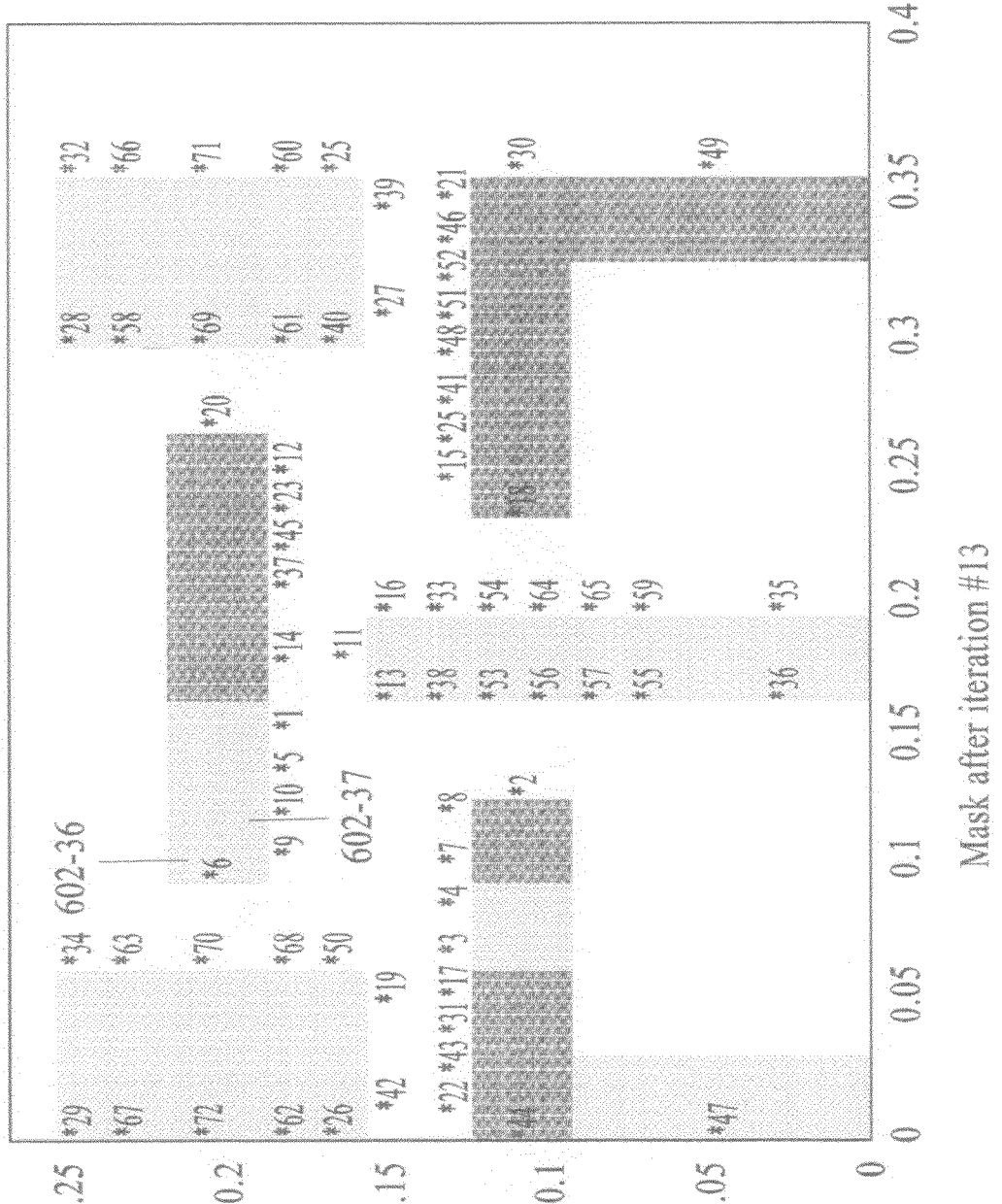

With regard to branch $M_{36}M_{37}$. FIG. 23 shows the target pattern after the color assignments of fragments 602-36 and 602-37 have been changed. $ILS_{min}$ is recalculated (1145 in FIG. 1). FIG. 49 shows that $ILS_{50}$ has been improved from 2.937 to 7.130, and that the recalculated $ILS_{min}$ is $ILS_{54}$ and has a value of 2.738. It is determined that the scaled change in the $ILS_{min}$ exceeds the threshold. In other words, the optimization improved $ILS_{50}$ and $ILS_{min}$.

Figure 50:
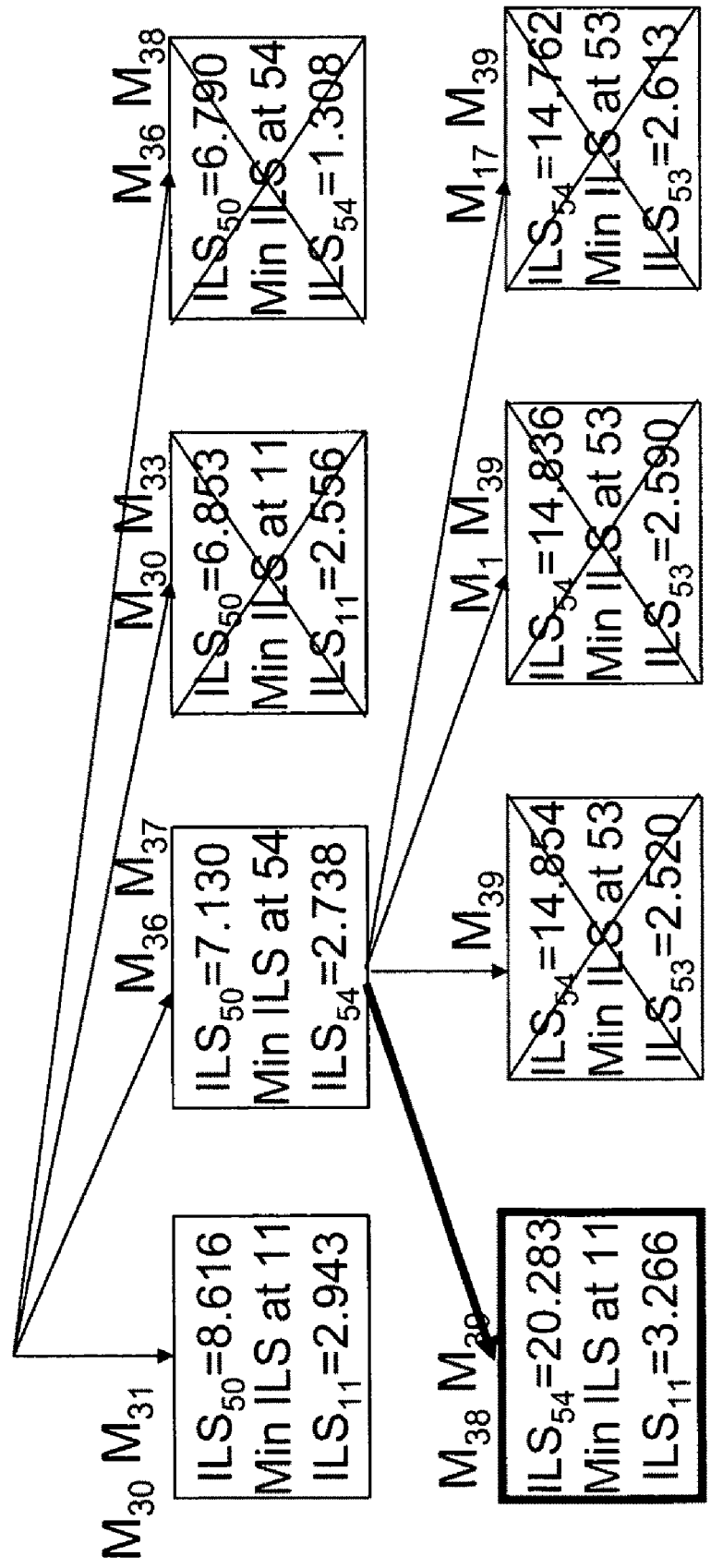

FIG. 50 shows $ILS_{54}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_{38}M_{39}$ is determined to be the highest sum, while the gradient sum of $M_{39}$, and the Hessian sums of $M_1M_{39}$ and $M_{17}M_{39}$ are determined to be the second, third, and fourth highest sums, respectively. For the purposes of illustration, it can be seen that branches $M_{39}$, $M_1M_{39}$, and $M_{17}M_{39}$ will not exceed the threshold as required in (1150 in FIG. 1). Consequently, branches $M_{39}$, $M_1M_{39}$, and $M_{17}M_{39}$ would be terminated in the event that they were followed.

Figure 24:
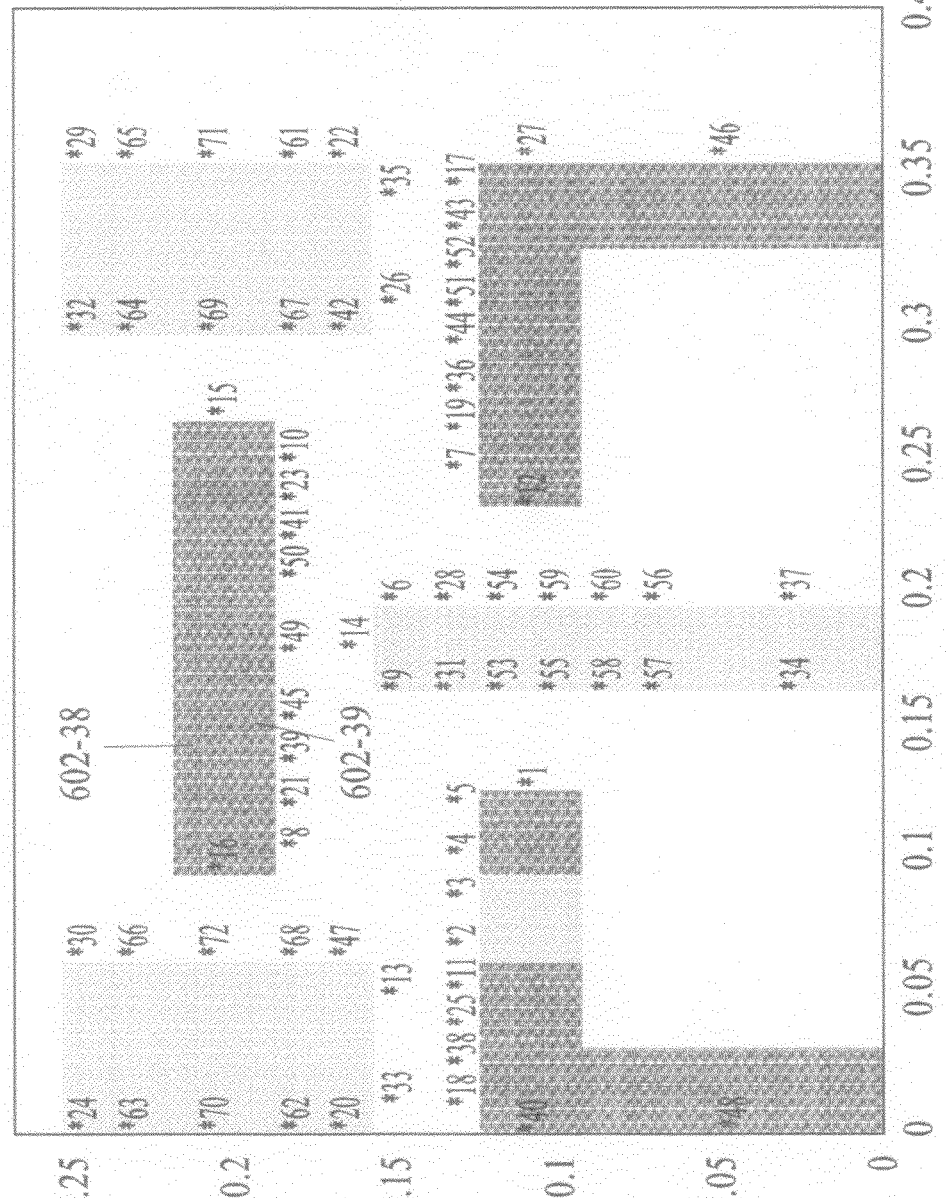

FIG. 24 shows the target pattern after the color assignments of fragments 602-38 and 602-39 have been changed. $ILS_{min}$ is recalculated (1145 in FIG. 1). FIG. 50 shows that the recalculated $ILS_{min}$ is $ILS_{11}$ and has a value of 3.266. It is determined that the scaled change in the $ILS_{min}$ value exceeds the threshold value (1150 in FIG. 1).

Figure 25:
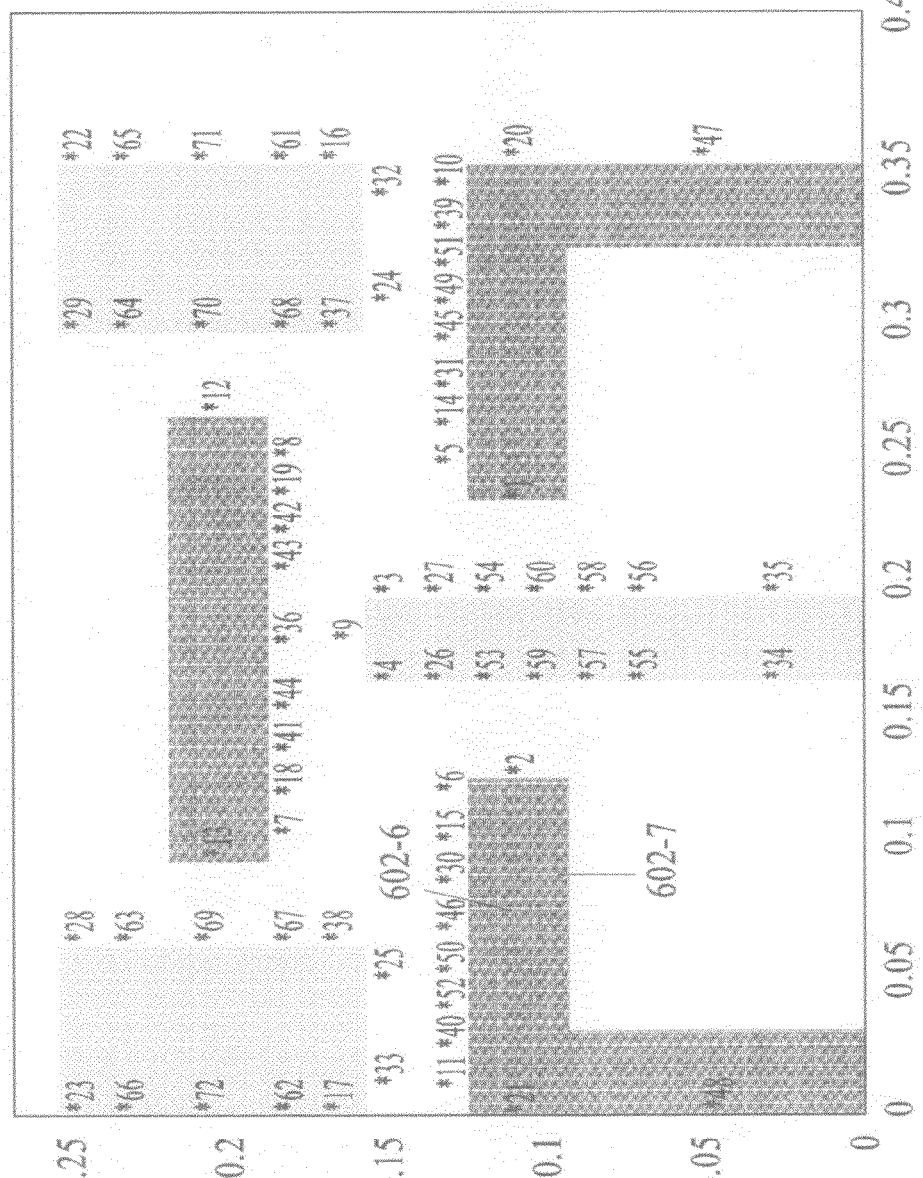
Figure 26:
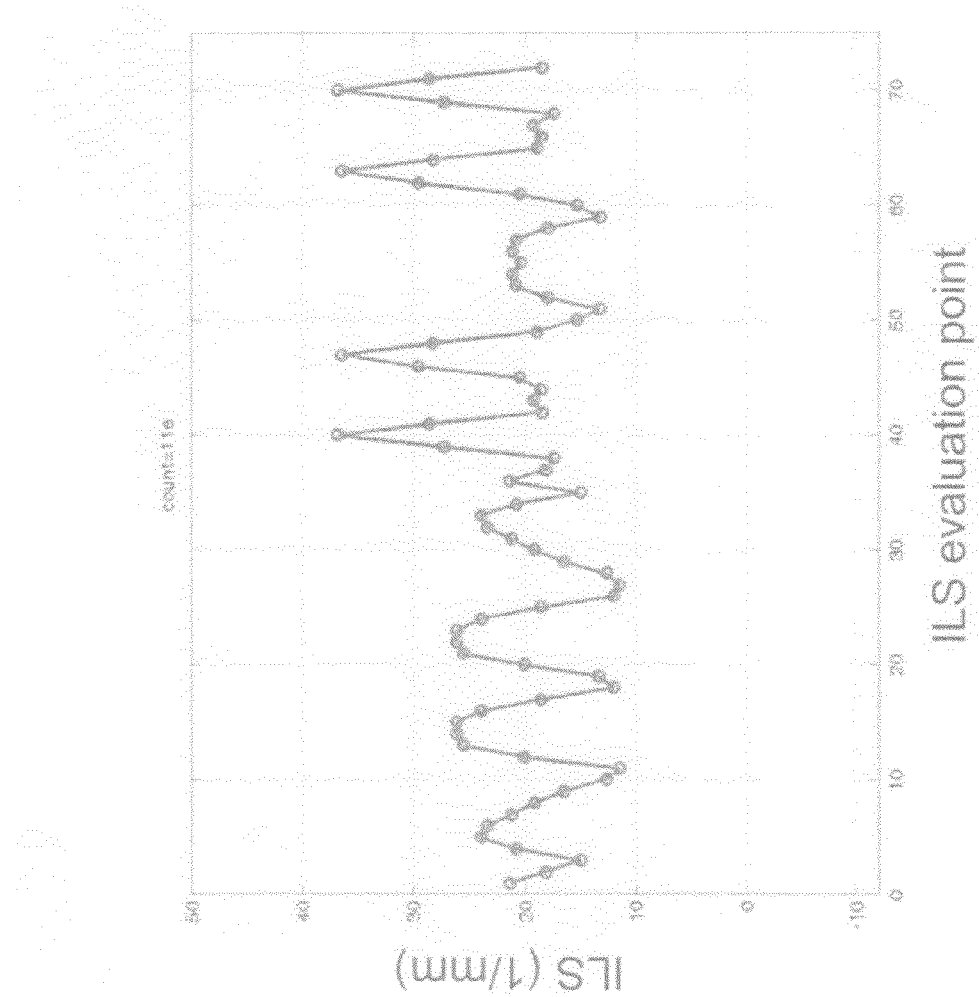
FIGS. 26 and 28 show $ILS_i$ values after respective iterations of the coloring process.
Figure 51:
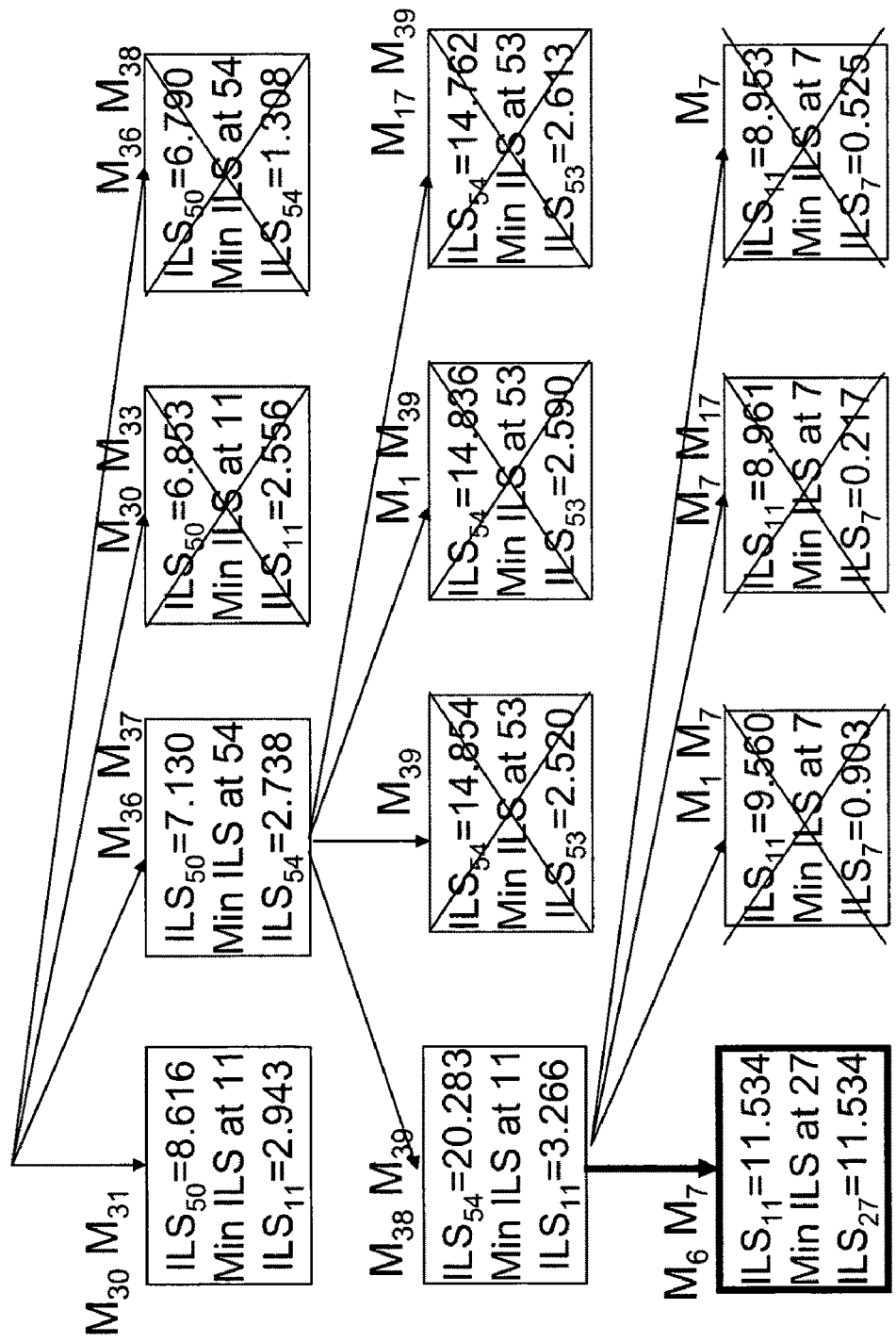

FIG. 51 shows $ILS_{11}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_6M_7$ is determined to be the greatest sum, while the Hessian sums of $M_1M_7$ and $M_7M_{17}$, and the gradient sum of $M_7$ are determined to be the second, third, and fourth highest sums, respectively. It can be seen that branches $M_1M_7$, $M_7M_{17}$, and $M_7$ will not exceed the threshold as required in (1150 in FIG. 1). FIG. 25 shows the target pattern after the color assignments of fragments 602-6 and 602-7 have been changed. $ILS_{11}$ has improved from 3.266 to 11.534. $ILS_{min}$ is recalculated (1145 in FIG. 1). FIG. 51 shows that the recalculated $ILS_{min}$ is $ILS_{27}$ and has a value of 11.534. It is determined that the scaled change in the $ILS_{min}$ value exceeds the threshold value (1150 in FIG. 1). FIG. 26 shows the ILS values following this iteration.

Figure 27:
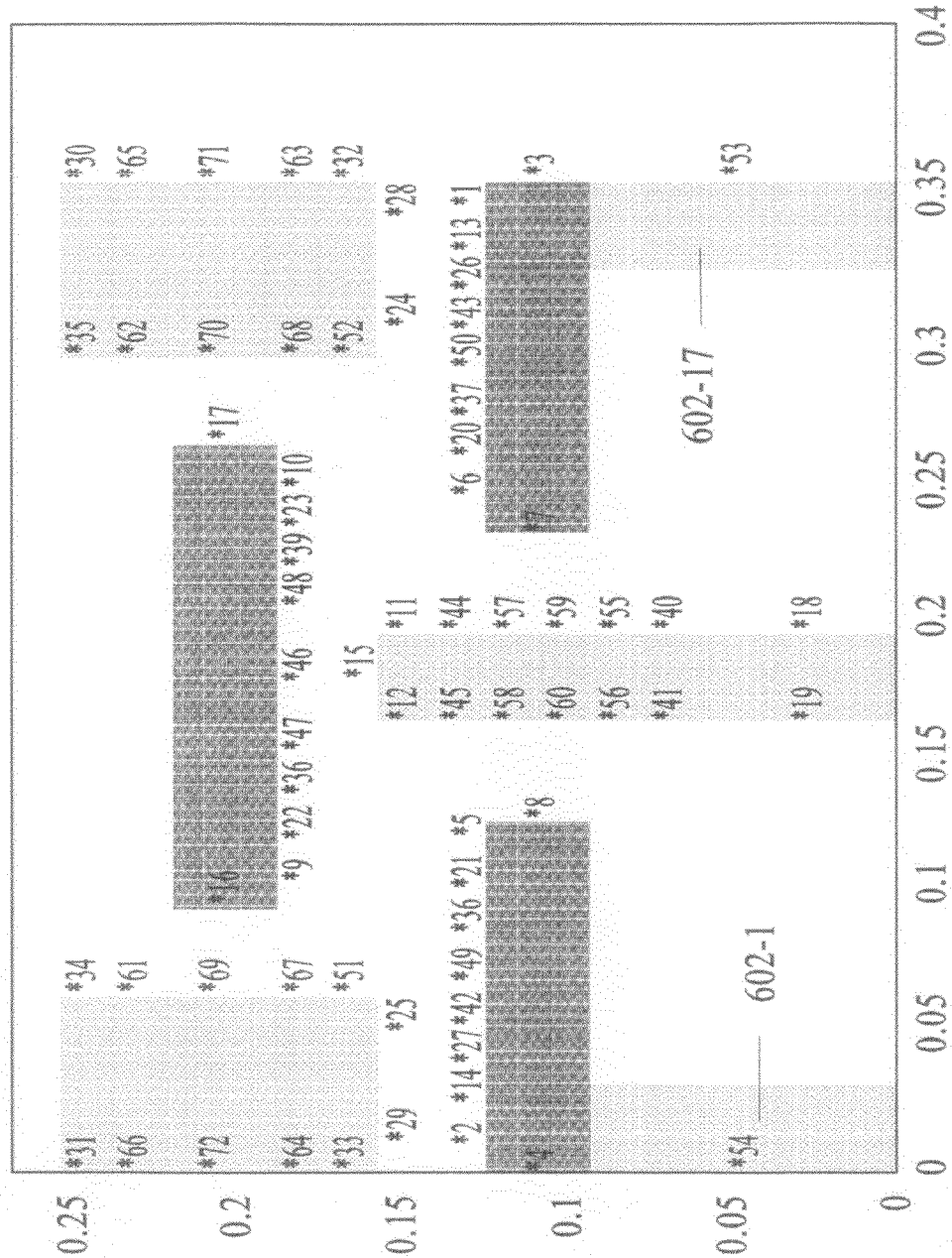
Figure 28:
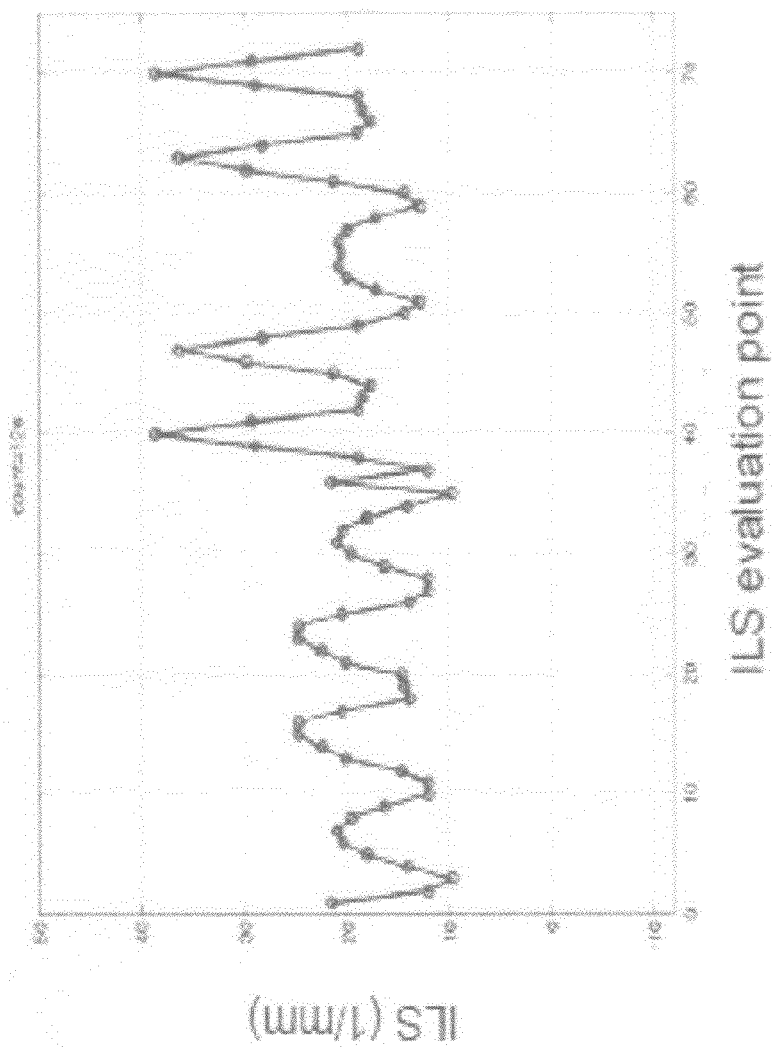
Figure 52:
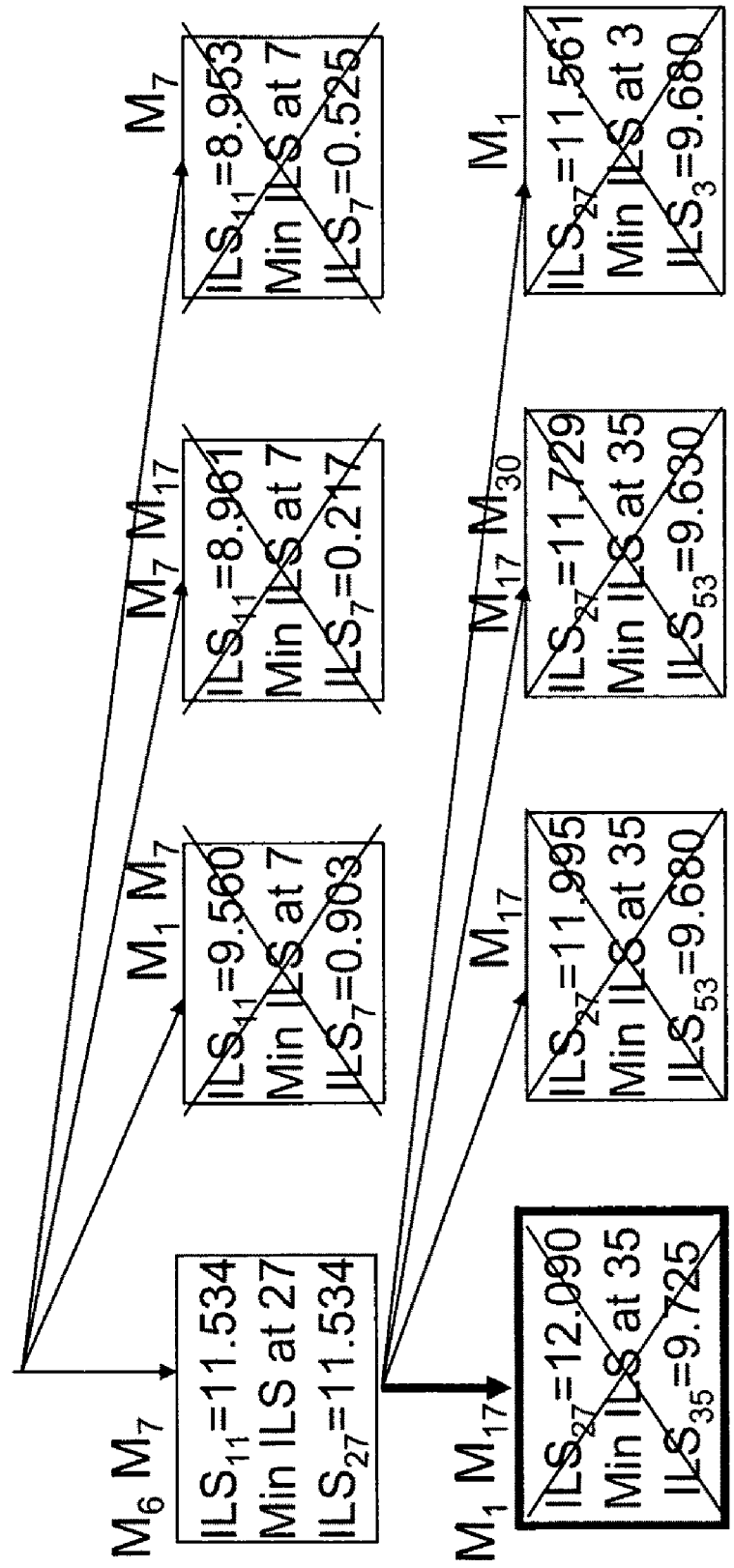

FIG. 52 shows $ILS_{27}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sum of $M_1M_{17}$ is determined to be the greatest sum, while the gradient sum $M_{17}$, the Hessian sum of $M_{17}M_{30}$, and the gradient sum of $M_1$ are determined to be the second, third, and fourth highest sums, respectively. FIG. 27 shows the target pattern after the color assignments of fragments 602-1 and 602-17 have been changed. However, none of the branches, i.e. $M_1M_{17}$, $M_{17}$, $M_{17}M_{30}$, or $M_1$, result in an $ILS_{min}$ which exceeds the threshold (1150 in FIG. 1). Accordingly, optimization of the $M_{36}M_{37}$ (see FIG. 49) branch stops after the change in color assignment of $M_6M_7$, and yields a solution which is at least a local maximum of $ILS_{min}$. FIG. 28 shows the ILS values following this iteration.

Figure 29:
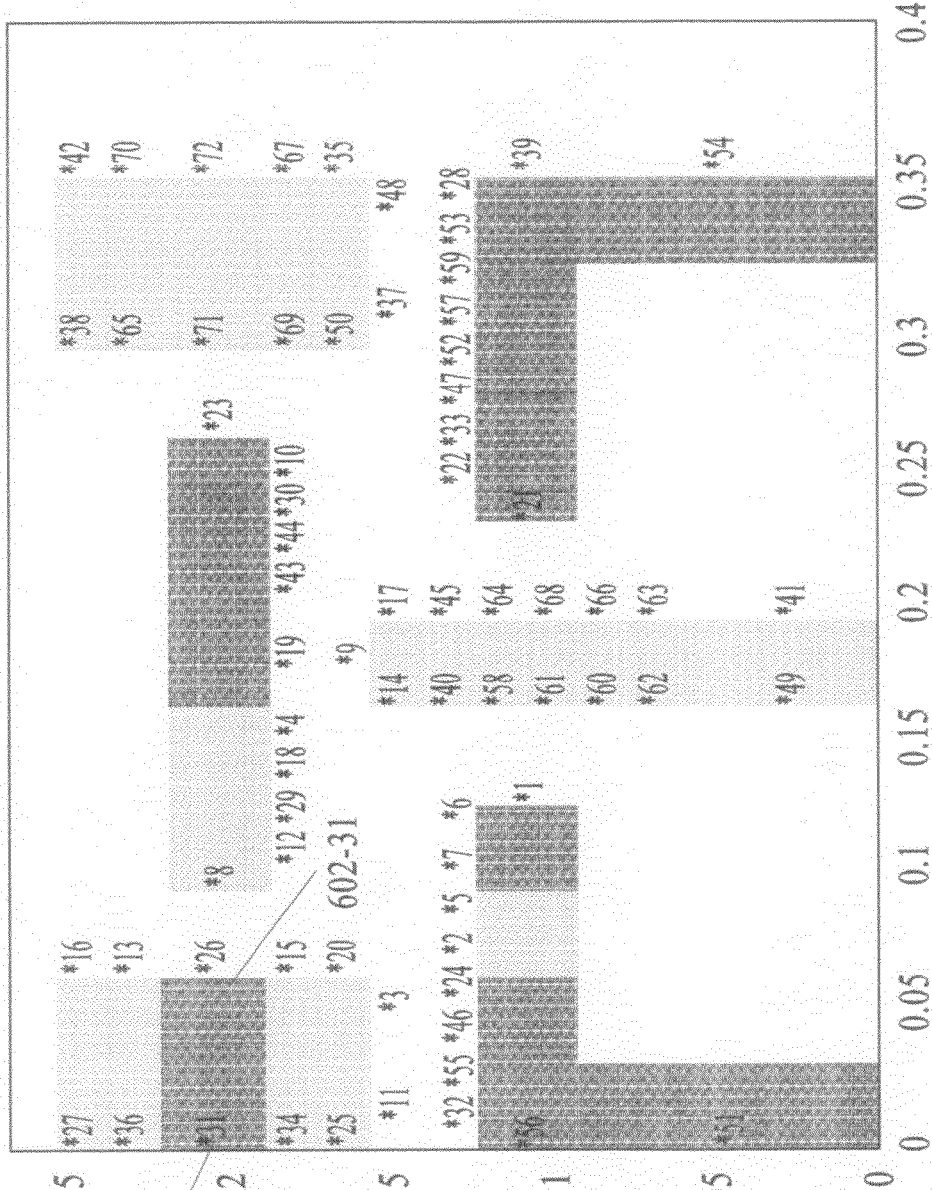
Figure 53:
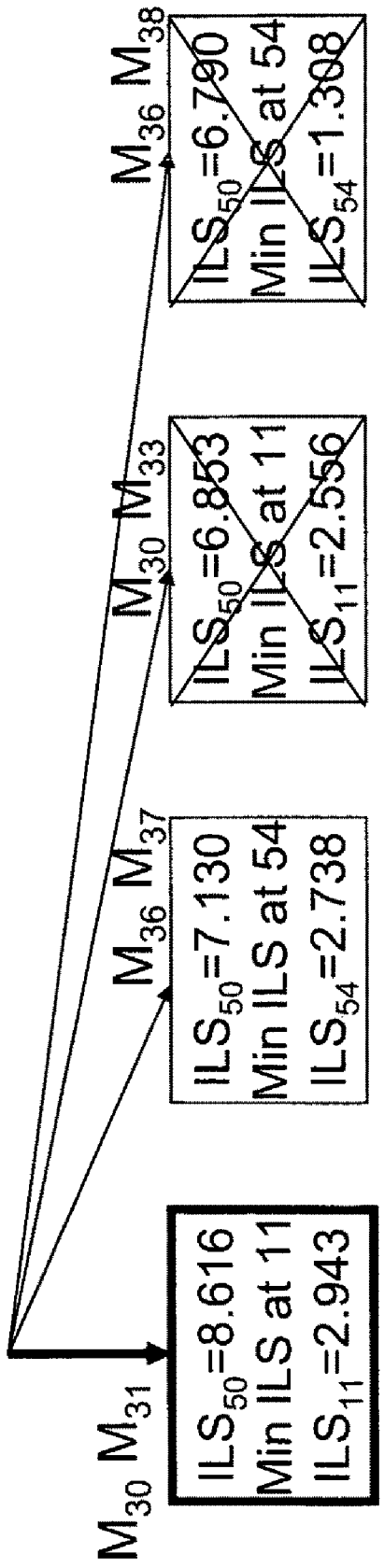
Figure 54:
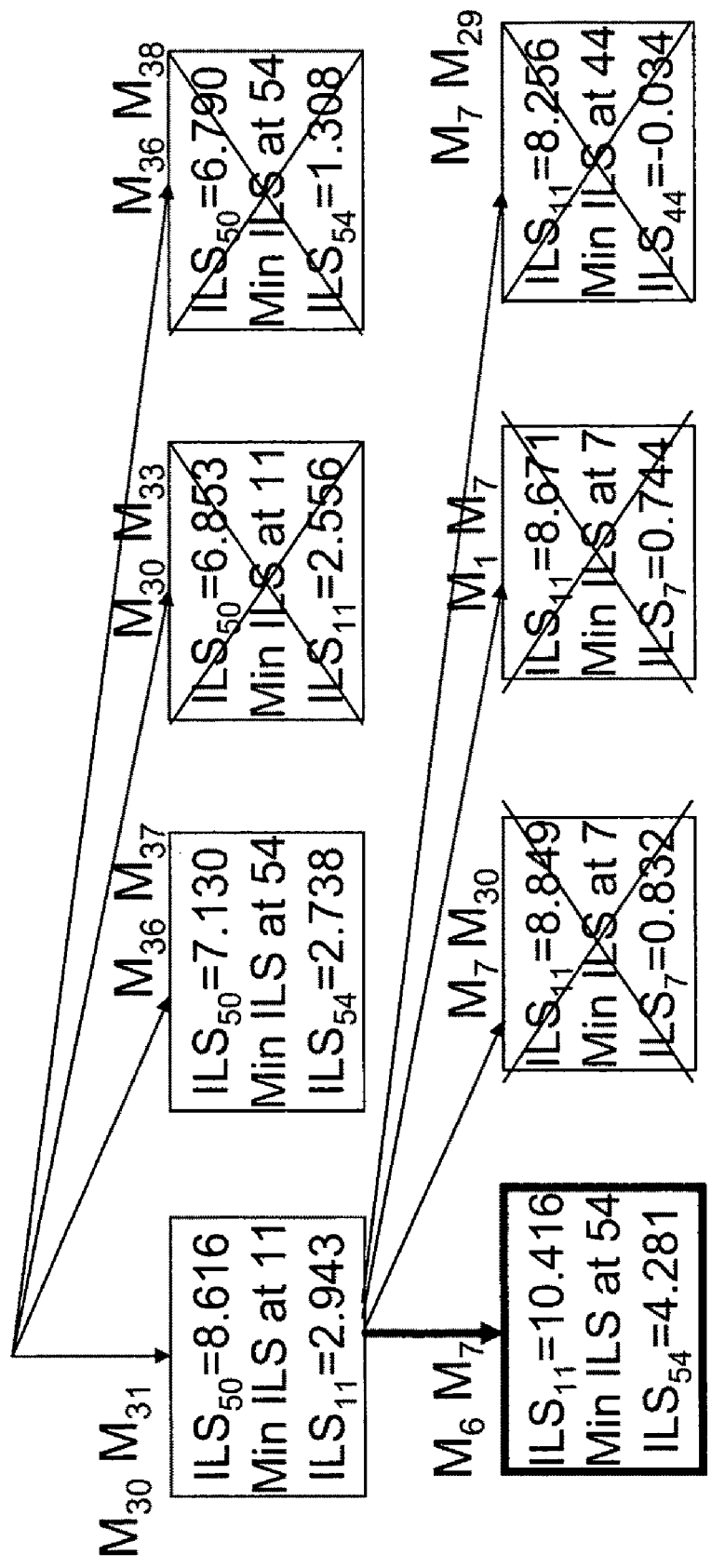

FIG. 53 shows the optimization of the alternative branch $M_{30}M_{31}$ (see FIG. 49). Branch $M_{30}M_{31}$ is followed in order to determine if branch $M_{36}M_{37}$ is a global maximum, or merely a local maximum, of $ILS_{min}$. FIG. 29 shows the target pattern after the color assignments of fragments 602-30 and 602-31 have been changed. $ILS_{50}$ has improved from 2.937 to 8.616. $ILS_{min}$ is recalculated (1145 in FIG. 1). FIG. 54 shows that the recalculated $ILS_{min}$ is $ILS_{11}$ and has a value of 2.943. It is determined that the scaled change in the $ILS_{min}$ value exceeds the threshold value (1150 in FIG. 1).

Figure 30:
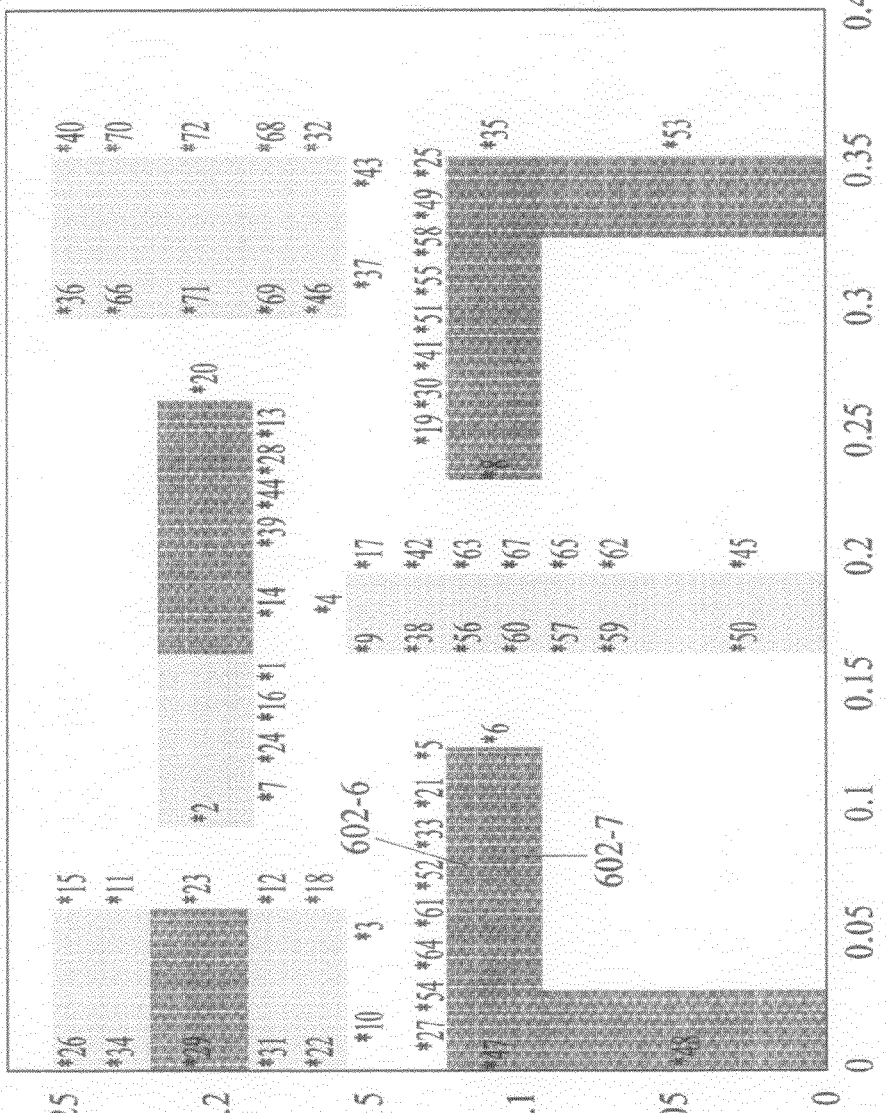

FIG. 54 shows $ILS_{11}$ selected for optimization (1125 in FIG. 1). In this case, the Hessian sum of $M_6M_7$ is determined to be the greatest sum, while the Hessian sums of $M_7M_{30}$, $M_1M_7$, and $M_7M_{29}$ are determined to be the second, third, and fourth highest sums, respectively. For the purposes of illustration, it can be seen that branches $M_7M_{30}$, $M_1M_7$, and $M_7M_{29}$ will not exceed the threshold as required in (1150 in FIG. 1). Consequently, branches $M_7M_{30}$, $M_1M_7$ and $M_7M_{29}$ would be terminated in the event that they were followed. FIG. 30 shows the target pattern after the color assignments of fragments 6 and 7 have been changed. $ILS_{11}$ has improved from 2.943 to 10.416. $ILS_{min}$ is recalculated (1145 in FIG. 1). FIG. 54 shows that the recalculated $ILS_{min}$ is $ILS_{54}$ and has a value of 4.281. It is determined that the scaled change in the $ILS_{min}$ value exceeds the threshold value (1150 in FIG. 1).

Figure 31:
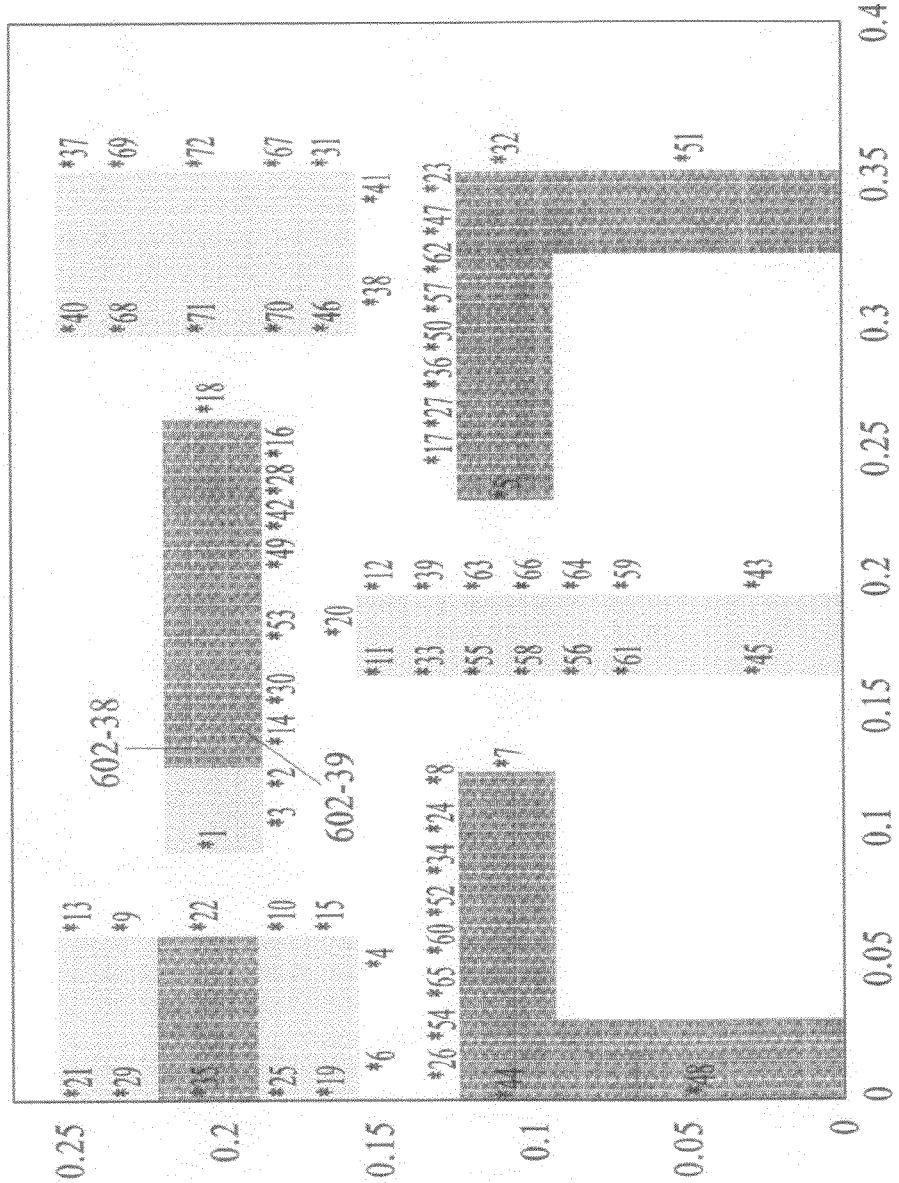
Figure 55:
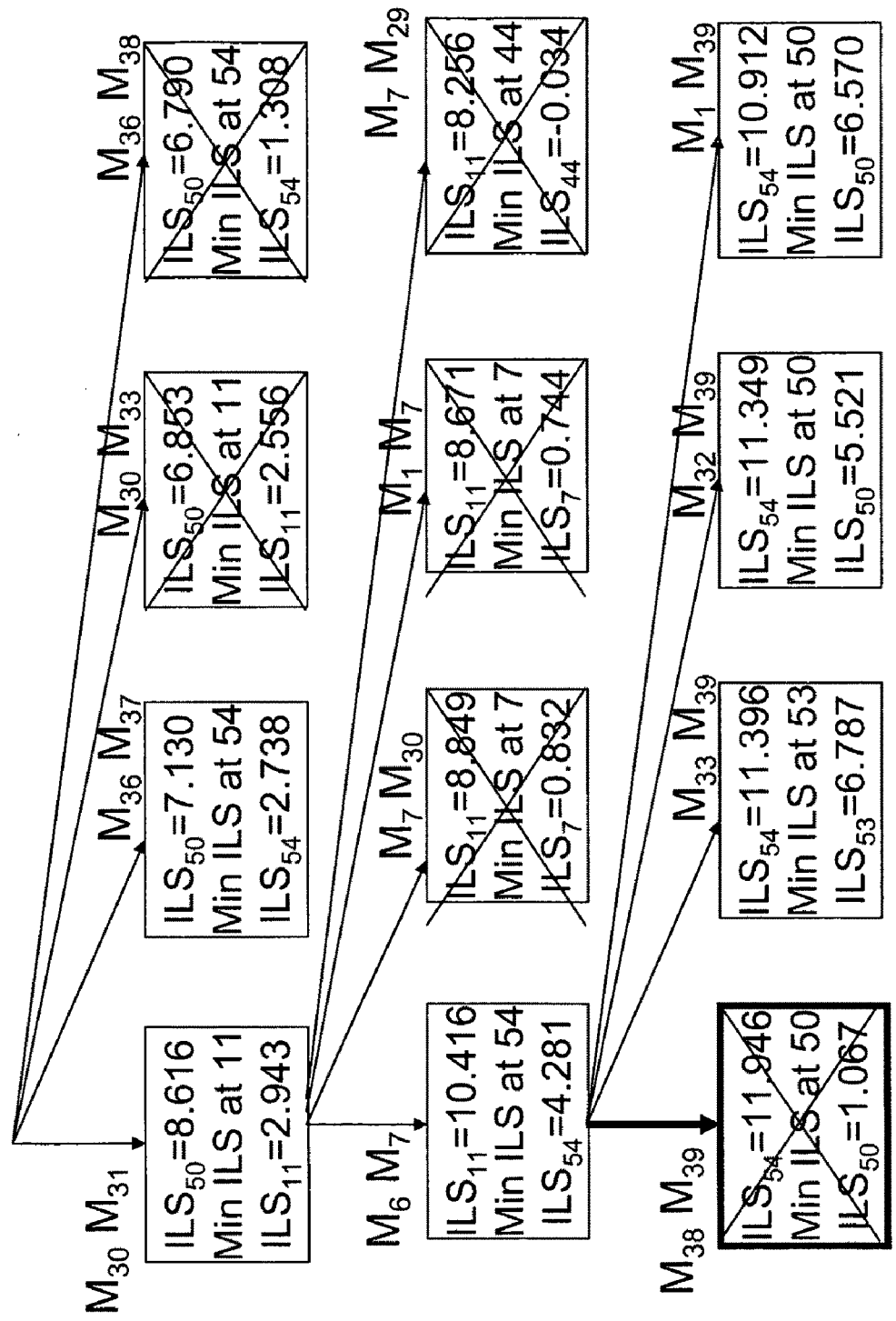

FIG. 55 shows $ILS_{54}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sums of $M_{38}M_{39}$, $M_{33}M_{39}$, $M_{32}M_{39}$, and $M_1M_{39}$ are determined to be the first, second, third, and fourth highest sums, respectively. FIG. 31 shows the target pattern after the color assignments of fragments 38 and 39 have been changed. However, it is determined that $M_{38}M_{39}$ does not exceed the threshold (1150 in FIG. 1), leaving the other three branches, i.e. $M_{33}M_{39}$, $M_{32}M_{39}$, and $M_1M_{39}$, to be evaluated.

Figure 32:
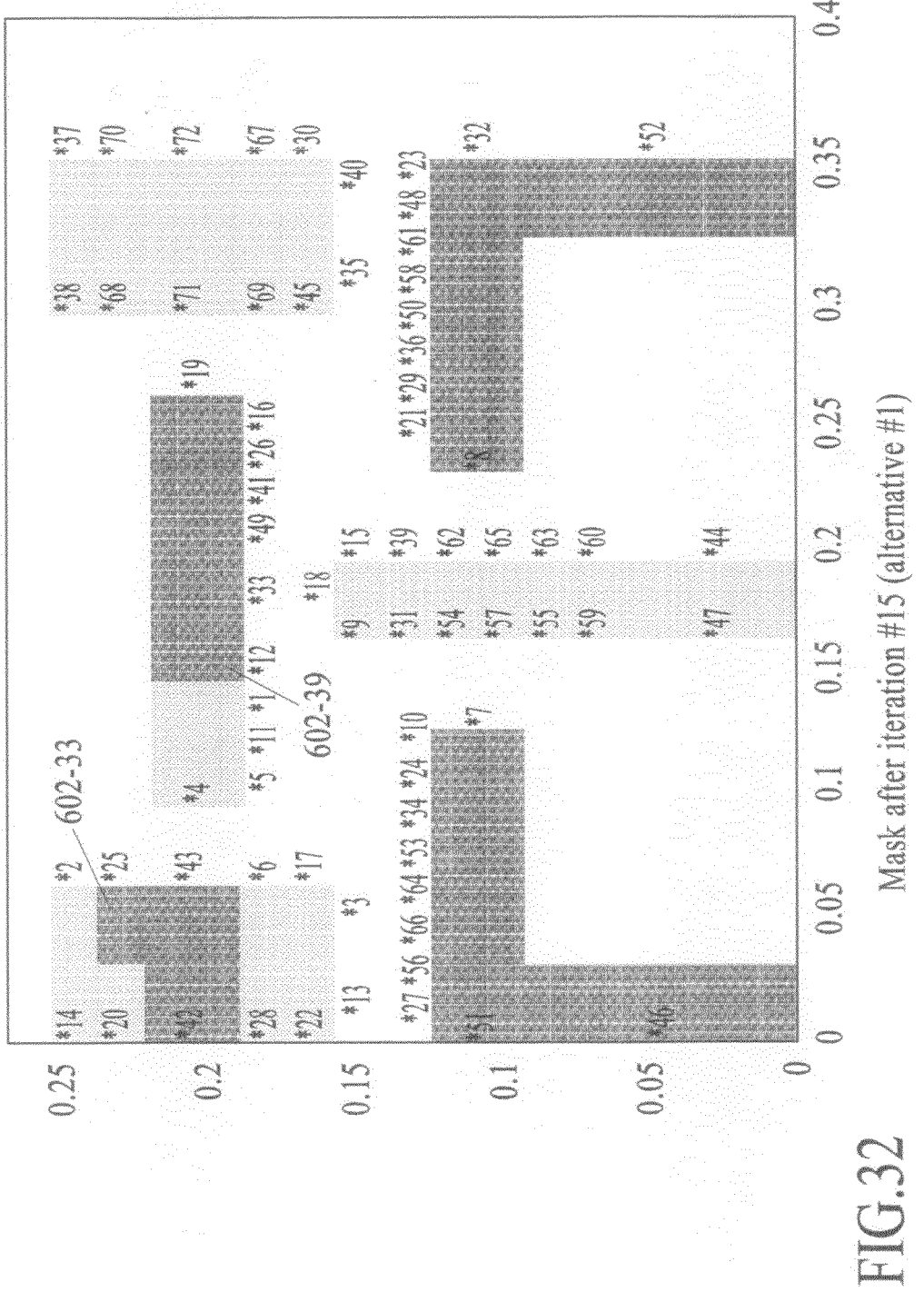
Figure 56:
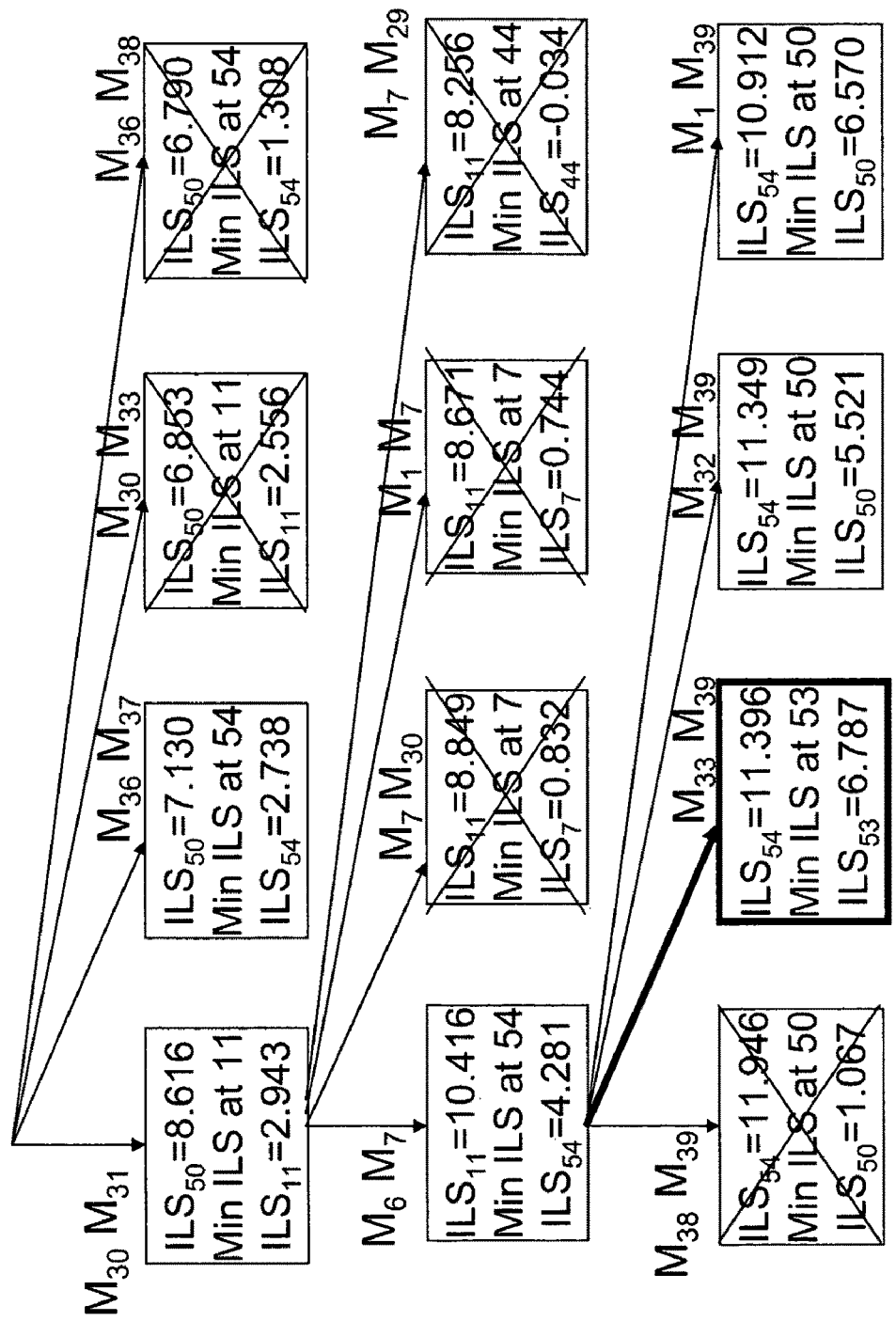

FIG. 56 shows $ILS_{54}$ selected for optimization (1125 in FIG. 1) (following branch $M_{33}M_{39}$). FIG. 32 shows the target pattern after the color assignments of fragments 602-33 and 602-39 have been changed (rather than 602-38 and 602-39 in FIG. 31). $ILS_{min}$ is recalculated (1145 in FIG. 1). FIG. 56 shows that $ILS_{54}$ has been improved from 4.281 to 11.396, and that the recalculated $ILS_{min}$ is $ILS_{53}$ and has a value of 6.787. It is determined that the scaled change in the $ILS_{min}$ exceeds the threshold.

Figure 57:
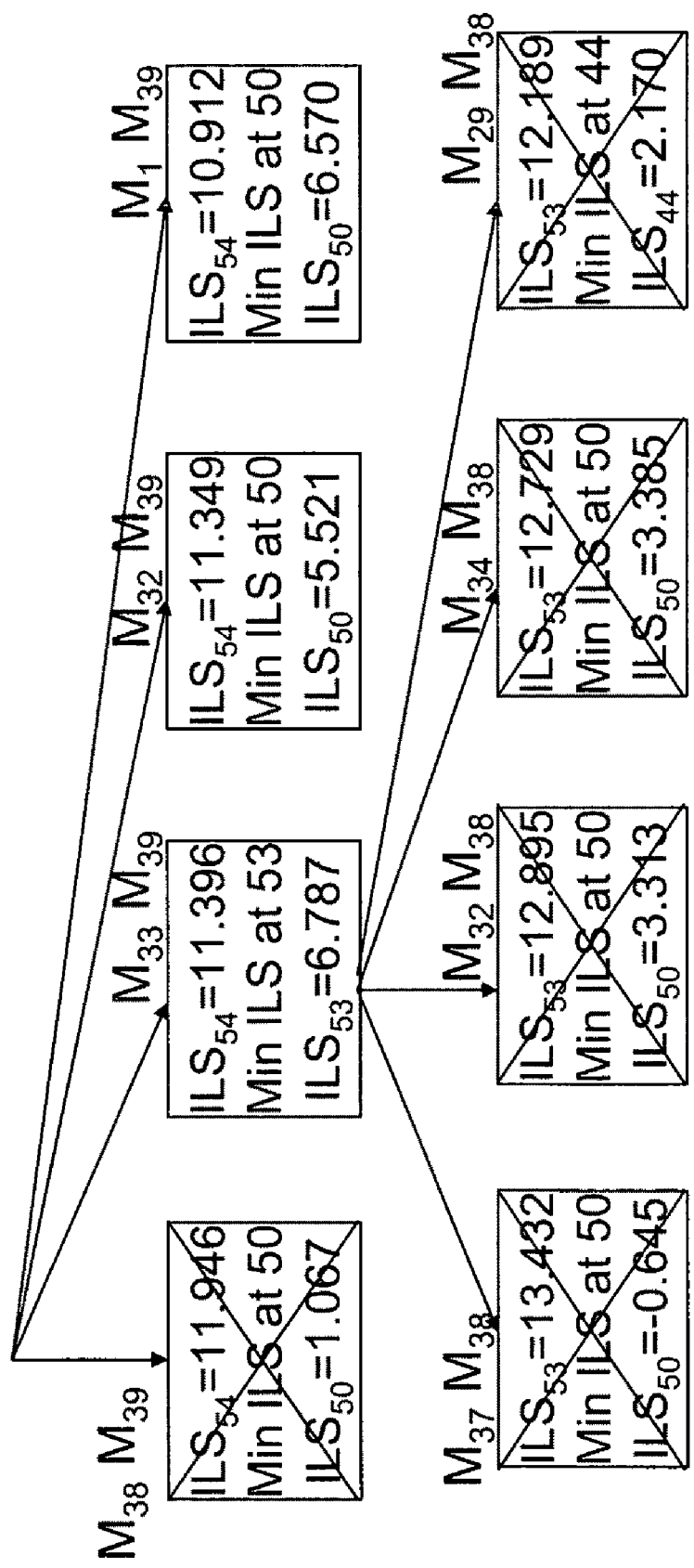

FIG. 57 shows $ILS_{53}$ selected for optimization (1125 in FIG. 1). The $ILS_i$, gradient, and Hessian are calculated (1130 in FIG. 1). The maximum of the gradient sum and the Hessian sum is determined (1135 in FIG. 1). In this case, the Hessian sums of $M_{37}M_{38}$, $M_{32}M_{38}$, $M_{34}M_{38}$, and $M_{29}M_{38}$ are determined to be the first, second, third, and fourth highest sums, respectively. However, it is determined that none of $M_{37}M_{38}$, $M_{32}M_{38}$, $M_{34}M_{38}$, or $M_{29}M_{38}$ exceed the threshold (1150 in FIG. 1). Accordingly, optimization of the $M_{33}M_{39}$ branch stops after the change in color assignment of $M_{33}M_{39}$. Further, it is determined that optimization of branch $M_{33}M_{39}$ yields a local maximum of $ILS_{min}$, but not a global maximum of $ILS_{min}$, since branch $M_{36}M_{37}$ yielded a solution with a higher $ILS_{min}$ of 11.534 (see FIGS. 51 and 52).

Figure 33:
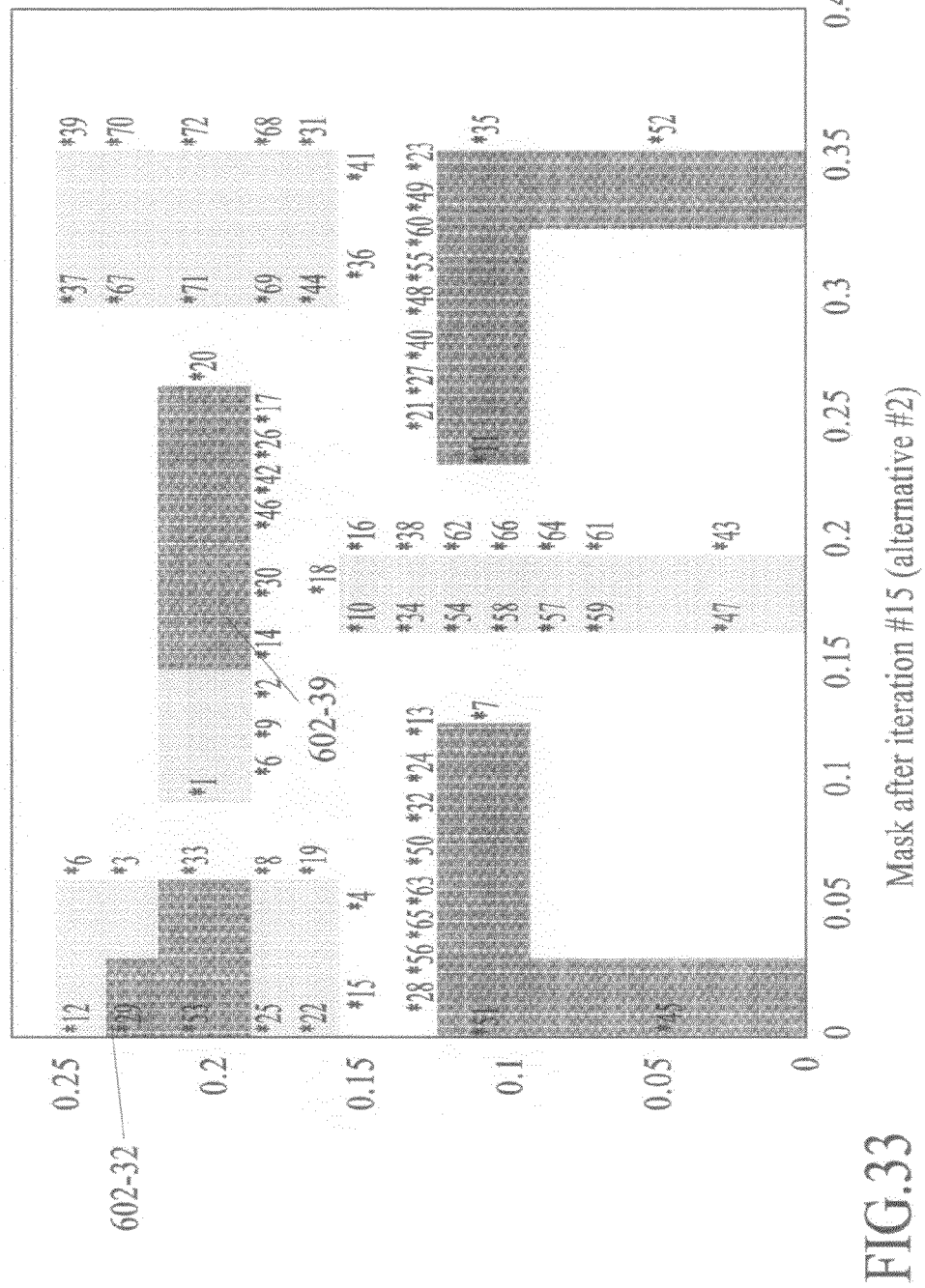
Figure 58:
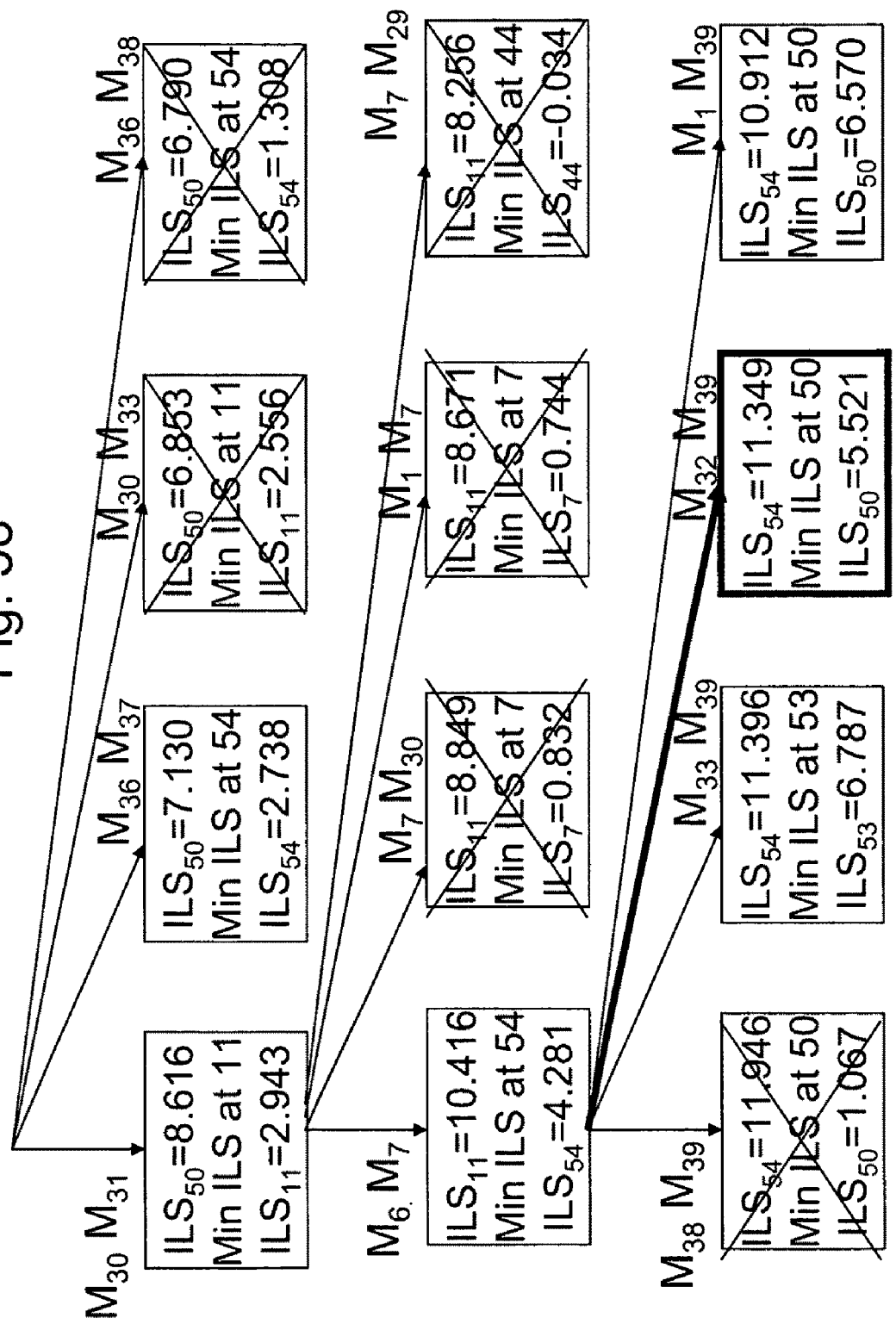

FIG. 58 shows $ILS_{54}$ selected for optimization (1125 in FIG. 1) (following branch $M_{32}M_{39}$). FIG. 33 shows the target pattern after the color assignments of fragments 602-32 and 602-39 have been changed (rather than 602-38 and 602-39 in FIG. 31 or 602-33 and 602-39 in FIG. 32). $ILS_{min}$ is recalculated (1145 in FIG. 1). FIG. 58 shows that $ILS_{54}$ has been improved from 4.281 to 11.349, and that the recalculated $ILS_{min}$ is $ILS_{50}$ and has a value of 5.521. It is determined that the scaled change in the $ILS_{min}$ exceeds the threshold.

Figure 59:
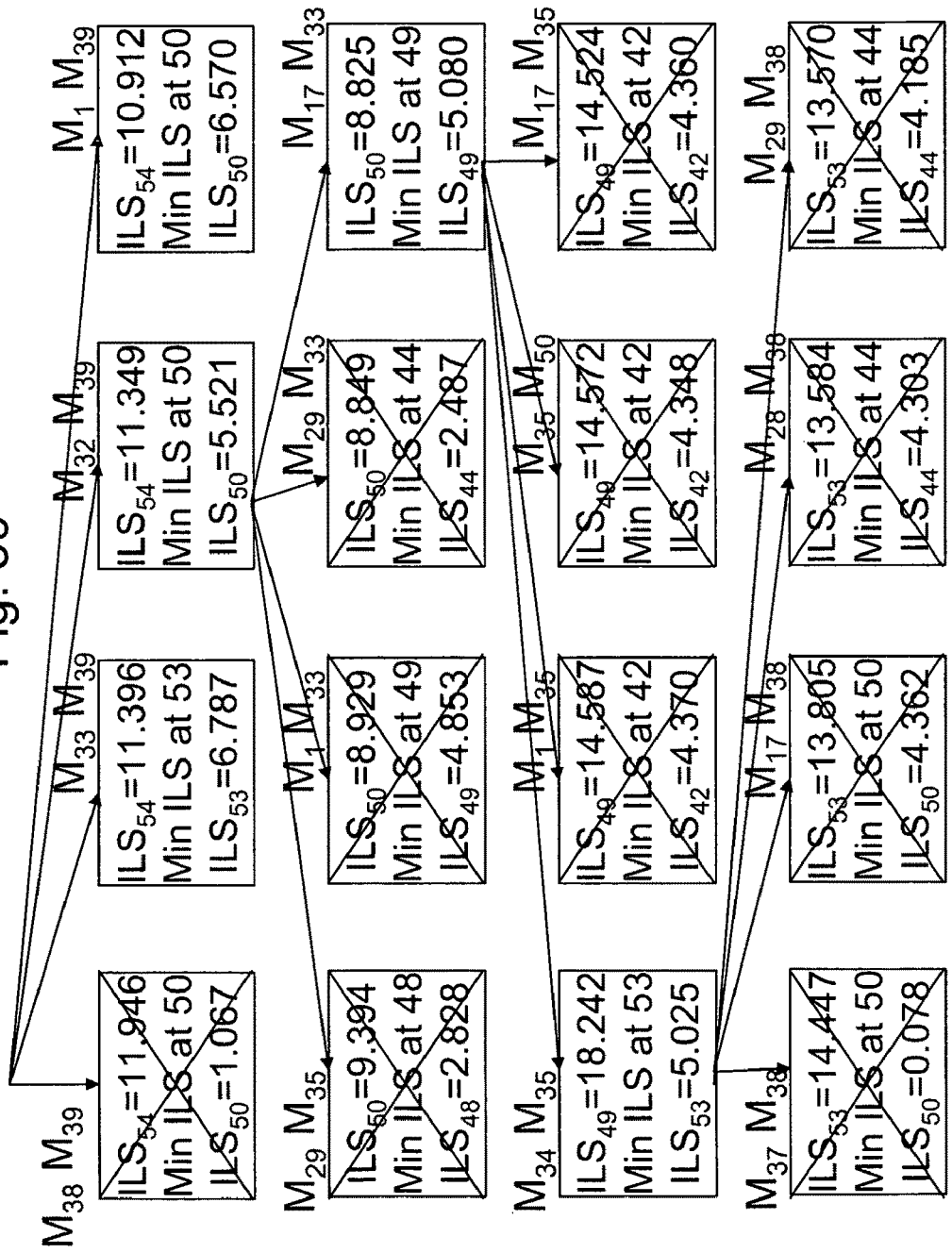

FIG. 59 shows $ILS_{50}$ selected for optimization (1125 in FIG. 1) (see $M_{32}M_{39}$). The $ILS_i$, gradient, and Hessian are calculated (1130 in FIG. 1). The maximum of the gradient sum and the Hessian sum is determined (1135 in FIG. 1). In this case, the Hessian sums of $M_{29}M_{35}$, $M_1M_{33}$, $M_{29}M_{33}$, and $M_{17}M_{33}$ are determined to be the first, second, third, and fourth highest sums, respectively. However, it is determined that $M_{29}M_{35}$, $M_1M_{33}$, and $M_{29}M_{33}$ do not exceed the threshold (1150 in FIG. 1). Therefore, optimization proceeds with $M_{17}M_{33}$. $ILS_{min}$ is recalculated (1145 in FIG. 1). FIG. 59 shows that $ILS_{50}$ has been improved from 5.521 to 8.825, and that the recalculated $ILS_{min}$ is $ILS_{49}$ and has a value of 5.080. It is determined that the scaled change in the $ILS_{min}$ exceeds the threshold.

FIG. 59 further shows $ILS_{49}$ selected for optimization (1125 in FIG. 1) (see $M_{17}M_{33}$). The $ILS_i$, gradient, and Hessian are calculated (1130 in FIG. 1). The maximum of the gradient sum and the Hessian sum is determined (1135 in FIG. 1). In this case, the Hessian sums of $M_{34}M_{35}$, $M_1M_{35}$, $M_{35}M_{50}$, and $M_{17}M_{35}$ are determined to be the first, second, third, and fourth highest sums, respectively. $M_1M_{35}$, $M_{35}M_{50}$, and $M_{17}M_{35}$, however, do not exceed the threshold (1150 in FIG. 1). Therefore, optimization proceeds with $M_{34}M_{35}$. $ILS_{min}$ is recalculated (1145 in FIG. 1). FIG. 59 shows that $ILS_{49}$ has been improved from 5.080 to 18.242, and that the recalculated $ILS_{min}$ is $ILS_{53}$ and has a value of 5.025. It is determined that the scaled change in the $ILS_{min}$ exceeds the threshold.

FIG. 59 further shows $ILS_{53}$ selected for optimization (1125 in FIG. 1) (see $M_{34}M_{35}$). The $ILS_i$, gradient, and Hessian are calculated (1130 in FIG. 1). The maximum of the gradient sum and the Hessian sum is determined (1135 in FIG. 1). In this case, the Hessian sums of $M_{37}M_{38}$, $M_{17}M_{38}$, $M_{28}M_{38}$, and $M_{29}M_{38}$ are determined to be the first, second, third, and fourth highest sums, respectively. However, it is determined that none of $M_{37}M_{38}$, $M_{17}M_{38}$, $M_{28}M_{38}$, or $M_{29}M_{38}$ exceed the threshold (1150 in FIG. 1). Accordingly, optimization of the $M_{32}M_{39}$ branch (see FIG. 58) stops after the change in color assignment of $M_{34}M_{35}$. Further, it is determined that optimization of branch $M_{32}M_{39}$ yields a local maximum of $ILS_{min}$, but not a global maximum of $ILS_{min}$, since branch $M_{36}M_{37}$ yielded a solution with a higher $ILS_{min}$ of 11.534 (see FIGS. 51 and 52).

Figure 34:
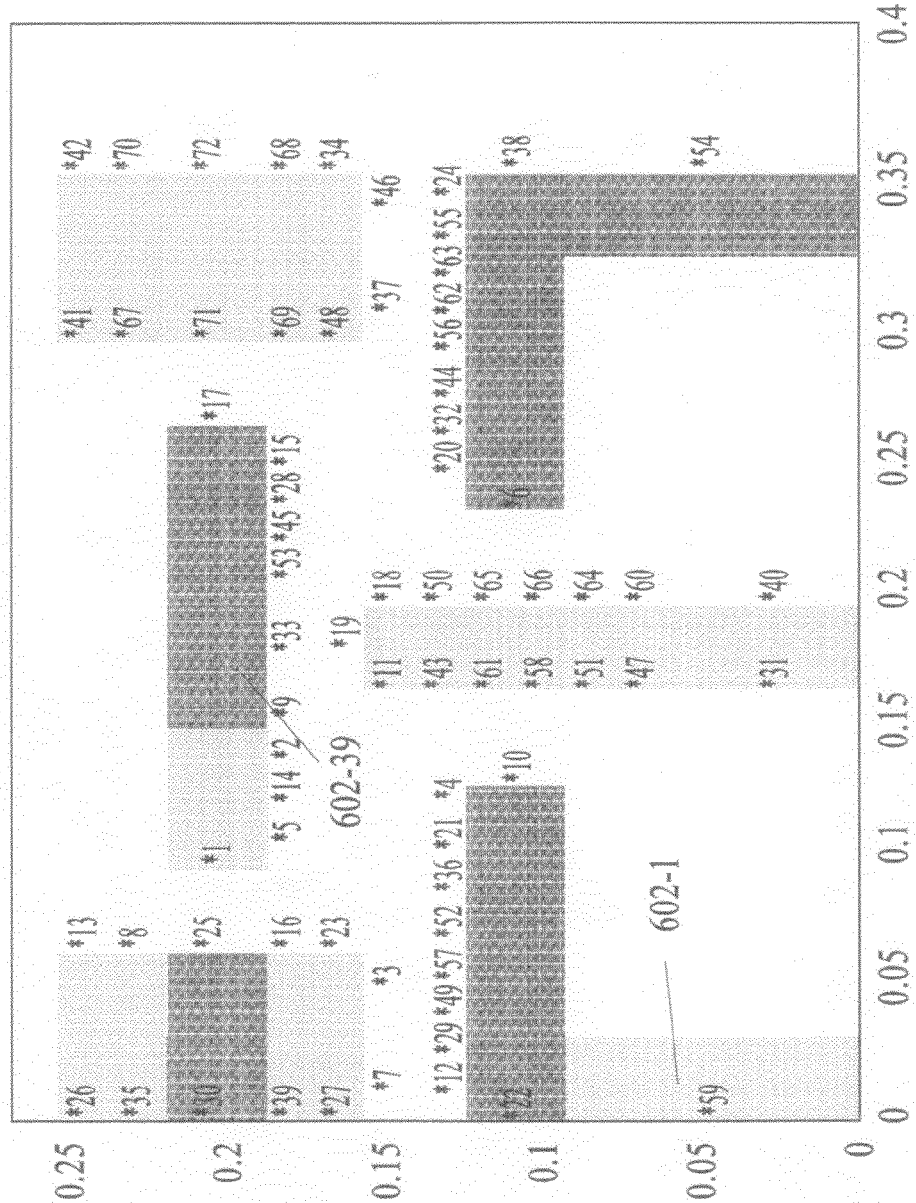
Figure 60:
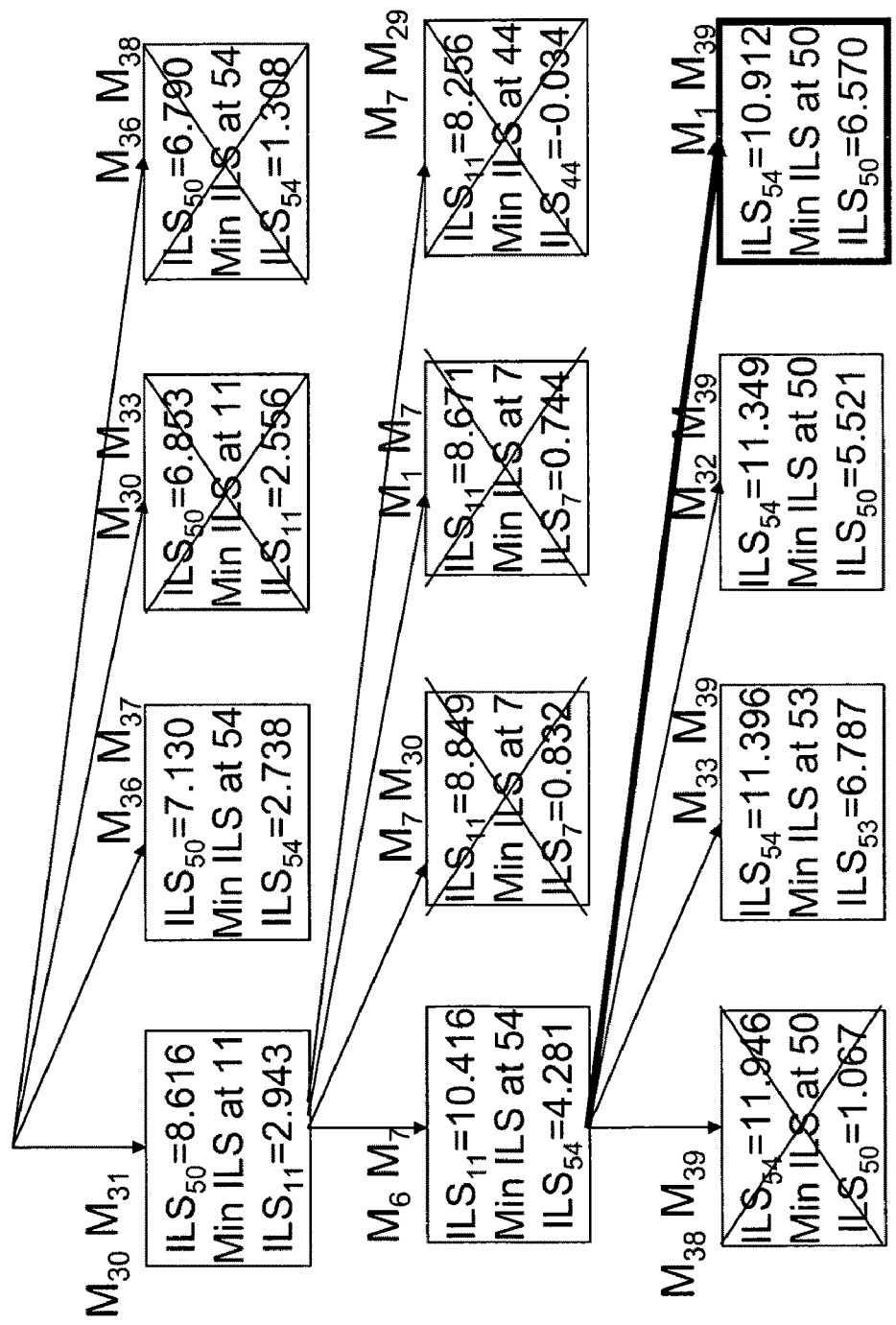

FIG. 60 shows $ILS_{54}$ selected for optimization (1125 in FIG. 1) (following branch $M_1M_{39}$). FIG. 34 shows the target pattern after the color assignments of fragments 602-1 and 602-39 have been changed (rather than 602-38 and 602-39 in FIG. 31, 602-32 and 602-33 in FIG. 32 or 602-32 and 602-39 in FIG. 33). $ILS_{min}$ is recalculated (1145 in FIG. 1). FIG. 60 shows that $ILS_{54}$ has been improved from 4.281 to 10.912, and that the recalculated $ILS_{min}$ is $ILS_{50}$ and has a value of 6.570. It is determined that the scaled change in the $ILS_{min}$ exceeds the threshold.

FIG. 61 shows $ILS_{50}$ selected for optimization (1125 in FIG. 1) (see $M_1M_{39}$). The $ILS_i$, gradient, and Hessian are calculated (1130 in FIG. 1). The maximum of the gradient sum and the Hessian sum is determined (1135 in FIG. 1). In this case, the Hessian sums of $M_{17}M_{29}$, $M_{17}M_{33}$, and $M_{10}M_{29}$, and gradient sum of $M_{33}$ are determined to be the first, second, third, and fourth highest sums, respectively. However, it is determined that $M_{17}M_{29}$ and $M_{10}M_{29}$ do not exceed the threshold (1150 in FIG. 1). Therefore, optimization proceeds with $M_{17}M_{33}$ and $M_{33}$.

Regarding $M_{17}M_{33}$, $ILS_{min}$ is recalculated (1145 in FIG. 1). FIG. 61 shows that $ILS_{50}$ has been improved from 6.570 to 9.563, and that the recalculated $ILS_{min}$ is $ILS_{53}$ and has a value of 7.035. It is determined that the scaled change in the $ILS_{min}$ exceeds the threshold. FIG. 61 further shows $ILS_{53}$ selected for optimization (1125 in FIG. 1) (see $M_{17}M_{33}$). The $ILS_i$, gradient, and Hessian are calculated (1130 in FIG. 1). The maximum of the gradient sum and the Hessian sum is determined (1135 in FIG. 1). In this case, the Hessian sums of $M_{37}M_{38}$, $M_{32}M_{38}$, $M_{34}M_{38}$, and $M_{17}M_{35}$ are determined to be the first, second, third, and fourth highest sums, respectively. However, none of $M_{37}M_{38}$, $M_{32}M_{38}$, $M_{34}M_{38}$, and $M_{17}M_{38}$ exceed the threshold (1150 in FIG. 1). Further, it is determined that optimization of branch $M_1M_{39}$ (see FIGS. 60 and 61) yields a local maximum of $ILS_{min}$, but not a global maximum of $ILS_{min}$, since branch $M_{36}M_{37}$ yielded a solution with a higher $ILS_{min}$ of 11.534 (see FIGS. 51 and 52).

Therefore, optimization proceeds with $M_{33}$. $ILS_{min}$ is recalculated (1145 in FIG. 1). FIG. 61 shows that $ILS_{50}$ has been improved from 6.570 to 9.339, and that the recalculated $ILS_{min}$ is $ILS_{53}$ and has a value of 9.936. It is determined that the scaled change in the $ILS_{min}$ exceeds the threshold. FIG. 61 further shows $ILS_{53}$ selected for optimization (1125 in FIG. 1) (see $M_{33}$). The $ILS_i$, gradient, and Hessian are calculated (1130 in FIG. 1). The maximum of the gradient sum and the Hessian sum is determined (1135 in FIG. 1). In this case, the Hessian sums of $M_{37}M_{38}$, $M_{17}M_{38}$, and $M_{28}M_{38}$, and $M_{29}M_{38}$ are determined to be the first, second, third, and fourth highest sums, respectively. However, it is determined that none of $M_{37}M_{38}$, $M_{17}M_{38}$, and $M_{28}M_{38}$, and $M_{29}M_{38}$ exceed the threshold (1150 in FIG. 1). Accordingly, optimization of the $M_1M_{39}$ branch stops after the change in color assignment of $M_{33}$. Further, it is determined that optimization of branch $M_1M_{39}$ yields a local maximum of $ILS_{min}$, but not a global maximum of $ILS_{min}$, since branch $M_{36}M_{37}$ yielded a solution with a higher $ILS_{min}$ of 11.534 (see FIGS. 51 and 52). Since no further branches remain for optimization, convergence occurs (1165 in FIG. 1) and the optimization ends (1175 in FIG. 1). Consequently, the optimization process of branch $M_{36}M_{37}$, with $ILS_{min}$ of 11.534, is determined to yield the global maximum of $ILS_{min}$.

As noted above, the present invention provides a model based coloring process for decomposing the features of a target pattern into fragments which can be imaged separately, for example, by utilizing multiple masks. Variations of the foregoing process are possible. For example, it is possible to assign the fragments into more than two categories and to use more than two exposures to image the target pattern. It is also noted that the techniques of the present invention can be utilized with either dark field masks or clear field masks, or alternating phase-shift masks. In addition, the model based coloring process of the present invention allows for a single feature of the target pattern to be automatically separated/divided into multiple fragments which can be imaged separately. Further, the present invention can be utilized in conjunction with ASML's previously disclosed illumination optimization techniques or ASML's illumination and source optimization techniques.

Figure 62:
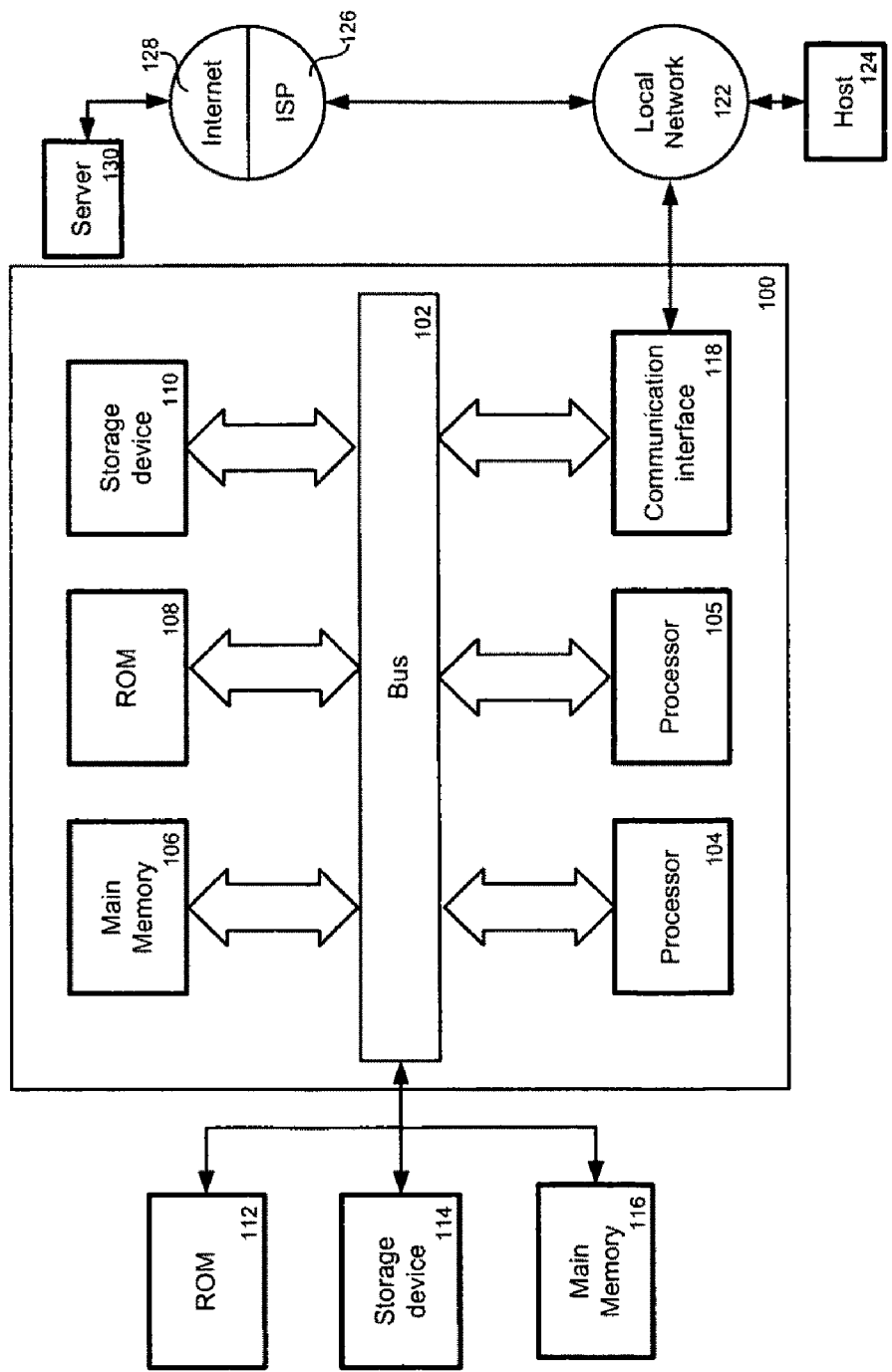
FIG. 62 shows an exemplary block diagram of a computer system for implementing the coloring process.

FIG. 62 is a block diagram that illustrates a computer system 100 which can implement the coloring process explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 63:
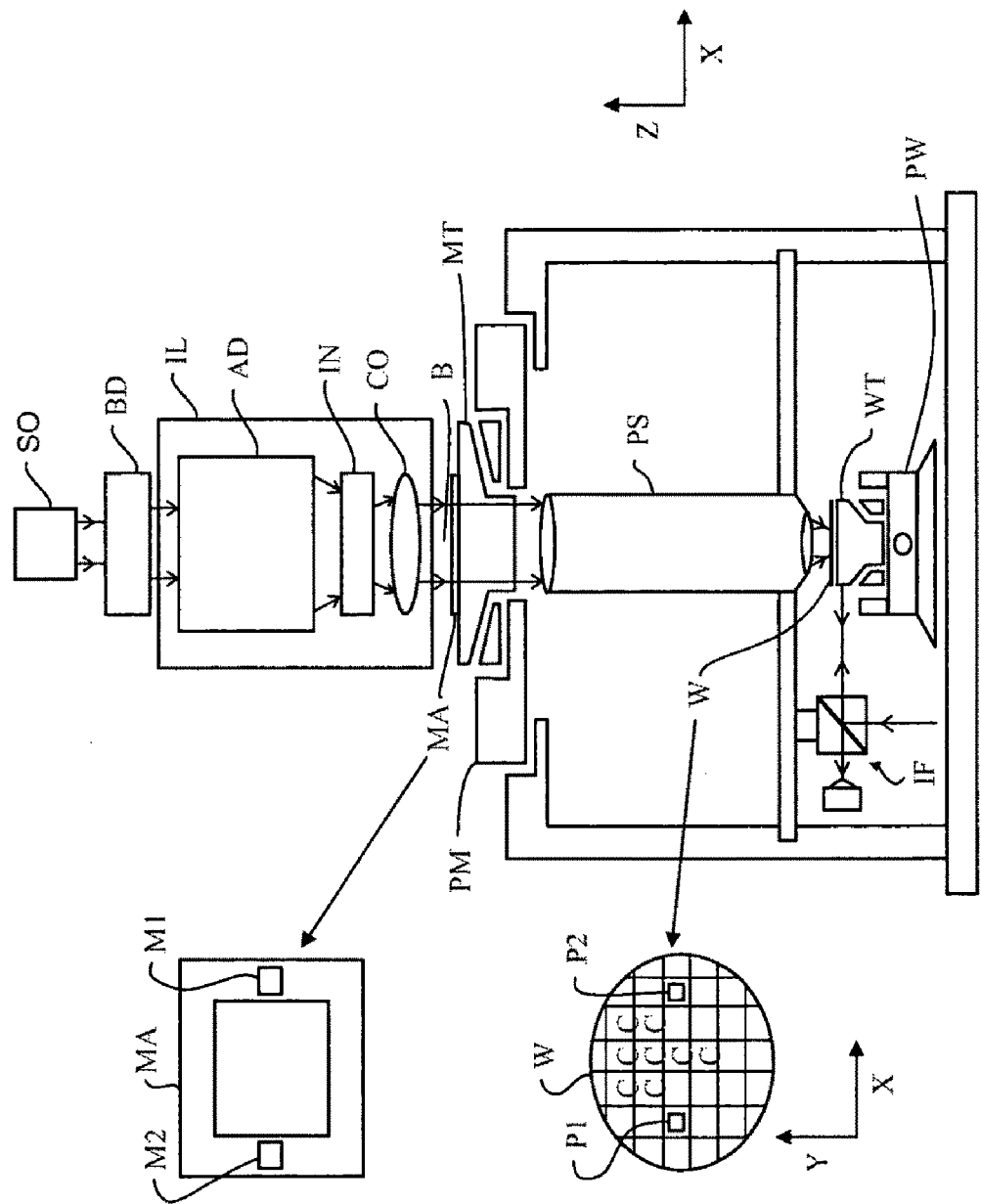
FIG. 63 shows an exemplary lithographic projection apparatus.

FIG. 63 schematically depicts a lithographic projection apparatus suitable for use with masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a reflective type, for example (with a reflective mask). However, in general, it may also be of a transmissive type (i.e., has a transmissive mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 63 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 63. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method of decomposing a target pattern containing features to be imaged onto a substrate into a plurality of exposure patterns, the method comprising:
   dividing the target pattern into fragments;
   assigning the fragments to an exposure pattern;
   assigning evaluation points to the fragments; and
   maximizing values of the evaluation points, the maximizing including:
      calculating values at the evaluation points;
      determining a minimum value of the evaluation points;
      calculating changes in the values as a result of assigning a fragment to a different exposure pattern;
      determining a maximum change of the values; and
      assigning the fragment associated with the maximum change to the different exposure pattern.

2. The method of claim 1, further comprising assigning more than one fragment associated with the maximum change to the different exposure pattern.

3. The method of claim 1, further comprising:
   determining critical links between the fragments; and
   the calculating changes in the values comprising summing gradient values and summing Hessian values associated with the critical links.

4. The method of claim 1, the calculating a change in the values comprising calculating gradient values and calculating Hessian values; and the determining a maximum change of the values comprising determining the maximum value of summed gradient values and the summed Hessian values.

5. The method of claim 4, further comprising assigning two fragments to the different exposure pattern based on the maximum value of summed Hessian values.

6. The method of claim 1, wherein the decomposing is performed using a model based decomposition.

7. The method of claim 1, wherein the values of the evaluation points are image log slope (ILS) values.

8. A non-transitory computer readable storage medium storing computer executable instructions configured to decompose a target pattern containing features to be imaged onto a substrate into a plurality of patterns, which when executed by a computer, perform the operations comprising:
dividing the target pattern into fragments;
assigning the fragments to an exposure pattern;
assigning valuation points to the fragments; and
maximizing values of the evaluation points, the maximizing including:
calculating values at the evaluation points;
determining a minimum value of the evaluation points;
calculating changes in the values as a result of assigning a fragment to a different exposure pattern;
determining a maximum change of the values; and
assigning the fragment associated with the maximum change to the different exposure pattern.

9. The method of claim 8, further comprising assigning more than one fragment associated with the maximum change to the different exposure pattern.

10. The method of claim 8, further comprising:
determining critical links between the fragments; and
the calculating changes in the values comprising summing gradient values and summing Hessian values associated with the critical links.

11. The method of claim 8, the calculating a change in the values comprising calculating gradient values and calculating Hessian values; and the determining a maximum change of the values comprising determining the maximum value of summed gradient values and the summed Hessian values.

12. The method of claim 11, further comprising assigning two fragments to the different exposure pattern based on the maximum value of summed Hessian values.

13. The method of claim 8, the plurality of exposure patterns comprising at least two exposure patterns configured to image the features onto the substrate in a multiple exposure process.

14. The method of claim 8, wherein the decomposing is performed using a model based decomposition.

15. The method of claim 8, wherein the values of the evaluation points are image log slope (ILS) values.

16. A device manufacturing method comprising:
providing a substrate, wherein the substrate is at least partially covered by a layer of radiation sensitive material;
patterning a beam of radiation; and
projecting the patterned beam of radiation onto the layer of radiation sensitive material;
wherein patterning a beam of radiation is performed using a plurality of exposure patterns, the exposure patterns formed by:
dividing a target pattern into fragments;
assigning the fragments to an exposure pattern;
assigning evaluation points to the fragments; and
maximizing values of the evaluation points, the maximizing including:
calculating values at the evaluation points;
determining a minimum value of the evaluation points;
calculating changes in the values as a result of assigning a fragment to a different exposure pattern;
determining a maximum change of the values; and
assigning the fragment associated with the maximum change to the different exposure pattern.

* * * * *